United States Patent
Lin

(10) Patent No.: US 8,670,964 B2
(45) Date of Patent: Mar. 11, 2014

(54) GYROCOMPASS MODELING AND SIMULATION SYSTEM (GMSS) AND METHOD THEREOF

(75) Inventor: Ching-Fang Lin, Simi Valley, CA (US)

(73) Assignee: American GNC Corporation, Simi Valley, CA (US)

( * ) Notice: Subject to any disclaimer, the term of this patent is extended or adjusted under 35 U.S.C. 154(b) by 503 days.

(21) Appl. No.: 12/924,359

(22) Filed: Sep. 24, 2010

(65) Prior Publication Data

US 2011/0093250 A1    Apr. 21, 2011

Related U.S. Application Data

(60) Provisional application No. 61/279,136, filed on Oct. 15, 2009.

(51) Int. Cl.
*G06G 7/48* (2006.01)

(52) U.S. Cl.
USPC ................................. 703/7; 703/6

(58) Field of Classification Search
USPC ........................................ 703/6, 7
See application file for complete search history.

(56) References Cited

U.S. PATENT DOCUMENTS

| | | | |
|---|---|---|---|
| 6,234,799 B1 * | 5/2001 | Lin | 434/30 |
| 6,298,318 B1 * | 10/2001 | Lin | 703/23 |
| 6,735,523 B1 * | 5/2004 | Lin et al. | 701/470 |
| 8,005,635 B2 * | 8/2011 | Lin | 702/92 |
| 8,311,757 B2 * | 11/2012 | Lin | 702/92 |

OTHER PUBLICATIONS

Egeland, "A Gyrocompass for Maritime Applications Based upon Multivariable Control Theory", Modeling, Identification and Control, vol. 5, No. 4, 1984, pp. 179-195.*

Christou, "Evaluation of Mathematical Models for Gyrocompass Behaviour: Error Modelling and Applications", MSCE thesis, Department of Surveying Engineering, University of New Brunswick, Apr. 1983, 195 pages.*

* cited by examiner

*Primary Examiner* — Omar Fernandez Rivas
*Assistant Examiner* — Herng-Der Day
(74) *Attorney, Agent, or Firm* — Raymond Y. Chan; David and Raymond Patent Firm

(57) ABSTRACT

A Modeling, Design, Analysis, Simulation, and Evaluation (MDASE) aspects of gyrocompassing in relation to Far-Target Location (FTL) systems include a Gyrocompass Modeling and Simulation System (GMSS). The GMSS has four major components: the 6 degree-of-freedom (6DOF) Motion Simulator, the IMU Sensor Simulator, the Gyrocompass System and Calibration Process Simulator, and the Gyrocompass System Evaluation and Analysis Module. The modular architecture of GMSS makes it very flexible for programming, testing, and system maintenance. The realization of the GMSS is based on any computer platforms for the GMSS software is written in high level language and is portable. The stochastic signal analysis and sensor testing and modeling tools include a suite of generic statistical analysis software, including Allan Variance and power spectral density (PSD) analysis tools, which are available to every GMSS module and greatly enhanced the system functionality.

14 Claims, 31 Drawing Sheets

Display/Check 6DOF Parameters

Inertia Matrix: Ixx: 1.1100 Iyy: 2.2200 Izz: 3.3300 Ixy: 0.0000 Ixz: 0.0000 Iyz: 0.0000 (BTN)
Closed-Loop Control Para: Kang: 120.0000 Kangdot: 40.0000 Kv: 4.1000
Angular Channel Parameters in Rows X Y Z:
WN: 0.100 RW: 0.400 LPF: 0.700 HPF: 0.110 S1A: 0.140 S1F: 0.170 S2A: 0.111 S2F: 0.144
WN: 0.200 RW: 0.500 LPF: 0.800 HPF: 0.120 S1A: 0.150 S1F: 0.180 S2A: 0.122 S2F: 0.155
WN: 0.300 RW: 0.600 LPF: 0.900 HPF: 0.130 S1A: 0.160 S1F: 0.190 S2A: 0.133 S2F: 0.166
Translational Channel Parameters in Rows X Y Z:
WN: 0.100 RW: 0.400 LPF: 0.700 HPF: 0.110 S1A: 0.140 S1F: 0.170 S2A: 0.111 S2F: 0.144
WN: 0.200 RW: 0.500 LPF: 0.800 HPF: 0.120 S1A: 0.150 S1F: 0.180 S2A: 0.122 S2F: 0.155
WN: 0.300 RW: 0.600 LPF: 0.900 HPF: 0.130 S1A: 0.160 S1F: 0.190 S2A: 0.133 S2F: 0.166

Figure 9

Win1_6DOF_Dialog

Inertia Matrix/Mass Parameters

| | | Angular Channels | | | Translational Channels | | |
|---|---|---|---|---|---|---|---|
| Ixx | 1.11000 | White Noise | 0.10000 | 0.11000 | 0.12000 | 0.10000 | 0.20000 | 0.30000 |
| Iyy | 2.22000 | Random Walk | 0.00000 | 0.00000 | 0.00000 | 0.00000 | 0.00000 | 0.00000 |
| Izz | 3.33000 | Lowpass Filter F | 0.00000 | 0.00000 | 0.00000 | 0.00000 | 0.00000 | 0.00000 |
| Ixy | 0.00000 | Highpass Filter F | 900.00000 | 600.00000 | 300.00000 | 800.00000 | 500.00000 | 200.00000 |
| Ixz | 0.00000 | Sine1 Amp | 0.01000 | 0.02000 | 0.03000 | 0.14000 | 0.15000 | 0.16000 |
| Iyz | 0.00000 | Sine1 Freq | 100.00000 | 200.00000 | 300.00000 | 100.00000 | 200.00000 | 300.00000 |
| Mass | 1.32100 | Sine2 Amp | 0.01500 | 0.02000 | 0.03000 | 0.11100 | 0.12200 | 0.13300 |
| | | Sine2 Freq | 200.00000 | 300.00000 | 400.00000 | 200.00000 | 300.00000 | 400.00000 |
| | | | X | Y | Z | X | Y | Z |

Closed-Loop Control Para

Kang 120.00000

Kangdot 40.00000

Kv 4.10000

[ OK ]  [ Cancel ]

Figure 10

GYROCOMPASS MODELING AND SIMULATION SYSTEM (GMSS) AND METHOD THEREOF

CROSS REFERENCE OF RELATED APPLICATION

This is a non-provisional application of a provisional application having an application number of 61/279,136 and a filing date of Oct. 15, 2009.

STATEMENT REGARDING FEDERALLY SPONSORED RESEARCH OR DEVELOPMENT

This invention was made with Government support under Contract No. W909MY-09-C-0020 awarded by the Component Technology Branch, U.S. Army, RDECOM, CERDEC, Night Vision & Electronic Sensors Directorate. The Government has certain rights in the invention.

BACKGROUND OF THE PRESENT INVENTION

1. Field of Invention

The present invention relates to Modeling, Design, Analysis, Simulation, and Evaluation (MDASE) aspects of gyrocompassing in relation to Far-Target Location (FTL) systems. FTL systems provide an extensive support for many joint operations and efforts, which are critical for a variety of government uses. For instance, they provide a solid foundation for many military joint operations. The basic principle of gyrocompassing is based on the measurement of the earth's angular velocity vector and the local gravity force vector. The US Army needs a suite of effective Modeling, Analysis, Simulation, and Evaluation tools for the design, development, implementation and validation of the gyrocompass based azimuth and attitude determination modules for the FTL systems.

2. Description of Related Arts

There is a need for high accuracy azimuth information for man-portable Far-Target Location (FTL) systems. The largest source of Target Location Error (TLE) in the existing FTL systems is in "azimuth". Target azimuth in today's man-portable target locator systems is determined using an embedded Digital Magnetic Compass (DMC). Though current DMCs provide better than 1° accuracy (<17.8 mils) in a benign environment, the accuracy in a tactical field environment is somewhat less due to the errors caused by nearby magnetic disturbances (e.g. vehicles, buildings, power lines, etc.) and local variations in the Earth's geo-magnetic field. In addition, DMCs require cumbersome calibration procedures.

Night Vision & Electronic Sensors Directorate is investing in component technologies for JETS via the Target Location & Designation System (TLDS) Advanced Technology Objective (ATO) number D.CER.2008.03. There is an intent-to-feed technology into the TLDS ATO, which in turn, will feed JETS. Accurate target azimuth (±1 mil) gyrocompass (GC)-IMU performance shall be achieved within 3 minutes of turn-on/initialization. The size, weight, and power of the objective GC-IMU module is to be made suitable for man-portable and/or hand-held FTL systems (<16 cubic inches, <2 pounds, and <3 watts respectively). Along with the technical parameters, GC-IMU setup and initialization procedures are to be evaluated against the constraints of the forward observer's mission. The GC-IMU module enables man-portable FTL systems (JETS) to achieve the ±1 mil target azimuth error required to "call-for-fire" when employing precision guided weapons. The specific intent is to research and demonstrate precision GC-IMU technology for the express purpose of eventual integration into a man-portable and/or hand-held FTL system (e.g. JETS).

The disclosed methods are to address the need for more accurate targeting information by determining the azimuth and vertical angle of the target by providing an azimuth accuracy of ±4 mils Probable Error (PE) threshold requirement (T) and ±1 mils PE objective requirement (O) between 60° north and south latitude. Likewise, the technical approach is to provide a vertical angle accuracy of ±4 mils PE (T) and ±1 mils PE (O) between 60° north and south latitude. The temporal stability of the accuracy is to be maintained for more than thirty (30) minutes (T)/more than sixty (60) minutes (O) after initialization. The approach requires no systematic system reinitialization (to maintain accuracy) within this time frame. The compensation, calibration and initialization methods are to be performed internally and without the use of an external computer. The accuracy is to be met while installed on a tripod and is to maintain required accuracy for the system under deterministic motion (sinking of the tripod) and random vibrations (due to wind). The technical approach is to provide for necessary Figure of Merit (FOM) on the azimuth angle and other angle outputs to indicate the quality of the angle estimates with 95% confidence. The proposed approach is to provide the required accuracy stated above within an initialization time of less than 240 sec (T)/90 sec (O) of the powering of the module. The technology demonstrator is to weigh less than 2 lbs (T)/0.2 lbs (O) and have volume of no more than 35 in3 (T)/0.25 in3 (O). The proposed approach is to provide required accuracy under the slew rate of 30 deg/sec (T)/360 deg/sec (O). The proposed approach is to provide required azimuth accuracy under the following orientation range: Pitch of ±500 mils (T)/±800 mils (O) and Bank of ±270 mils (T)/±500 mils (O). The proposed approach input power requirements are not to exceed 5 W (T)/3 W (O). The operating environment is to be from −40° C. to +70° C. The technical approach is required to meet the accuracy requirement after a shock of 40 g/11 ms. The technical approach is to meet the above requirements when integrated into a targeting system in a tripod mounted (T) or handheld (O) mode of operation. The technical approach is to meet the accuracy requirements in all weather conditions. The technical approach performance is not to degrade when electronically jammed or magnetic interfered. The technical approach is to meet the above requirements when operated under the battle-field environment (including but not limited to operations under trees, in forest, in urban canyon, nearby tanks, HMMWVs, buildings, and in the back of a pick-up truck).

In regard to gyrocompassing accuracy considerations critical gyrocompassing sensor parameters are the accelerometer and gyroscope bias errors and the gyro angle random walk (ARW) errors. The accelerometer and gyro bias leads to azimuth error:

$$\phi_D = \frac{\delta \omega_E}{\Omega \cos(L)} - \frac{\delta a_E}{g} \tan(L)$$

where L=latitude, $\phi$=misalignments error in (N)orth, (E)ast, and (D)own, $\delta\omega_E$=gyro error (bias)–in the NED coordinate frame, $\delta a_E$=accelerometer error (bias) in the NED coordinate frame, $\Omega$=earth's angular rate and g=gravity.

The gyro angle random walk versus the azimuth error is given by:

$$\phi_D = \frac{n}{\Omega \cos(L) \sqrt{t_a}}$$

where n=random walk in degrees per square root hour, L=latitude, $t_a$=averaging time and $\Omega$=earth's rate.

The above relations show that to achieve an azimuth accuracy at 45° latitude within 90 sec of turn-on with an azimuth error bound of ~4 mil the accelerometer bias must be 4 mG, the gyro bias instability 0.04°/hr and the Gyro Angle Random Walk (ARW) 0.004°/sq-rt hr. If the azimuth error bound is reduced to ~1 mil the accelerometer bias must be 1 mG, the gyro bias instability 0.01°/hr and the Gyro Angle Random Walk (ARW) 0.001°/sq-rt hr.

Additional sensor parameters affecting gyrocompassing accuracy are error sources such as acceleration rate, scale factor errors, axis-misalignments, turn-on repeatability, turn-on bias stability, non-linearity, thermal effects etc. The combined impact of the error sources on gyrocompassing performance is not fully understood. The optimal trajectory and the optimal filtering have immense impact on the gyrocompassing performance. The trade study between the sensor error parameters versus the choice of system architecture needs to be modeled and understood. Additional considerations involve the impact of motion on the gyrocompass performance. Man-Portable applications are typically stationary which further constrains gyro performance. It is also noted that de-coupling and estimation of errors is easier in a high-dynamic application.

The interaction of error sources and their impact on the ultimate gyrocompassing accuracy are highly nonlinear and not possible to effect analytically. Thus, there is an essential need for a gyrocompassing simulation system that allows detailed parametric gyrocompassing performance evaluation based on error sources considered either in isolation or in any desired combination configuration.

SUMMARY OF THE PRESENT INVENTION

The invention is advantageous in that it provides a gyrocompassing simulation system and method thereof, wherein the gyrocompassing simulation system allows detailed parametric gyrocompassing performance evaluation based on error sources considered either in isolation or in any desired combination configuration.

The realization of gyrocompassing design and accuracy goals requires inertial sensor analysis and modeling tools, gyro and accelerometer models, gyrocompassing processing algorithms and models for both handheld and tripod units, and system and sensor calibration procedures. The GMSS is a modularized software system which has four major components: the 6DOF Motion Simulator, the IMU Sensor Simulator, the Gyrocompass System and Calibration Process Simulator, and the Gyrocompass System Evaluation and Analysis Module. Each module has one Windows-based GUI as user interface for simulation components selection and parameter setting. The modular architecture of GMSS makes it very flexible for programming and testing. And, the component-based software development technology greatly eases system extension and maintenance. The hardware/software from American GNC Corporation's (AGNC) Azimuth and Attitude Accuracy Enhancing Method and System™ (SAAAEMS) is used as a reference for modeling and simulation fidelity validation and verification of the Gyrocompass Modeling and Simulation System™ (GMSS). The SAAAEMS System is also utilized to realize the gyrocompass processing/algorithm simulation functions and calibration functions. Furthermore, the existing software of the AGNC-2000RTIS IMU REALTIME SIMULATOR (RTIS) realizes motion generation and IMU simulation functions for GMSS. RTGIS accommodates the requirements for MDASE and is designed to circumvent the need to repeatedly execute field tests. RTIS simulates various guidance, navigation and control models, improves the design by executing multiple simulations and comparisons of the simulation results, permits analysis of the modeled and designed structure for grading and further improvements, and evaluates system performance in order to prevent expending resources in field testing.

GMSS is designed to provide a detailed simulation and evaluation tool for various gyrocompass systems designs. GMSS has a set of models and parameters for several commonly used IMUs. The system evaluation and analysis module is used to obtain the system accuracy under the current system setting and display and present simulation results in proper visualization format. By carrying out test sessions under controlled conditions, the user is able to evaluate the performance of a certain system design under the predefined conditions and/or to reveal the relationships between the system performance and any factors of interest. The different combinations of the controllable conditions and factors in GMSS provide a powerful evaluation and analysis tool for the design and development of gyrocompass systems. The system calibration simulation mode of GMSS yields a very convenient and powerful tool for the evaluation of the different calibration procedures designs for gyrocompass systems.

Currently there is no dedicated MDASE tool for the gyrocompass systems. The generic simulation and evaluation tools are often too complicated for user interface or do not have a real system model library for the user to choose. The simulation and evaluation tools currently used in the industrial and military sectors are usually large, rack mounted, and high cost equipment for special weapon system tests and often designed to support specific navigation system products. Thus, there is quite an urgent need for both the military and industrial sectors to have a suite of software systems or special devices supporting the design, test, and evaluation of gyrocompass systems because the gyrocompass principle and methods are in fact used in many systems. GMSS is a powerful, low cost, multi-functional, user friendly, high fidelity, flexible, and computation-effective test, simulation and evaluation tool for generic gyrocompass systems, INS, and FTL systems. By adopting GMSS, we can therefore greatly expedite the design and development of the FTL systems. GMSS, as a test, simulation and evaluation tool for generic gyrocompass systems and other pointing and navigation systems has high military and commercial applications potential. As a generic test and simulation tool GMSS can be easily augmented to simulate other inertial systems, such as north finders, strapdown INS, integrated GPS/INS systems, pointing systems, and other attitude systems.

According to the present invention, the foregoing and other objects and advantages are attained by a gyrocompass modeling and simulation (GMSS) system for a gyrocompass, comprising:

a 6DOF motion simulator;

an IMU sensor simulator which comprises a real-time sensor data acquisition and modeling tools;

a gyrocompass system and calibration process simulator;

a gyrocompass system evaluation and analysis module; and means for providing an accumulative communication stream interlinking the motion sensor, the IMU sensor simulator, the gyrocompass system and calibration process simulator and the gyrocompass system evaluation and analysis module.

In accordance with another aspect of the invention, the present invention provides a gyrocompass modeling and simulation GMSS method, including the steps:

(a) generating 6DOF angular and linear motion data through the 6DOF motion generator;

(b) sending said 6DOF angular and linear motion data to the IMU sensor simulator through the accumulative communication stream;

(c) generating IMU output data by the IMU sensor simulator;

(d) sending the IMU output data to the gyrocompass simulator through accumulative communication stream;

(e) producing attitude data by the gyrocompass simulator with an assigned gyrocompass model;

(f) sending said attitude data to the gyrocompass system evaluation and analysis module through the accumulative communication stream; and (g) comparing said attitude data produced by the gyrocompass simulator with ideal attitude data generated by the 6DOF motion generator to evaluate the performance of the gyrocompass under specified IMU errors and motion conditions.

Still further objects and advantages will become apparent from a consideration of the ensuing description and drawings.

These and other objectives, features, and advantages of the present invention will become apparent from the following detailed description, the accompanying drawings, and the appended claims.

BRIEF DESCRIPTION OF THE DRAWINGS

FIG. 9 is a software display showing the 6DOF Simulation Parameters Are Displayed in the Yellow Text Block.

FIG. 10 is a software display showing the 6DOF Parameters Dialog Box.

DETAILED DESCRIPTION OF THE PREFERRED EMBODIMENT

GMSS System Architecture Overview

Figure 1:
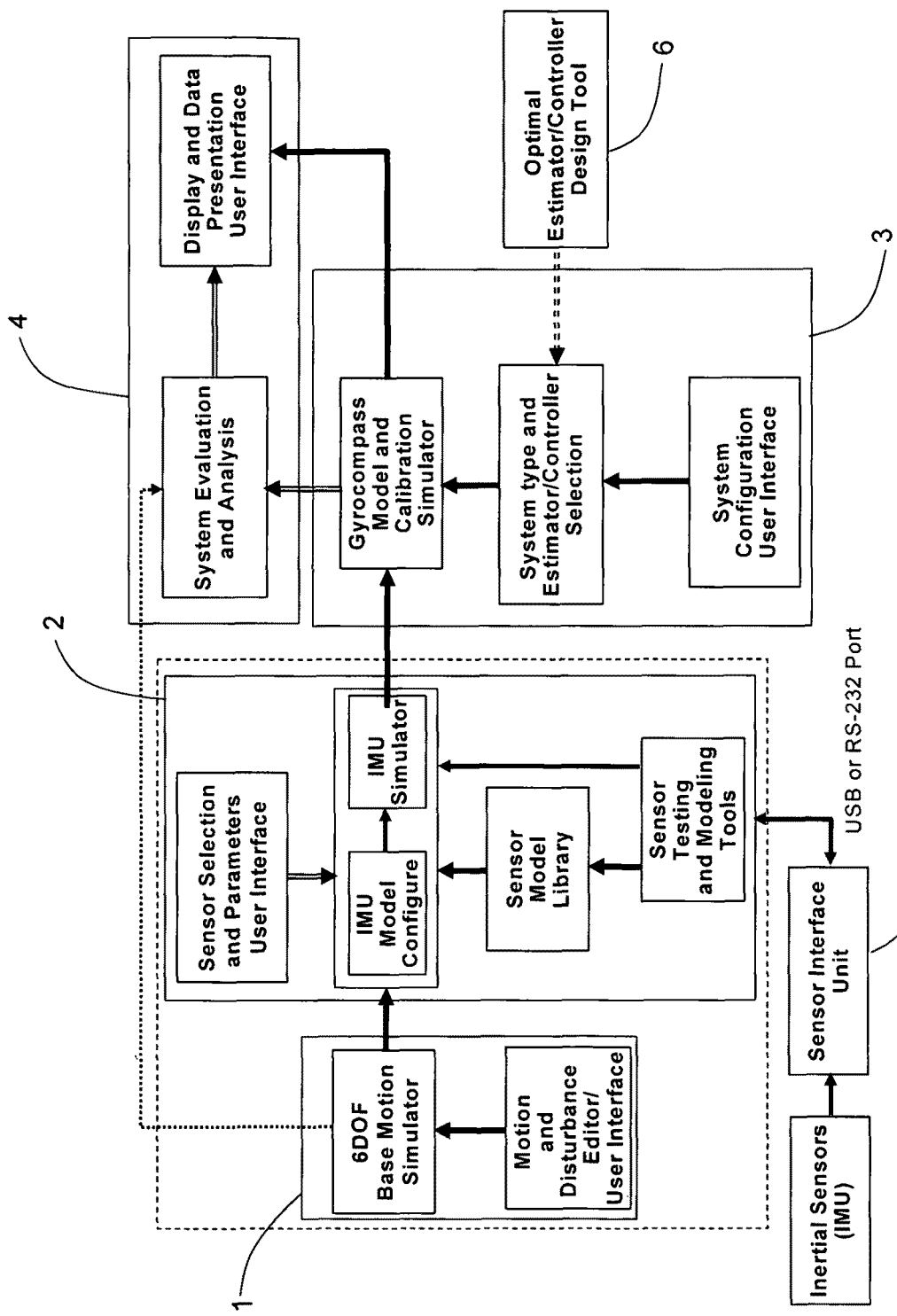
FIG. 1 is a block diagram showing the Architecture of the Gyrocompass Modeling and Simulation System (GMSS) according to a preferred embodiment of the present invention.

FIG. 1 illustrates a GMSS system architecture overview, wherein GMSS is a modularized software system which comprises four major components, i.e. (a) The 6DOF Motion Simulator 1; (b) The IMU Sensor Simulator 2, including real-time sensor data acquisition and modeling tools; (c) The Gyrocompass System and Calibration Process Simulator 3; and (d) The Gyrocompass System Evaluation and Analysis Module 4.

To facilitate the GMSS implementation, an existing software of AGNC-2000RTIS IMU REALTIME SIMULATOR of the applicant is utilized to realize motion generation and IMU simulation functions of GMSS. The simulators can be used as either an off-line tool or as a real-time simulation tool. The existing AGNC software is used for the gyrocompass system modeling as far as possible. It can be called as a type of real-code-in-the-loop simulation. Specifically, an existing software of the applicant, AGNC's SAAAEMS System, is also utilized to realize the gyrocompass processing/algorithm simulation functions and calibration functions of GMSS. The Gyrocompass System Evaluation and Analysis Module are used to obtain the system accuracy under the current system setting and display and present simulation results in proper visualization format.

The Sensor Testing and Modeling Tools comprise a suite of generic statistical analysis software, including Allan Variance and PSD analysis tools. From collected data from a real IMU, the Sensor Testing and Modeling Tools obtain sensor model parameters which can be saved to the sensor model library for simulation use, or the raw sensor data used directly for hardware/sensors-in-the-loop simulation. For hardware/sensors-in-the-loop simulation, in the IMU simulator, raw sensor data can be used alone or mixed with simulated IMU motion data for moving base testing, if the real IMU unit can not or is not convenient to move.

The dashed line between the 6DOF Base Motion Simulator and the System Evaluation and Analysis module means the gyrocompass evaluation is based on comparison between the simulated base/unit attitude and the gyrocompass estimated values. In GMSS, the simulated motion data are already contained in the simulation data stream.

The applicant provided or user designed filters and estimators are used in the Gyrocompass Model and Calibration Simulator. The Optimal Estimator/Controller Design Tool is not part of GMSS but a connection to GMSS is provided for use with existing design tools to expedite the simulation testing for different filters and estimators.

A realization of the GMSS is based on AGNC Windows/PC platform products of the applicant, but can be portable to other platforms, for it is written in high level language and tools. Each module has one Windows-based GUI as user interface for simulation components selection and parameter setting. The motion and IMU sensor simulators based on the AGNC-2000RTIS IMU REALTIME SIMULATOR of the applicant has user interface windows 6DOF motion editor and for IMU sensor type selection and parameter setting.

The gyrocompass system simulator has user interface windows to select the gyrocompass system structure (tripod unit or handheld unit, etc.), estimator and controller. The system evaluation and analysis module has a user interface window for displaying and presenting simulation results in the proper visualization format. GMSS can also be connected to other systems, such as Sensor Testing and Modeling Tools and Optimal Estimator/Controller Design Tool to make use of sensor model data and system design results.

The modular architecture of GMSS makes it very flexible for programming and testing. And, the component-based software development technology greatly eases system extension and maintenance. The software modules: the motion and IMU sensor simulator, the gyrocompass system simulator, and the system evaluation and analysis module, can be installed and run in the same computer or in three or two different computers.

Sometimes if the host computer/PC's computation power is limited, but a real-time or hardware-in-the-loop simulation is still be wanted to perform and the simulation task of each module to different computers can be distributed.

Figure 2:
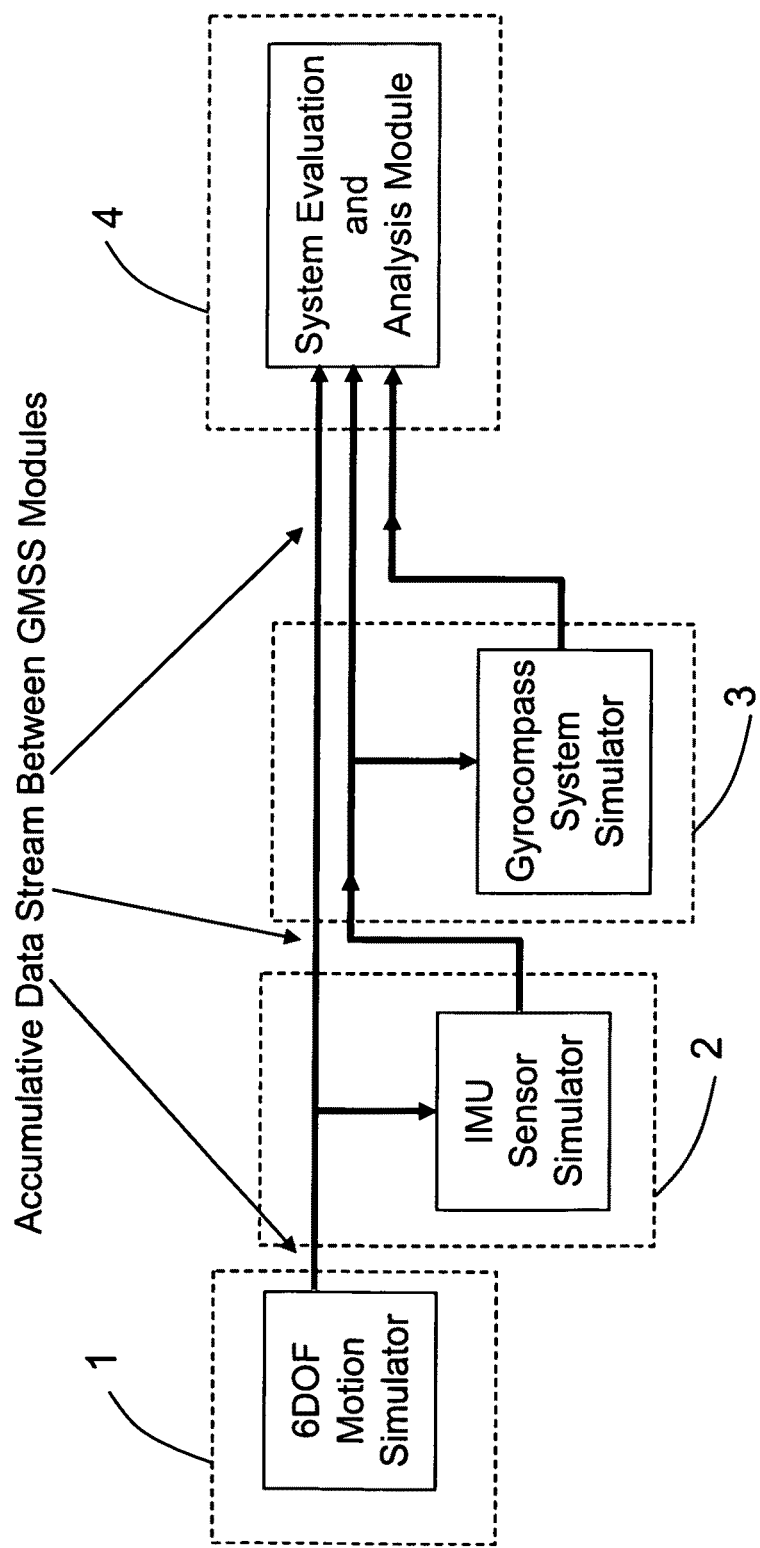
FIG. 2 is a block diagram showing the Communication Data Streams in GMSS according to the above preferred embodiment of the present invention.

Referring to FIG. 1 and FIG. 2, the GMSS system comprises four major parts. The four parts are linked by an accumulative communication stream. The simulation process of the GMSS is iterating in time until it is stopped by the user interface or automatically stopped at the assigned time.

The operational process of the GMSS system comprises the following major steps:

(a) Generating 6DOF angular and linear motion data of the unit/carrier by the 6DOF motion generator 1, wherein this major step (a) comprises a series of sub-steps which are described in the corresponding sections hereinafter;

(b) Sending the 6DOF angular and linear motion data to the IMU simulator 2 through the accumulative communication stream;

(c) Generating IMU output data by the IMU simulator 2, wherein this major step (c) comprises a series of sub-steps which are described in the corresponding sections hereinafter;

(d) Sending the IMU output data to the gyrocompass simulator 3 through the accumulative communication stream;

(e) Producing attitude data by the gyrocompass simulator 3 using the assigned gyrocompass model; this major step comprises a series of sub-steps which are described in the corresponding section of this invention;

(f) Sending the attitude data to the gyrocompass evaluation module 4 through the accumulative communication stream; and (g) Comparing the gyrocompass simulator 3 produced attitude data with the ideal attitude data generated by the 6DOF motion generator 1 to evaluate the performance of the gyrocompass under the specified IMU errors and motion conditions.

The GMSS is a modularized software system which has four major components. Thus, a communication approach for the GMSS has to be devised for inter-module data communication. FIG. 2 depicts the Communication Data Streams in GMSS which are accumulatively generated by GMSS modules.

A communication protocol is defined for the inter-module interfacing in GMSS. Even when the four software modules are installed and run on the same computer, they are still realized as independent software modules. This architecture design greatly eases the software development, testing and maintenance. The communication protocols of GMSS have a time-tagged IP-type data packed structure.

According to the defined communication protocols, each GMSS module knows how to generate, receive, decode, and regenerate the data stream for the next GMSS module. Thus, if the GMSS modules are run on different computers, they are easily and naturally linked by a LAN.

The GMSS data stream flows between the GMSS modules. Synchronization and data buffering mechanisms is provided for the inter-module communication. The 6DOF Motion Simulator module generates the initial data stream, which is shown in the following Table 1-1.

TABLE 1-1

Data Stream between 6DOF Motion Simulator and IMU Sensor Simulator.

| Order No. | Name | Parameter Number | Unit | Remark |
|---|---|---|---|---|
| 1. | Time tag | 1 | millisecond | |
| 2. | GMSS status | 1 | n/a | |
| 3. | Unit/base Angular velocity | | rad/sec | |
| 4. | Unit/base attitude and azimuth | 3 | deg | |
| 5. | DCM of B frame with respect to N frame | 9 | n/a | |
| 6. | Unit/base acceleration | 3 | meter/sec/sec | |
| 7. | Unit/base velocity | 3 | meter/sec | |
| 8. | Ambient temperature | 1 | deg C. | |

The GMSS status indicates if GMSS intends to simulate a normal navigation process or to simulate a calibration process.

Using the data stream from the 6DOF Motion Simulator, the IMU sensor simulator generates IMU data according to the defined IMU models, which are added to the received GMSS data stream and re-sent to the gyrocompass system simulator module. The IMU data contain all of the defined IMU error sources.

Table 1-2 below is the data stream output by the IMU sensor simulator.

TABLE 1-2

Data Stream between IMU Simulator and Gyrocompass Simulator

| Order No. | Name | Parameter Number | Unit | Remark |
|---|---|---|---|---|
| | Time tag | 1 | millisecond | |
| | GMSS status | 1 | n/a | |
| | Unit/base Angular velocity | | rad/sec | |
| | Unit/base attitude and azimuth | 3 | deg | |
| | DCM of B frame with respect to N frame | 9 | n/a | |
| | Unit/base acceleration | 3 | meter/sec/sec | |
| | Unit/base velocity | 3 | meter/sec | |
| | Ambient temperature | 1 | deg C. | |
| | Gyro outputs | 3 | rad/sec | |
| | Gyro bias to be identified | 3 | rad/sec | |
| | Gyro scale factor to be identified | 3 | n/a | |
| | Gyro temperature | 1 | deg C. | |
| | Accelerometer outputs | 3 | meter/sec/sec | |
| | Accelerometer bias to be identified | 3 | meter/sec/sec | |
| | Accelerometer scale factor to be identified | 3 | n/a | |
| | Accelerometer temperature | 1 | deg C. | |

The sensor temperature is included to simulate sensor temperature induced error and to simulate the compensation process in the gyrocompass system simulator.

The GMSS data stream is then fed to the gyrocompass system simulator module. According to the GMSS status, the gyrocompass system simulator runs the gyrocompass processing or the system calibration processing. The outputs of the gyrocompass system simulator are the estimated unit/base attitude and azimuth and/or identified sensor biases and scale factors. Again the simulator outputs are added to the GMSS data stream and passed to the system evaluation and analysis module. Table 1-3 below is the data stream output by the Gyrocompass Simulator.

TABLE 1-3

Data Stream between Gyrocompass Simulator and System Evaluation and Analysis Module

| Order No. | Name | Parameter Number | Unit | Remark |
|---|---|---|---|---|
| 1. | Time tag | 1 | millisecond | |
| 2. | GMSS status | 1 | n/a | |
| 3. | Unit/base Angular velocity | | rad/sec | |
| 4. | Unit/base attitude and azimuth | 3 | deg | |
| 5. | DCM of B frame with respect to N frame | 9 | n/a | |
| 6. | Unit/base acceleration | 3 | meter/sec/sec | |
| 7. | Unit/base velocity | 3 | meter/sec | |
| 8. | Ambient temperature | 1 | deg C. | |
| 9. | Gyro outputs | 3 | rad/sec | |
| 10. | Gyro bias to be identified | 3 | rad/sec | |
| 11. | Gyro scale factor to be identified | 3 | n/a | |
| 12. | Gyro temperature | 1 | deg C. | |
| 13. | Accelerometer outputs | 3 | meter/sec/sec | |
| 14. | Accelerometer bias to be identified | 3 | meter/sec/sec | |
| 15. | Accelerometer scale factor to be identified | 3 | n/a | |
| 16. | Accelerometer temperature | 1 | deg C. | |
| 17. | Estimated attitude and azimuth | 3 | deg | |
| 18. | Estimated DCM of B frame with respect to N frame | 9 | n/a | |
| 19. | Identified gyro biases | 3 | rad/sec | |
| 20. | Identified gyro scale factor | 3 | n/a | |
| 21. | Identified accelerometer biases | 3 | meter/sec/sec | |
| 22. | Identified accelerometer scale factor | 3 | n/a | |

In the system evaluation and analysis module, the GMSS data stream contains all the necessary information of the whole simulation system. The system evaluation and analysis module records the time history of the GMSS data stream, compares the corresponding data items, and runs a suite of defined algorithms to obtain the gyrocompass system performance criteria. The system evaluation and analysis module also displays and presents the GMSS data stream in a proper visual format for the GMSS user. Because the GMSS data stream is time tagged and generated in an incremental form, the modules of GMSS can be run in different ways: in real-time or in batch/off-line. It also provides an easy extension for use as real-time or hardware-in-the-loop simulation and/or real-code-in-the-loop simulation.

6DOF Motion Simulator

In GMSS, the 6DOF Motion Simulator provides inputs for the IMU simulator and a real reference for evaluation of the gyrocompass system performance. In principle, for GMSS, the 6DOF Motion Simulator needs to generate 3D acceleration, 3D angular velocity, and angular position (attitude). Theoretically, there are two approaches for the 6DOF motion simulation: (i) only following kinematic constraints, or (ii) following both kinematic and dynamic constraints. In a practical system, however, the dynamic motion characteristics can affect gyrocompass system motion interference characteristics and sensor dynamic errors. Therefore, in order to enhance the simulation system fidelity, the dynamic motion of the (mechanical) unit/base is modeled.

A detailed mechanical motion of the unit can be quite complicated to simulate. For example, let us examine a gyrocompass unit mounted on a tripod. The unit's motion is constrained by the tripod gimbals and it is affected by forces and torques from the user, the gravitational force, base motion and vibration, random wind force, and other interferences. If also modeling the elastic characteristics of the base/tripod structure, the motion model can become more complicated.

In a practical simulation system, the dynamic mechanical motion model is retained, but it has been simplified. This practice does not significantly affect the simulation fidelity, for the approximate mechanical motion and interference characteristics of the unit/base have been kept. The following simplifications are incorporated in the 6DOF Motion Simulator:

The unit is a free rigid body. The mechanical constraints and gravitational force are removed.

The 6DOF motion of the unit is a motion controlled by the user. This controlled motion is simulated by a simple closed-loop motion controller.

The angular motion and the translational motion of the unit are independent. Thus, the two motions are controlled by the two independent force controller and torque controller, respectively.

Figure 3:
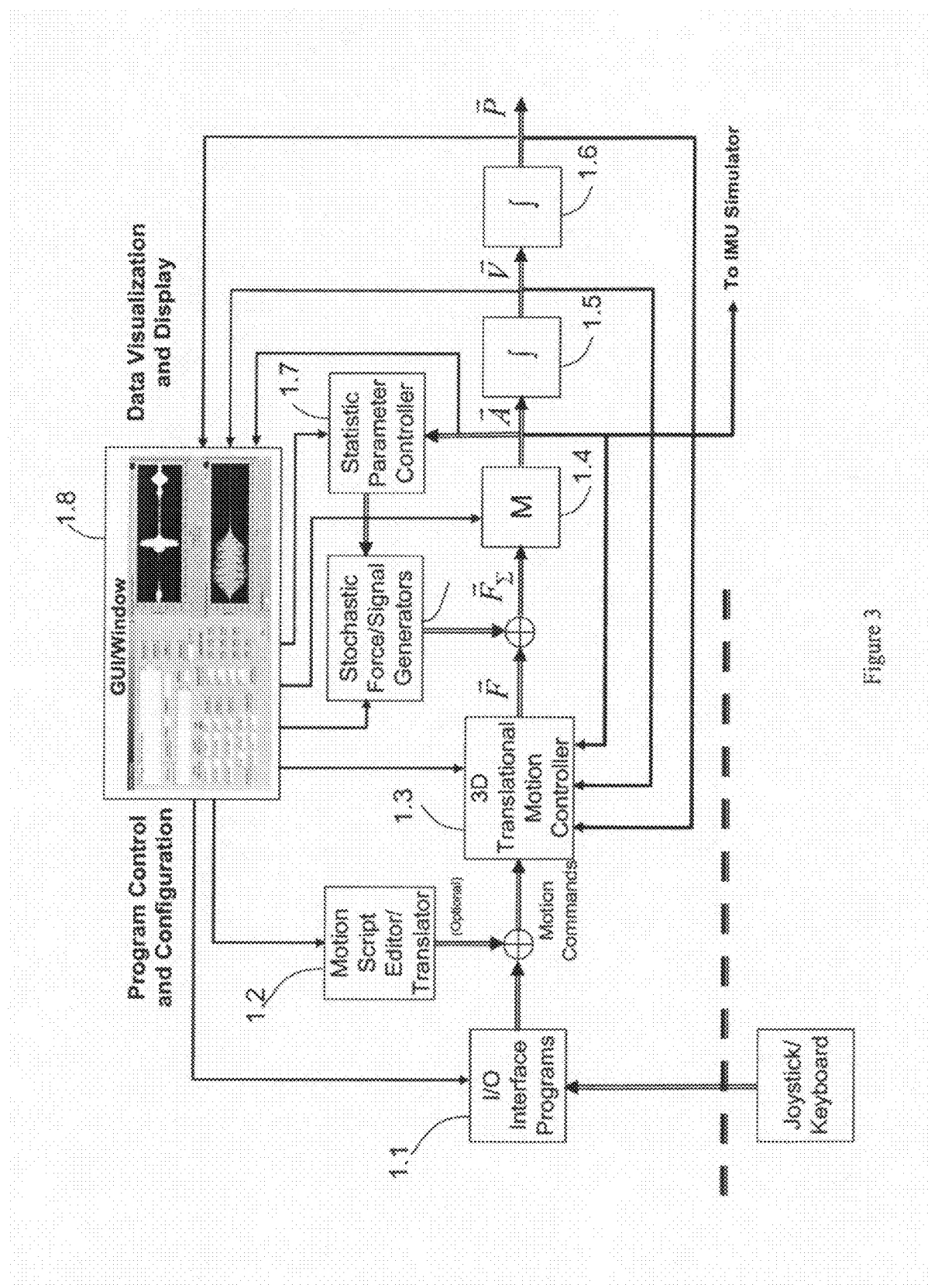
FIG. 3 is a block diagram showing the Translational Motion Simulation of the AGNC-2000RTIS IMU REAL-TIME SIMULATOR.
Figure 4:
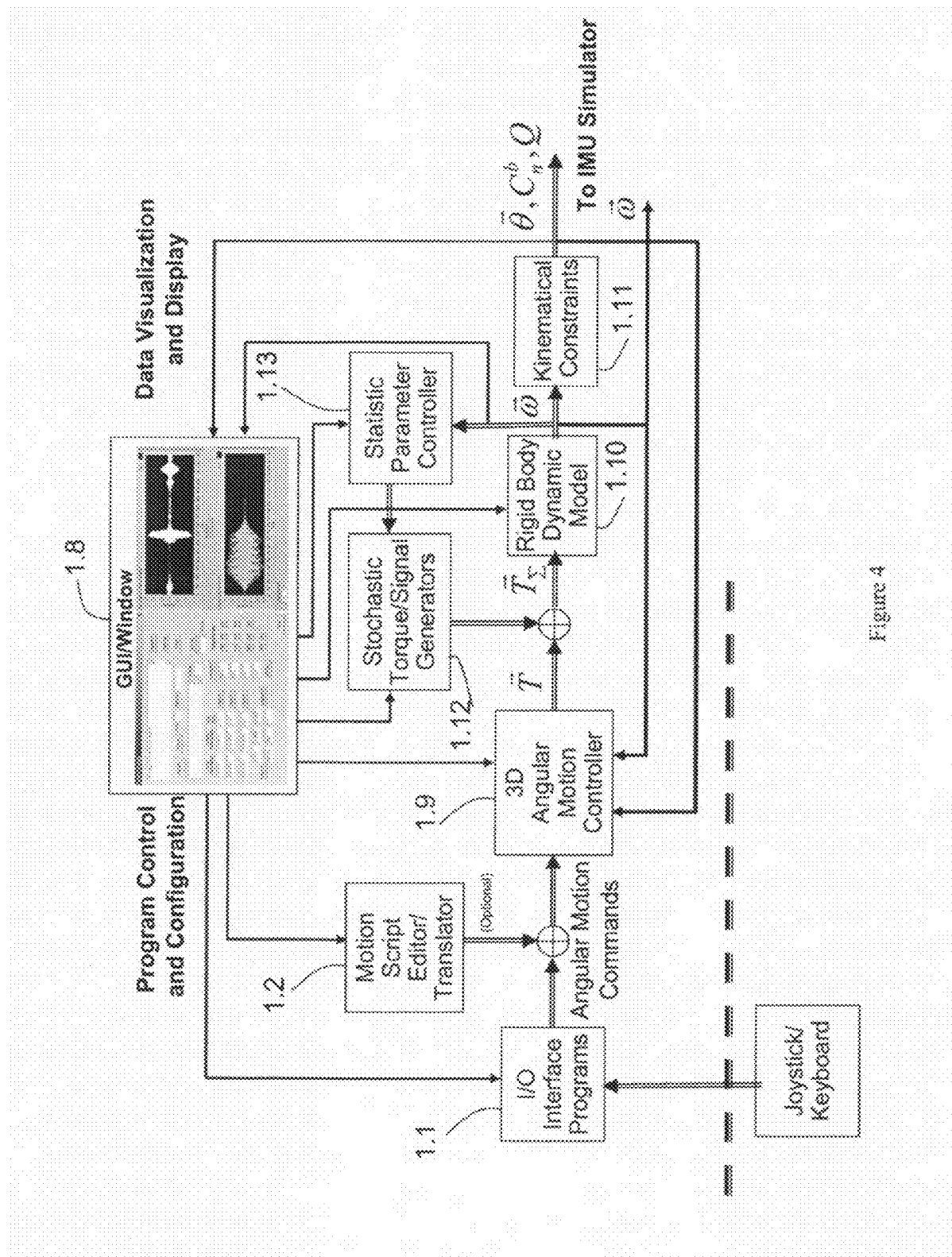
FIG. 4 is a block diagram showing the Angular Motion Simulation of the AGNC-2000RTGIS GPS/IMU REAL-TIME SIMULATOR.

FIG. 3 and FIG. 4 depict the simulation of the translational motion and angular motion, respectively.

With proper GUI and tools, the 6DOF Motion Simulator module simulates the followings:

User-in-the-loop real-time controlled 6DOF motion.
Script described 6DOF motion.
Any power spectral density (PSD) related to base and/or unit vibrations.
Tripod sinking motion.
Trajectory for any 3-D motion including single axis or multiple axis rotations.
The statistical parameters of the stochastic motion can be controlled by force/torque controllers and signal generators.

Referring to FIG. 3, the Translational Motion Simulator includes the following components:

Module M 1.4 representing mass of the unit model.
Modules ∫ 1.5 and 1.6 representing the kinematic constraints of the translational motion.
Module 3D Translational Motion Controller 1.3 controlling the translational motion according to the input motion commands.
Module I/O Interface Programs 1.1 converting the user inputs from the Joystick or Keyboard to the real-time data stream.
Module Stochastic Force/Signal Generators 1.7 producing random forces such as base vibration, wind force, ground tremor, etc.
Module Statistical Parameter Controller 1.7 controlling the Stochastic Force/Signal Generators and setting statistical parameters.
Module GUI/Window 1.8 with two functions: Program Control and Configuration and Data Visualization and Display.
Module Motion Script Editor/Translator 1.2 is an optional function of the motion simulation. It can translate a text/script description of the motion commands to a data stream for simulation.

Referring to FIG. 4, the Angular Motion Simulator has a set of similar modules. Two differences are Module Rigid Body Dynamic Model 1.10 which is a set of Euler equations, and Module Kinematical Constraints 1.11 which is a set of attitude updating equations.

In order to ease the operation of the 6DOF Motion Simulator, we have a library of typical motions saved in the format of motion script files for the user to select. The user can also change the parameters of the motion processes. Examples of typical motion processes in the library can include:

(i) A typical target acquisition process: the unit moves from an initial direction to pointing to the first target, then to the second and the third targets. The user can set the target number, target angular positions, and unit moving angular speeds.

(ii) The user can select to add unit/base vibration to the motion. The vibration includes angular and translational/linear vibration. The user can set the vibration parameters, such as amplitude and frequency.

(iii) The user can select to add unit/base acceleration disturbance to the motion. The acceleration disturbance is a major interference or error source to the gyrocompass. The user can set the disturbance parameters.

(iv) The user can select to add unit/base random angular and translational/linear disturbance to the motion. This is used to simulate interference caused by random external forces or torques, such as wind or base random trembling.

(v) A typical onsite calibration is also simulated to evaluate the calibration functions embedded in the gyrocompass. A GMSS status indicator is used in the GMSS data stream for this purpose.

In addition to the typical motion library, the 6DOF Motion Simulator also provides a motion editor to the user through the Motion Simulator window (GUI). The user can write a script file to describe the piecewise ω(t) and A(t) time functions (or θ(t) and V(t) time functions) and the 6DOF Motion Simulator translates it and uses it for motion generation. A simple syntax is defined for the motion editor.

With proper GUI and tools, the 6DOF Motion Simulator module can simulate:

(i) any power spectral density (PSD) related to vibrations;
(ii) tripod sinking motion; and
(iii) trajectory for any 3-D motion including single axis or multiple axis rotations.

The 6DOF Motion Simulator has a Motion and Disturbance Editor/User Interface for generic motion generation. The 6DOF Motion Simulator is tested and verified by comparing to real data collected from field tests and/or through numerical analysis.

The major function of the gyrocompass is to provide accurate elevation and azimuth angle measurements for a hand-held or tripod-mounted target location system. When the gyrocompass unit is rigidly mounted on or embedded into a target location system, the measurement of the elevation and azimuth angles is equivalent to the attitude (including azimuth) determination of the gyrocompass unit (a rigid body).

The gyrocompass attitude is mathematically expressed in three sets of parameters: i.e. Euler angles, direction cosine matrix (DCM), and quaternions (P). The Euler angles express the body (unit, B frame) attitude with respective to the local geographical coordinate system (N frame) with 3 parameters. Similarly, the DCM expresses the attitude with 9 parameters and the quaternions do the same with 4 parameters.

The Euler angles expression has only 3 parameters. If the elevation/pitch angle is limited to (−90, +90) degrees, Euler angles in the GMSS data stream can be used for Unit/base attitude and azimuth. In the gyrocompass system, if any of the 3 attitude expressions is obtained, the other expressions can be calculated as well. However, the Euler angle attitude expression is not efficient for processing since it will induce a lot of trigonometric functions computation and it has a singular point at θy=±90 degrees. Thus, in the system processing the attitude is often expressed in the form of a direction cosine matrix (DCM) or quaternions. The DCM $C_n^b$ determines the B frame attitude with respect to the N frame and it is the transformation/rotation matrix between the B and N frames.

The relationship between the DCM and the Euler angles is represented by the following equation:

$$C_n^b = \begin{bmatrix} c_{11} & c_{12} & c_{13} \\ c_{21} & c_{22} & c_{23} \\ c_{31} & c_{32} & c_{33} \end{bmatrix}$$

$$= \begin{bmatrix} \cos\theta y \cos\theta z & \cos\theta y \sin\theta z & -\sin\theta y \\ -\cos\theta x \sin\theta z + \sin\theta x \sin\theta y \cos\theta z & \cos\theta x \cos\theta z + \sin\theta x \sin\theta y \sin\theta z & \sin\theta x \cos\theta y \\ \sin\theta x \sin\theta z + \cos\theta x \sin\theta y \cos\theta z & -\sin\theta x \cos\theta z + \cos\theta x \sin\theta y \sin\theta z & \cos\theta x \cos\theta y \end{bmatrix}$$

The quaternions yield another attitude expression between the B frame with respective to the N frame. Since they have only 4 parameters and no singular point, they are often used for attitude updating computation. The attitude updating algorithm is much more efficient than the other attitude expression methods. The relationship between the Euler angles and the quaternions is determined by the following equations:

$cx = \cos(0.5 * \theta x);$ $sx = \sin(0.5 * \theta x);$ $cy = \cos(0.5 * \theta y);$ $sy = \sin(0.5 * \theta y);$ $cz = \cos(0.5 * \theta z);$ $sz = \sin(0.5 * \theta z);$ $p0 = cx * cy * cz + sx * sy * sz;$ $p1 = -sz * sy * cx + sx * cz * cy;$ $p2 = sy * cz * cx + sx * sz * cy;$ $p3 = sz * cy * cx - sx * sy * cz;$ where p0, p1, p2, p3 are the elements of the corresponding quaternions.

The relationship between the quaternions and the DCM, $C_n^b$, is determined by the following equations:

$C_{11} = 2*(q \cdot p0 * q \cdot p0 + q \cdot p1 * q \cdot p1) - 1;$ $C_{12} = 2*(q \cdot p1 * q \cdot p2 + q \cdot p0 * q \cdot p3);$ $C_{13} = 2*(q \cdot p1 * q \cdot p3 - q \cdot p0 * q \cdot p2);$ $C_{21} = 2*(q \cdot p1 * q \cdot p2 - q \cdot p0 * q \cdot p3);$ $C_{22} = 2*(q \cdot p0 * q \cdot p0 + q \cdot p2 * q \cdot p2) - 1;$ $C_{23} = 2*(q \cdot p2 * q \cdot p3 + q \cdot p0 * q \cdot p1);$ $C_{31} = 2*(q \cdot p1 * q \cdot p3 + q \cdot p0 * q \cdot p2);$ $C_{32} = 2*(q \cdot p2 * q \cdot p3 - q \cdot p0 * q \cdot p1);$ $C_{33} = 2*(q \cdot p0 * q \cdot p0 + q \cdot p3 * q \cdot p3) - 1.$ The relationship between the DCM and the Euler angles is determined by the following equations, if no singularity occurs:

$\theta x = \operatorname{arctg}(C_{23}/C_{33});$ $\theta y = \arcsin(-C_{13});$ $\theta z = \operatorname{arctg}(C_{12}/C_{11});$ where θz is the roll angle; θy is the pitch angle; and θz is the heading angle.

In the 6DOF Motion Simulator (in fact for any rigid body motion), the unit/base angular velocity ω and the unit/base attitude and azimuth θ, or $C_n^b$, or P, are related by a kinematic constraint equation:

Euler angles expression: $\omega_{bn}^b = \begin{bmatrix} \omega_x \\ \omega_y \\ \omega_z \end{bmatrix} = \begin{bmatrix} \dot{\theta}_x - \sin\theta_y \dot{\theta}_x \\ \dot{\theta}_y \cos\theta_x + \dot{\theta}_z \sin\theta_x \cos\theta_y \\ \dot{\theta}_z \cos\theta_x \cos\theta_y - \dot{\theta}_y \sin\theta_x \end{bmatrix}$ DCM expression: $\dot{C}_n^b = [\omega_{bn}^b] C_n^b$ Quaternion expression: $\dot{P} = \frac{1}{2} \begin{bmatrix} 0 & -\omega_x & -\omega_y & -\omega_z \\ \omega_x & 0 & \omega_z & -\omega_y \\ \omega_y & -\omega_z & 0 & \omega_x \\ \omega_z & \omega_y & -\omega_x & 0 \end{bmatrix} P$ Similarly, the translational motion vectors for the unit/base acceleration A and the unit/base velocity V are related by another kinematic constraint equation in the earth frame or in the navigation frame but ignore the effect of the earth's shape:

$\dot{A} = \begin{bmatrix} \dot{a}_x \\ \dot{a}_y \\ \dot{a}_z \end{bmatrix} = V = \begin{bmatrix} v_x \\ v_y \\ v_z \end{bmatrix}$ In a real system, the unit/base angular velocity ω is caused by the external torques exerted on the unit/base rigid body; the unit/base acceleration A is caused by the external forces exerted on the rigid unit/base body. Therefore, in principle, the motion of the unit/base must also follow the dynamic constraints, which are expressed by the equations:

$[I]\dot{\omega} + \omega \times [I]\omega = T = \begin{bmatrix} T_x \\ T_y \\ T_z \end{bmatrix}$ $M\dot{A} = F = \begin{bmatrix} F_x \\ F_y \\ F_z \end{bmatrix}$ where [I] is the moment of inertia matrix of the unit/base rigid body; M is the mass of the unit/base rigid body; T is the total external torques vector, F total external forces vector.

From the software point of view, every GMSS component consists of two parts: the GUI/windows for user interface and the background program for simulation processing/computation. Every GMSS component has at least one or two GUI/windows. The functions of the GUI/windows include:

(i) Control the execution and operation of the simulator component.

(ii) Configure the simulator structure through software switches and connectors.

(iii) Provide parameter setting of the simulator component.

(iv) Provide data display and visualization of the simulator variables for the user.

A GUI/window can comprise one or several child windows or dialogs to simplify the design and provide a clean user interface appearance.

In the GMSS system, many reusable components (or controls in software design terms) are used, for example:

The waveform display component (also known as oscilloscope module) is used in every GMSS component for data display and visual analysis.

The PSD analysis component is used in almost every GMSS component for stochastic data processing and PSD function display.

The stochastic signal generator is used in 6DOF and IMU modules for random motion and sensor signal generation.

Therefore, in the present invention, a suite of common reusable components is described for the GMSS software programming.

The 6DOF motion simulator user interface has one master window and one or two dialog windows. The following is a brief description of the layout of the master GUI/window:

A button control is used to control the execution of the 6DOF motion simulator.

A combo box control is used to select the control input of the 6DOF motion simulator. There are three control inputs:
  Keyboard controlled input;
  Joystick controlled input;
  Motion script file controlled input.

A numeric control is used to adjust the gain of the force or torque from the selected motion control input source.

A control is used to start a dialog window for motion script text editing.

A menu is used to start a dialog window for 6DOF motion simulator parameter input and implement changes by the user. The 6DOF motion simulator parameters including dynamic model parameters, closed-loop controller parameters, and the random signal and filter parameters.

A control is used to select the random motion disturbance or oscillating vibration types exerted on the simulated dynamic model—the mass and rigid body. This control can select three types of motion disturbance:
  White noise;
  Colored noise from a low pass filter;
  Oscillating vibration.

A checked box control is used to decide whether or not the random motion disturbance is added to the motion control inputs of a motion simulation channel. There are 6 motion simulation channels, i.e. 3 angular channels and 3 translational channels.

For every motion simulation channel, a numeric control is used to adjust the gain of the selected random motion disturbance to the motion simulation channel. There are totally 6 numeric Up-Down controls for this simulation control function. This gain control is used to adjust the strength of the random disturbance.

Three identical display/oscilloscope controls are used to display the simulation outputs or any internal variables of the 6DOF motion simulator. The user can choose to display 3 variables at the same time.

For each display/oscilloscope control, there is a combo box control, which is used to select the variable from the simulator to display for the user.

A suite of analysis and display tools is used to obtain and display the stochastic analysis results of a selected variable. This module is provided to facilitate the motion disturbance analysis and parameter setting.

For program testing purposes, the GUI/Windows is devised using Windows Presentation Foundation (WPF) tools. These programming tools greatly ease programming and the upgrade of the GUI software.

Figure 5:
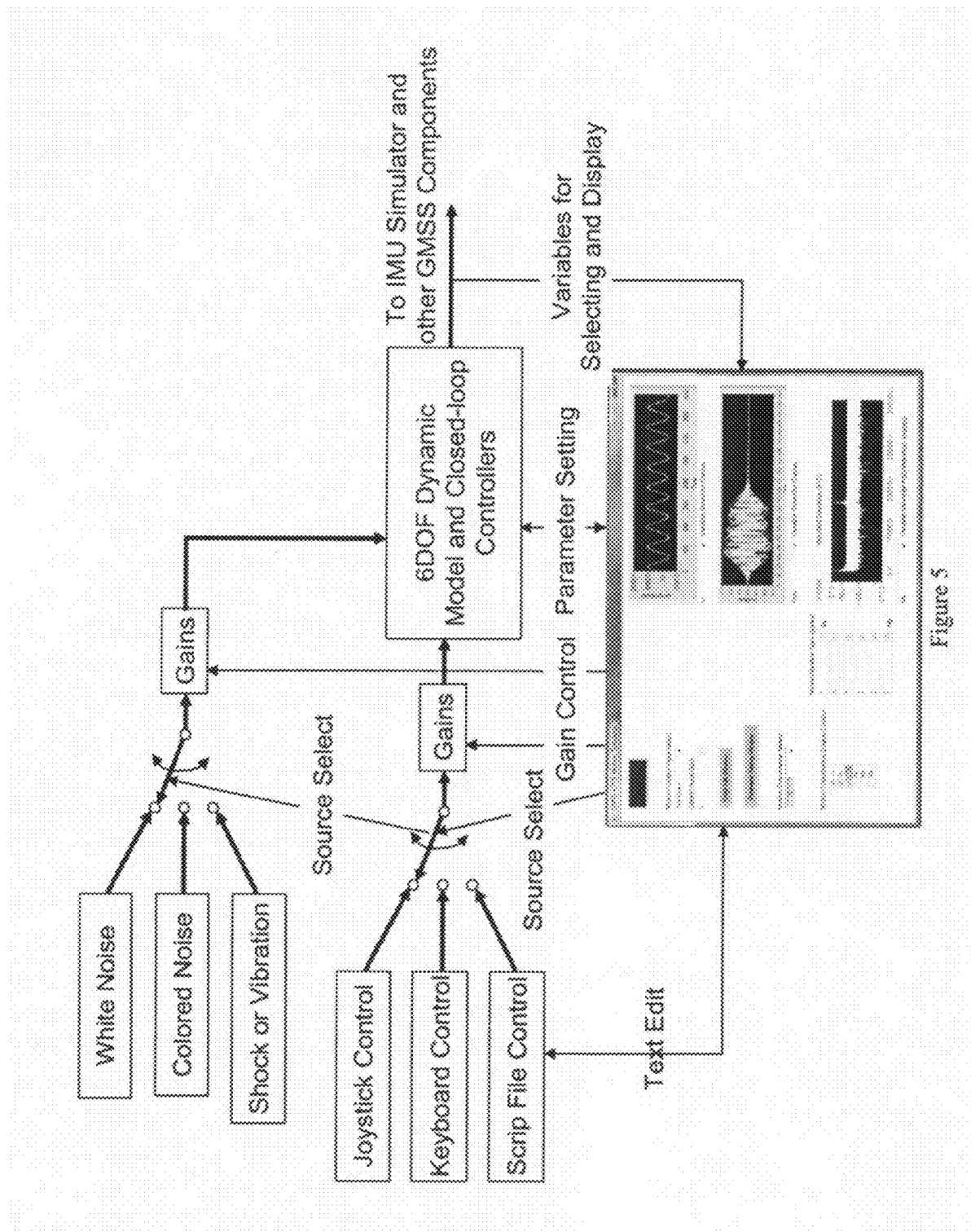
FIG. 5 is a block diagram showing the Relationship between the GUI/Windows and the Background Processing Simulation Program.

For the 6DOF Motion Simulator, the relationship between the GUI/windows and the background processing simulation program is depicted in FIG. 5. The GUI/windows control all aspects of the 6DOF Motion Simulator: inputs selection, parameter setting, and output display selection. The user controlled inputs from keyboard, joystick, or script file control the intended 6DOF motion. The noise or vibration inputs represent the random force or torque exerted on the dynamic motion model.

Referring to FIG. 3 and FIG. 5, the process of the translational motion simulator comprises the steps of:

(a) receiving motion command from the user from the selected joystick or keyboard through the I/O interface 1.1;

(b) reading the specified 6DOF parameters from the GUI window module 1.8;

(c) sending the combined motion command and the specified 6DOF parameters to the translational motion controller 1.3;

(d) generating the control command by translational motion controller 1.3 using motion command and feedback states from the motion simulator outputs;

(e) generating the stochastic force signal by the stochastic process generator 1.7;

(f) combining the control command with the stochastic force signal by translational motion controller 1.3 to generate the total force signal;

(g) producing the acceleration data using the total force signal by mass module 1.4;

(h) producing the velocity data using the acceleration data by integral module 1.5;

(i) producing the position data using the velocity data by integral module 1.6; and (j) sending the produced the acceleration data, the velocity data, and the position data to the IMU simulator module 2.

In the 6DOF simulation model, the user controlled inputs go into the simulator as the input of the motion controller. The 6DOF motion controller generates the forces and torques to drive the dynamic model, to control the 3 angular rates/velocities and 3 translational velocities (of the simulated gyrocompass unit). The noise and vibration inputs go directly to the 6DOF dynamic model.

The operation of the 6DOF Motion Simulator is programmed as follows:

When the 6DOF Motion Simulator is opened for the first time, and the Start button is pressed, the simulation program starts running. But, at the beginning, the default user input is selected as keyboard input. And, the noise gains are set to zero. If the assigned control keys (such as arrow keys) are not pressed down, then all outputs of the 6DOF Motion Simulator will be zero.

Also, when started for the first time, all parameters are set to the default values. The user needs to configure the system parameters according to the simulation task requirements.

If not configured, the default motion disturbance inputs (noise/vibration) are set to zero. In practice, a motion disturbance is usually described by a PSD function and accumulated amplitude which is represented by the STD or root mean square value over the system bandwidth. Thus, a practical configuration approach can be like this:

Set the user input to zero (default selection) and start running the simulator (so that the dynamic model and the closed-loop system processing are running).

Select a proper noise/vibration input and proper filter to obtain expected PSD function shape.

Then, adjust the noise/vibration gains to obtain expected STD value.

The adjustment of the noise/vibration gains can be performed automatically by the Statistical Parameter Controller or manually by the user using the up-down numeric control on the GUI/windows. The STD value of the selected 6DOF channel is always displayed on the GUI/windows.

After the user configuration is finished, the system parameters will be automatically saved by the 6DOF simulator module and the user can start 6DOF simulation control through one of the three inputs.

The user can then display the simulated output through the GUI/windows.

If the user uses joystick or keyboard for simulation control, the display feedback is required and must be selected by the user in order to obtain expected motion waveform and/or values.

In addition to waveform/oscilloscope type display, GMSS may also use instrument types of display or even 3D animation type display to provide rich visual appearance for the 6DOF simulator and other GMSS components.

In GMSS, in order to enhance the simulation system fidelity, the dynamic motion of the (mechanical) unit/base is also modeled. The 6DOF motion of the unit is a motion controlled by the user. This controlled motion is simulated by a simple closed-loop motion controller. In the software realization of the 6DOF simulator, the GUI/windows control all aspects of the 6DOF Motion Simulator: inputs selection, parameter setting, and output display selection.

The user controlled inputs, from keyboard, joystick, or script file, control the intended 6DOF motion. The noise or vibration inputs represent the random force or torque exerted on the dynamic motion model. The angular motion and the translational motion of the unit are independent. Thus, the two motions are controlled by the two independent force controller and torque controller, respectively.

The configuration of the 3D translational motion is quite straightforward, as the three channels of the control system can be considered independent. But the 3D angular motion channels of the unit/base can not be considered independent. In fact, both the dynamical and kinematic models of the 3D angular motion can be coupled between the three channels/axes.

Considering the unit/base as a rigid body, the angular dynamic motion is described by the so-called Euler Equations:

$$\dot{H} = [I^b]\dot{\omega} + \omega \times H = M^b$$

where $\omega$ is the angular velocity of the rigid body with respect to the ground or local navigation frame N (that is $\omega = \omega_{bn}^b$); H is the angular relative momentum of the rigid body and $$H = [I^b]\omega$$

where $[I^b]$ is the inertia matrix of the rigid body with respect to the body frame; $M^b$ is the torque exerted on the rigid body.

The Euler Equations in component form are:

$$I_x \dot{\omega}_x + (I_z - I_y)\omega_z \omega_y = M_x$$

$$I_y \dot{\omega}_y + (I_x - I_z)\omega_x \omega_z = M_y$$

$$I_z \dot{\omega}_z + (I_y - I_x)\omega_y \omega_x = M_z$$

where $I_x$, $I_y$, $I_z$ are the moments of inertia of the rigid body with respect to the axes of the body frame. It is assumed that the rigid body is symmetric with respect to the body axes.

Using the angular velocity ($\omega = \omega_{bn}^b$), we proceed to calculate the attitude of the rigid body (unit/base) with respect to the local navigation frame N. In practice, there are three major representations for the attitude (angular position) of a rigid body, Euler angles, direction cosine matrix (DCM), and quaternions. In principle, there are three types of kinematic models used to obtain each of the three attitude representations from the angular velocity $\omega_{bn}^b$, respectively.

The Kinematic model represented in Euler angles is represented by the following equation:

$$\dot{\theta} = \begin{bmatrix} \dot{\theta}_x \\ \dot{\theta}_y \\ \dot{\theta}_z \end{bmatrix} = \frac{1}{\cos\theta_y} \begin{bmatrix} \cos\theta_y & \sin\theta_x \sin\theta_y & \cos\theta_x \sin\theta_y \\ 0 & \cos\theta_x \cos\theta_y & -\sin\theta_x \cos\theta_y \\ 0 & \sin\theta_x & \cos\theta_x \end{bmatrix} \begin{bmatrix} \omega_x \\ \omega_y \\ \omega_z \end{bmatrix} = \frac{1}{\cos\theta_y} M_\theta \omega_{bn}^b$$

where:
Euler angle $\theta y$, the pitch angle=elevation angle;
Euler angle $\theta z$, the heading angle=azimuth angle;
Euler angle $\theta x$ the roll angle is not of concern in the target location system, but necessary for the 6DOF simulation.

The Kinematic model represented in DCM is:

$$\dot{C}_n^b = [\omega_{bn}^b] C_n^b$$

where $[\omega_{bn}^b] = \begin{bmatrix} 0 & \omega_z & -\omega_y \\ -\omega_z & 0 & \omega_x \\ \omega_y & -\omega_x & 0 \end{bmatrix}$ The Kinematic model represented in quaternions is:

$$\dot{q} = \frac{1}{2}[\bar{\omega}_{bn}^b] q$$

where $[\bar{\omega}_{bn}^b] = \begin{bmatrix} 0 & -\omega_x & -\omega_y & -\omega_z \\ \omega_x & 0 & \omega_z & -\omega_y \\ \omega_y & -\omega_z & 0 & \omega_x \\ \omega_z & \omega_y & -\omega_x & 0 \end{bmatrix}$ The Euler angles express the body attitude with 3 parameters. The DCM expresses the attitude with 9 parameters, and the quaternions do the same thing with 4 parameters. However, the Euler angle attitude expression is not efficient for the attitude update processing since it will induce a lot of trigonometric functions computation and it has a singular point at $\theta y = \pm 90$ degrees. Thus, in the attitude update processing the attitude is often expressed in the form of a DCM or quaternions.

Figure 6:
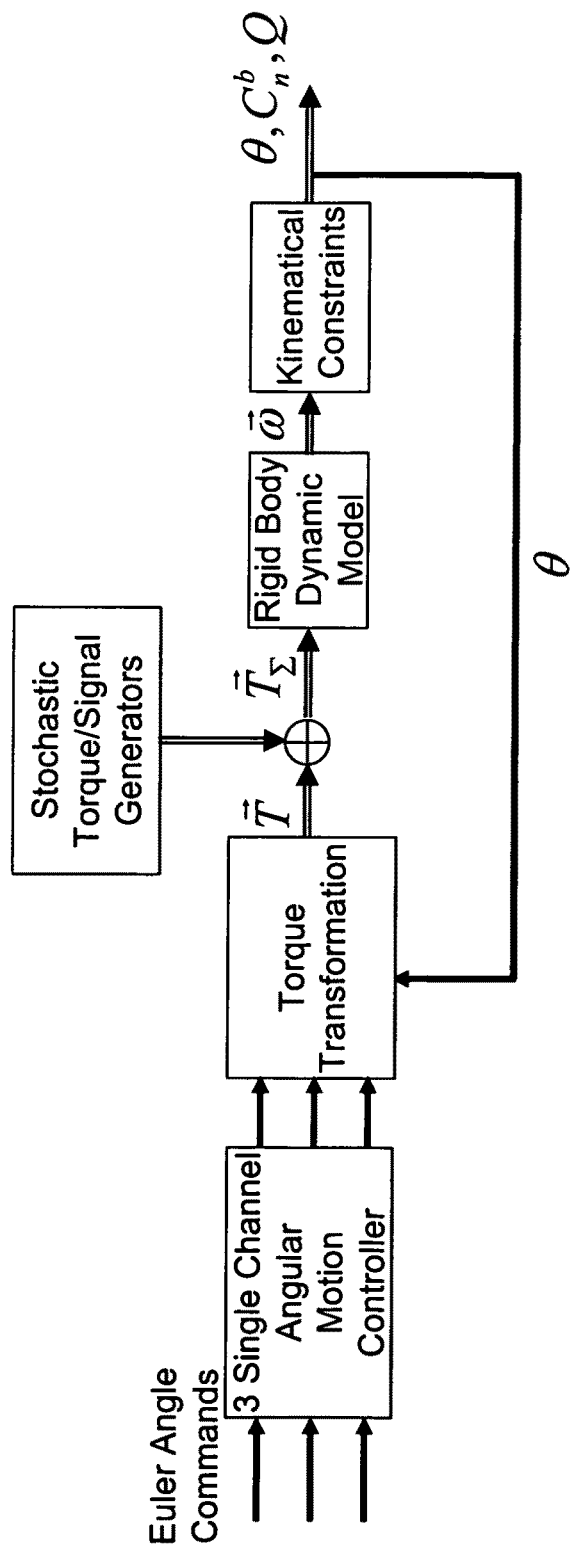
FIG. 6 is a block diagram showing the 3D Angular Motion Simulation using Euler Angle Control.

In the GMSS, we use quaternions for attitude update processing for their efficiency. The DCM must also be used for frame transformation. In practice, however, the attitude expression of Euler angles is more intuitive and user-friendly. In the dynamical model, if the $M^b$ is directly controlled by the torque generator, the three Euler angles control are coupled. In order to control the three Euler angles separately or independently, the torques for Euler angles control must be transformed to the body frame by a virtual gimbals transfer matrix, like in an actual two or three-axis gimbals system, as depicted in FIG. 6.

The use of Euler angles will introduce a singular point at pitch $\theta y = \pm 90$ degrees. In practical software realization, if we limit the range of the pitch angle to a safe range, such as to [−85, 85] degrees, the singularity can be avoided and the simulation accuracy can be retained at a certain level.

For translational motion modeling we consider the unit as a free rigid body. The mechanical constraints and gravitational force are removed. Then, the 3D translational/linear motion of the unit is described by Newton's law:

$$a = \dot{v} = f/m$$

where v is the velocity vector; m is the mass of the unit.

The 6DOF motion simulator simulates the motion of the unit which is controlled by the user. This controlled motion is simulated by a simple closed-loop motion controller. The angular motion and the translational motion of the unit are assumed independent. Thus, the two kinds of motions are controlled by the two independent force controller and torque controller, respectively.

The configuration of the 3D translational motion is quite straightforward, as the three channels of the control system can be considered independent. But the 3D angular motion channels of the unit/base can not be considered independent. In fact, both the dynamical and kinematic models of the 3D angular motion can be coupled between the three channels/axes.

The first step for the 3D angular motion simulation is to solve the Euler Equations $[I^b]\dot{\omega}+\omega\times H=M^b$. The establishment of the GMSS foundation classes has made programming of the simulation algorithms very simple and elegant, like writing a mathematical equation in vector form. The Euler Equations in a standard form are:

$$\dot{\omega}=[I^b]^{-1}(M^b-\omega\times([I^b]\omega))=F(\omega,M^b)$$

The digital solution of the Euler Equations can be obtained by many numerical methods. In GMSS programming, we realized and compared two methods, the Euler method and the 4$^{th}$ order Runge-Kutta method.

The solution by the Euler method is expressed as:

$$\omega(n+1) = \omega(n) + T*[I^b]^{-1}(M^b(n)-\omega(n)\times([I^b]\omega(n)))$$
$$= \omega(n) + T*F(\omega(n),M^b(n))$$

where T is the sample period. The solution by the 4$^{th}$ order Runge-Kutta method is expressed as:

$$K_1=F(\omega(n),M^b(n))$$
$$K_2=F(\omega(n)+0.5*T*K_1,M^b(n))$$
$$K_3=F(\omega(n)+0.5*T*K_2,M^b(n))$$
$$K_4=F(\omega(n)+T*K_3,M^b(n))$$
$$\omega(n+1)=(\omega(n)+T*(K_1+2*K_2+2*K_3+K_4)/6$$

Using the angular velocity ($\omega=\omega_{bn}^b$), the attitude of the rigid body (unit/base) with respect to the local navigation frame N can be obtained. In the GMSS, we use quaternions for attitude update processing because of their efficiency. The kinematic model represented in quaternions is:

$$\dot{q} = \frac{1}{2}[\bar{\omega}_{bn}^b]q$$

$$\text{where } [\bar{\omega}_{bn}^b] = \begin{bmatrix} 0 & -\omega_x & -\omega_y & -\omega_z \\ \omega_x & 0 & \omega_z & -\omega_y \\ \omega_y & -\omega_z & 0 & \omega_x \\ \omega_z & \omega_y & -\omega_x & 0 \end{bmatrix}$$

There are many numerical solution methods for the quaternions equation to obtain the attitude update. In GMSS, we use the conventional quaternions transformation matrix method for attitude update:

$$q(n+1)=C_q(\Delta\theta_x,\Delta\theta_y,\Delta\theta_z)q(n)$$

where $C_q(\Delta\theta_x,\Delta\theta_y,\Delta\theta_z)$ is the 4×4 quaternions transformation matrix; $\Delta\theta_x, \Delta\theta_y, \Delta\theta_z$ are angle increments over the period T; and $$\Delta\theta_x=\omega_x*T$$
$$\Delta\theta_y=\omega_y*T$$
$$\Delta\theta_z=\omega_z*T$$

In this method, it is assumed that the angular acceleration during the period T is negligible. In practical use, if the motion dynamics are not very high and T is small enough, the attitude update error can be negligible. For a high dynamics simulation, we can use a more accurate series expansion for the transformation matrix expression and/or use more accurate attitude update methods, such as coning algorithms.

From the quaternion q(n), the DCM and Euler angles can be obtained. In the dynamic control model $\dot{\omega}=F(\omega, M^b)$, the control input $M^b$ can control the angular velocity ($\omega=\omega_{bn}^b$) expressed in the body frame directly, but it can not control the Euler angles directly and separately. In practice, however, the attitude expression of the Euler angles is more intuitive and user-friendly. In the dynamical model, if the $M^b$ is directly controlled by the torque generator, the three Euler angles control is coupled. In order to control the three Euler angles separately or independently, the torques for Euler angles control must be transformed to the body frame by a virtual gimbals transfer matrix, as in an actual two or three-axis gimbals system. A simple and straightforward method is:

To exert a torque component in the heading angular velocity direction to control the heading angle;

To exert a torque component in the pitch angular velocity direction to control the pitch angle;

To exert a torque component in the roll angular velocity direction to control the roll angle.

The total torque is then projected onto the body frame as the $M^b$.

In vector form:

$$\vec{M}^b=\vec{M}_h+\vec{M}_p+\vec{M}_r$$

Projected to and expressed in the body frame:

$$M^b = C_1^b M_h + C_2^b M_p + C_b^b M_r$$
$$= C_1^b M_h + C_2^b M_p + M_r$$
$$= C_1^b \begin{bmatrix} 0 \\ 0 \\ m_h \end{bmatrix} + C_2^b \begin{bmatrix} 0 \\ m_p \\ 0 \end{bmatrix} + \begin{bmatrix} 0 \\ 0 \\ m_r \end{bmatrix}$$
$$= C_m(\theta_x, \theta_y) \begin{bmatrix} m_r \\ m_p \\ m_h \end{bmatrix}$$
$$= C_m(\theta_x, \theta_y) M_\theta$$

where the frames 1 and 2 are two intermediate frames for Euler angles definition; $C_m(\theta_x, \theta_y)$ is the transformation matrix for the torque vector.

$$C_m(\theta_x, \theta_y) = \begin{bmatrix} 1 & 0 & -\sin\theta_y \\ 0 & \cos\theta_x & \sin\theta_x\cos\theta_y \\ 0 & -\sin\theta_x & \cos\theta_x\cos\theta_y \end{bmatrix}$$

The transformation matrix also links the angular velocity $\omega = \omega_{bn}^b$ and angular rates of the three Euler angles:

$$\omega = \omega_{bn}^b = C_m(\theta_x, \theta_y)\dot{\theta} = C_m(\theta_x, \theta_y)\begin{bmatrix}\dot{\theta}_x \\ \dot{\theta}_y \\ \dot{\theta}_z\end{bmatrix}$$

Using the torque transformation $M^b = C_m(\theta_x, \theta_y)M_\theta$, the torque $M_\theta$ is able to control the Euler angles separately with its torque components. There is coupling between the three Euler angle channels, but every Euler angle is controllable separately. And, if the closed-loop control method is used, the coupling between the channels can be eliminated. Because the coupling is now regarded as interference to a control channel, its interference effect can be removed by the controller since the interference is inside the closed loop control.

Figure 7:
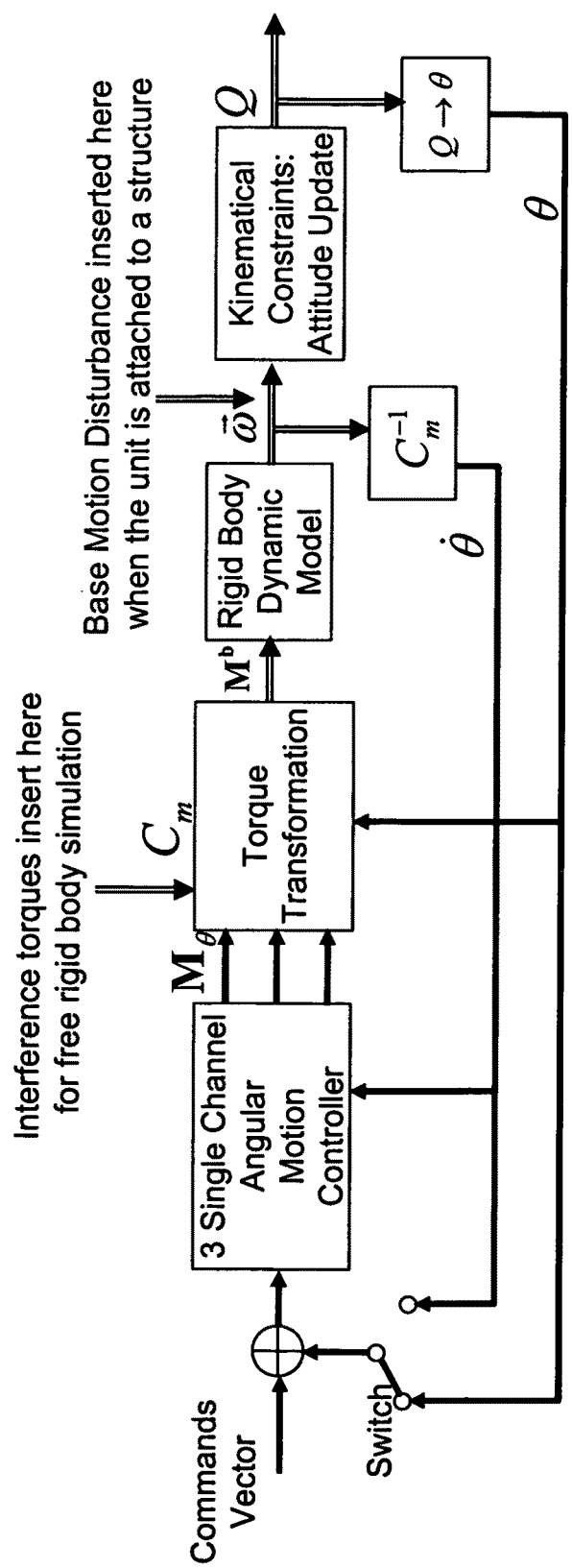
FIG. 7 is a block diagram showing the 6DOF Motion Simulation—Three Control Modes.

The realization of the attitude controllers is also straightforward. Since the rigid body has very little damping in its dynamic model, as the simplest control method, we use PD controllers for the attitude closed-loop control. Expressed in vector form, the controller algorithm is:

$$M^b = C_m(\theta_x, \theta_y)M_\theta$$
$$= C_m(\theta_x, \theta_y)(-K_d\dot{\theta} + K_\theta(\theta_{comm} - \theta))$$

where $K_d$ is the damping coefficient; $K_\theta$ is the proportional control coefficient; $\theta$ is the Euler angle vector; $\dot{\theta}$ is the Euler angle rate vector; $\theta_{comm}$ is the commanded input Euler angle vector from the user input module. FIG. 7 shows a block diagram of the attitude update and closed-loop control for the angular motion simulation.

The use of Euler angles will introduce a singular point at pitch $\theta y = \pm 90$ degrees. In practical software realization, if we limit the range of the pitch angle to a safe range, the singularity can be avoided.

Referring to FIG. 4 to FIG. 7, the process of the angular motion simulator comprises the steps of:

(a) receiving motion command from the user from the selected the joystick, the keyboard, or the selected script file through the I/O interface 1.1;

(b) reading the specified 6DOF parameters from the GUI window module 1.8;

(c) sending the combined motion command and the specified 6DOF parameters to the angular motion controller 1.9;

(d) generating the control command by angular motion controller 1.9 using motion command and feedback states from the angular motion simulator outputs;

(e) generating the stochastic torque signal by the stochastic process generator 1.12;

(f) combining the control command with the stochastic torque signal by angular motion controller 1.9 to generate the total torque signal;

(g) producing the angular acceleration data using the total torque signal by rigid body dynamic model 1.10;

(h) producing the angular velocity data using the torque data and 3D Euler rigid body dynamic model 1.10;

(i) converting the angular velocity data in body frame to Euler angle form angular velocity data by module 1.10 for control Euler angular rate;

(j) producing the angle data using the angular velocity data and quaternion attitude updating equations by kinematical constraints module 1.11;

(k) converting the angular position in quaternion form to Euler angle form by kinematical constraints module 1.11 for control Euler position; and (l) sending the produced angular velocity data, and the angle data to the IMU simulator module 2 and evaluation module 4.

Using a joystick or other user interface device to directly control the 6DOF motion generation in real-time can greatly ease the operation of the GMSS. The user can quickly produce any kind of 6DOF motion for the simulation session. We have selected a joystick for the user-controlled 6DOF motion generation.

The joystick is a standard USB human interface device (HID). In the Windows OS, the application can not access the PC hardware/devices directly, but must do so through the device drivers. For a standard USB HID device, the Windows will identify it when it is plugged into the PC. Windows provides a set of standard generic drivers for the USB HID devices and provides a suite of APIs for the user to build a specific device driver and communication interface. In the GMSS software, based on HID framework, the joystick device driver programs are coded and tested to connect the joystick to the 6DOF motion generator program module.

When the GMSS application software is started, the joystick device driver programs will find the joystick device and establish a communication link with it. The joystick driver programs include the following functions:

Find out all the HID devices on the PC to see if the required joystick device is one of them. Because there may be many HID devices present on the PC, such as USB mouse and/or keyboard, the joystick driver programs need to pick up the right HID device for the GMSS application software.

Check the list of the HID devices found and their attributes with the joystick's Vendor ID (VID) and Product ID (PID) to see if the required joystick device is currently plugged in on the computer.

If a match is found, then get detailed information of the joystick device and establish a communication link with the device.

Through the communication link read the joystick input report periodically and use it as the control command of the 6DOF generator.

The joystick driver programs and decoder programs are incorporated into the 6DOF motion generation programs. Two types of user-in-the-loop control modes are used for the 6DOF motion generator: angle control mode and angular rate control mode, as depicted in FIG. 7.

Three software modules: 6DOF simulation processing module, joystick device driver module, and 6DOF GUI module, are combined together to form a complete user-in-the-loop control 6DOF motion generator. The GUI and joystick modules provide the user a richer visual experience and more flexible control over the GMSS process.

Figure 8:
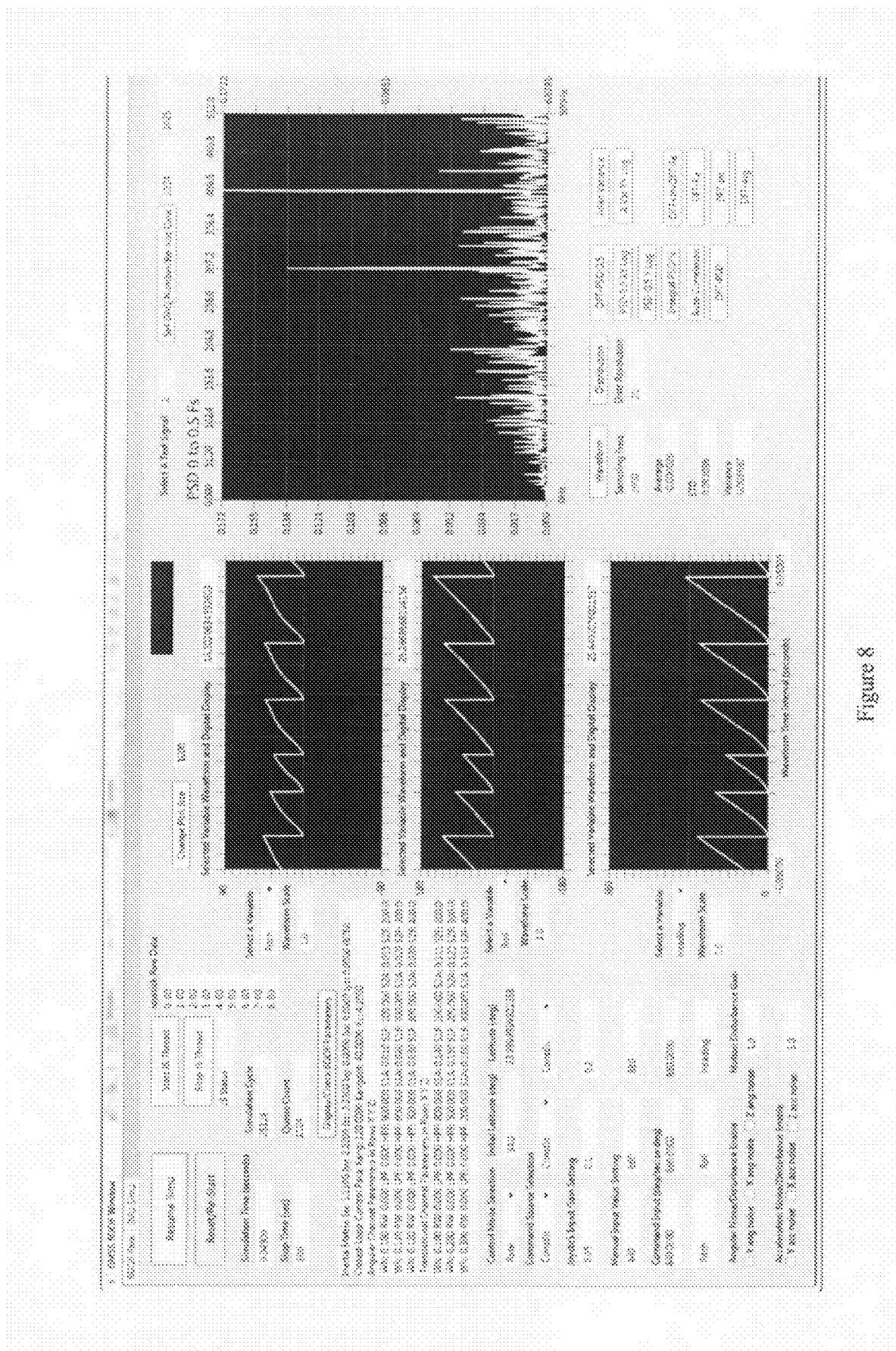
FIG. 8 is a software display showing the 6DOF Motion Simulator GUI Window.

FIG. 8 shows the GUI of the 6DOF motion generator. The major functions of the GUI include:

Control of the simulation process. Provides start, stop, and resume controls of 6DOF motion generator.

For testing purposes, provides control over joystick program thread. This function is combined into the simulation control function after the GMSS system is completed.

Selection of 6DOF motion generator control mode: angular rate control or Euler angle control mode.

Selection of command input sources. For testing purposes, four command sources are provided: joystick input, script file input, virtual joystick realized by GUI and the mouse/keyboard, and manual value input for testing.

Waveform and digital display module to plot and display any simulation outputs or internal variables for test and evaluation.

Provide control over stochastic signal generation and injection.

The GUI of the 6DOF motion generator also serves as the master GUI of the whole GMSS software system. It has several menus, such as "IMU Simu", "IMU Para", and "Gyrocompass Simu" etc., to launch separate window GUIs for other simulation modules of the GMSS system. The GUI of the 6DOF motion generator also includes:

Display of the raw data of the joystick. The raw data of the joystick consist of 9 bytes. The display is in hexadecimal format.

Display of the command inputs to the 6DOF motion generator.

Display of the communication queue count.

More 6DOF generator variables are added to the display/waveform selection list.

To provide an intuitive user control interface, the angular control of the 6DOF motion generator is based on three Euler angles. In the rate mode the input is interpreted as required Euler angle change rates, while in the angle mode as required Euler angle values.

A set of .net based Queue data structures is used for communication buffering and it also provides a simple and reliable inter-module synchronization mechanism. A Queue is a first-in-first-out buffer. The 6DOF motion generator data is put into a set of queues and the IMU simulator fetches input data from the queues. The synchronization mechanism is realized as follows: if the queues are empty the IMU simulator must wait for the 6DOF motion generator. If we set a maximum limit for the Queue count, when the maximum limit is reached the 6DOF motion generator must wait for the data to be fetched from the queues.

The GUI of the 6DOF motion generator also includes:

a text box to set the initial latitude for the GMSS. Now the initial latitude in GMSS is not a predefined constant but a user-defined input.

a text block to display the time-varying latitude according to the position change of the 6DOF simulator.

a button and a text box for the user to change the waveform display data size. The default data size is 1000 and at 1 millisecond sampling period the waveform window can store and display 1 second data for the selected variables.

angular and linear motion disturbance to all 3 axes of the 6DOF simulator. Noise components such as white noise, pink noise, red noise, and vibration noise can be created and added to the simulator.

A noise gain (defaulted to 1.0) is used to control the strength of the motion disturbance.

More 6DOF generator variables are added to the display/waveform selection list, such as linear acceleration and velocity.

The default command source selection is a user manual input through text boxes. This command makes it easier to get more accurate control than with a joystick, for example to control the 6DOF simulator at a constant angular rate or direct to a specific angular position.

The attached 6DOF control mode is added to accommodate structure dominated vibration and stochastic base/unit motion. When the unit is a free rigid body, the rate mode or angle mode can be selected for simulation control, such as when it is hand held. If the unit is attached to a structure, such as to a larger test table or to a tripod, it is not a free rigid body any longer and its motion can not be described directly by rigid body Euler Equations. Instead, the motion of the unit is dominated by the motion of the structure. FIG. 7 in the attached mode the base motion disturbance is added to the angular velocity outputs. In the other two modes, the base motion disturbance and interference torques are exerted on the rigid body.

The 6DOF simulation parameters include:

Unit rigid body inertia matrix parameters.

Unit mass parameter.

6DOF closed-loop control parameters.

6 channels disturbance/noise and vibration simulation parameters.

All the 6DOF simulation parameters can be displayed at any time by clicking on the button "Display/Check 6DOF Parameters", as shown in FIG. 9. All the 6DOF simulation parameters can also be displayed and changed at any time (in real-time during simulations) by the "Win_6DOF_Dialog", as depicted in FIG. 10.

Referring to FIG. 8, it shows the 6DOF motion simulator GUI window with a demonstration of the user controlled reset/restart function. In the simulation, we often need to try different suites of parameters. And, with the changed simulation parameters, we need to reset or restart the simulation as a new session. The updated GMSS provides this function with a "Reset/Restart" button on the 6DOF GUI window.

The functions of the "Reset/Restart" button include:

Reset the simulation time to 0.

Reset or re-initialize the states of the 6DOF simulator.

Since the simulation time is also sent to other GMSS components (the IMU Simulator, the Gyrocompass Simulator, and the Gyrocompass Evaluation and Analysis Module), the other GMSS components can detect the reset of time and perform their subsystem reset accordingly.

Referring to FIG. 8 to FIG. 10, the major functions of the 6DOF Simulator and its GUI comprise the followings:

(1) High accuracy dynamic and kinematical model based 6DOF motion simulation.

(2) Three motion control modes: angle, rate and attached, to simulate different types of base motion.

(3) User controlled start and stop/resume function.

(4) User controlled re-start function to clear all the system states and put all states to default values.

(5) Auto stop function for user programmed simulation session control.

(6) User-in-the-loop quasi-real-time 6DOF motion control method is supported. The user can issue 6DOF commands with joystick, keyboard, and/or mouse.

(7) Three real-time data waveform display canvases/oscilloscopes which can choose most of the inputs, outputs, and internal variables of the 6DOF simulator for view and display.

(8) One data waveform display canvas/oscilloscope which is used as a buffer to store and display the selected variable for analysis. This display canvas/oscilloscope is auto scaled and also used by the stochastic analysis tools for displaying analysis results.

(9) A 6DOF (or 6 channels) signal composer for the user to set and produce different types of composed stochastic signals for 6DOF random motion simulation.

(10) Display and check of all 6DOF simulator parameters in a text block.

(11) User setting of all 6DOF simulator parameters through a dialog window.

(12) Three real-time data digital displays which can choose most of the inputs, outputs, and internal variables of the 6DOF simulator for view and display.

(13) Enable/disable control of the 6DOF stochastic signals.

(14) User magnitude control of the 6DOF stochastic signals.

(15) Dedicated real-time data digital displays of the latitude. (The velocities and accelerations can be displayed by three waveform display canvases/oscilloscopes and three real-time data digital displays).

Using the simulation time and any other event/message between the GMSS components as a reference, it is easier to realize automated simulation control and synchronization of the whole GMSS system. A simulation session may have several steps and procedures and we also need to simulate some special events in a targeting session. For example, a gyrocompass may be put on a table or rock for initial alignment and then put on a tripod for target tracking, and then carried by a user to another location, etc.

As part of the session control functions, the automatic simulation stop function is also added to the GMSS. The simulation stop is set in 6DOF GUI with a "Stop Time" text box. Synchronized by the simulation time variable, the whole GMSS simulation is under control and stopped at the specified time. The event simulation inside the GMSS components can also be synchronized by referring to the simulation time.

As a special 6DOF base/unit motion simulation scenario, a tripod sinking kinematics model is created. For this scenario, the 6DOF simulator is in the "attached" mode and a set of user configurable parameters is used in the sinking kinematics model to accommodate different types/sizes of structure and motion.

Figure 11:
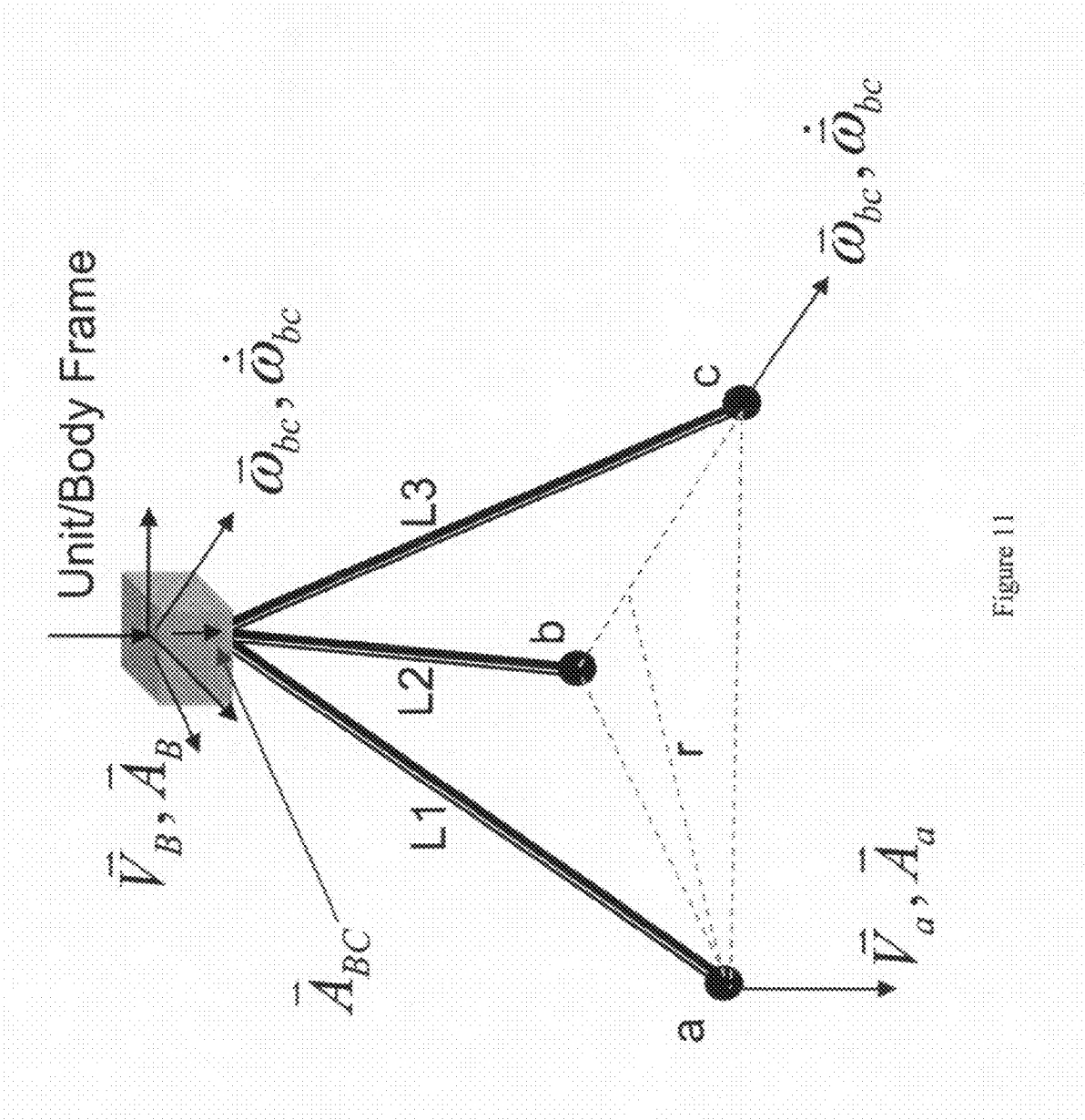
FIG. 11 is a drawing showing the Tripod Sinking Simulation Model—One Leg Sinking.

FIG. 11 depicts the structure and parameters used in modeling and simulation of the tripod sinking. We assume that the unit is rigidly attached to the tripod and the flexure of the tripod leg is omitted. The figure shows a one-leg sinking scenario with a certain speed and acceleration.

As depicted in the figure, the sinking can cause several angular and linear motions to the unit/body frame. Generally, they can be consider equivalently as a small, slow changing (ultra-low frequency) base angular motion in the gyro outputs and as a small, slow changing base acceleration disturbance in the accelerometer outputs. Because of their ultra-low frequency characteristics, it is challenging to filter them out.

For coarse alignment, the base acceleration disturbance will increase the level attitude errors; base angular motion will increase the heading error. In fine alignment, since the mathematical platform is established, the base angular motion can be isolated/removed. But the base acceleration disturbance can not be easily removed or compensated; it can cause level attitude errors and, more significantly, can cause heading error and increase the fine alignment time. According to basic principles related to the steady state accuracy of gyrocompassing, the attitude and heading/azimuth angle errors can be approximately estimated as:

$$\Delta\phi_{x,y} \approx (\nabla + A_{eq})/g$$

$$\Delta\phi_z \approx (\epsilon/\Omega \cos\phi) + tg\phi(\nabla + A_{eq})/g$$

where, $\nabla$—Uncompensated accelerometer bias.

$A_{eq}$—Equivalent base acceleration disturbance.

$\epsilon$—Uncompensated gyro bias drift.

g—Gravitational acceleration.

$\Omega$—Earth rate, 15.04106864 deg/hr.

$\phi$—Local latitude.

Historically, performing gyrocompassing on a moving base has been a challenge for the initial alignment of many INS applications. For example, initial alignment of an INS on a ship at harbor, or on an aircraft, during boarding of personnel or loading of cargos. The base/vessel will undergo slow motion similar to the sinking of a tripod. Thus, our GMSS can be used to simulate and investigate not only tripod sinking effects but also other base motion effects on gyrocompassing for many other applications.

IMU Sensor Simulator

Figure 12:
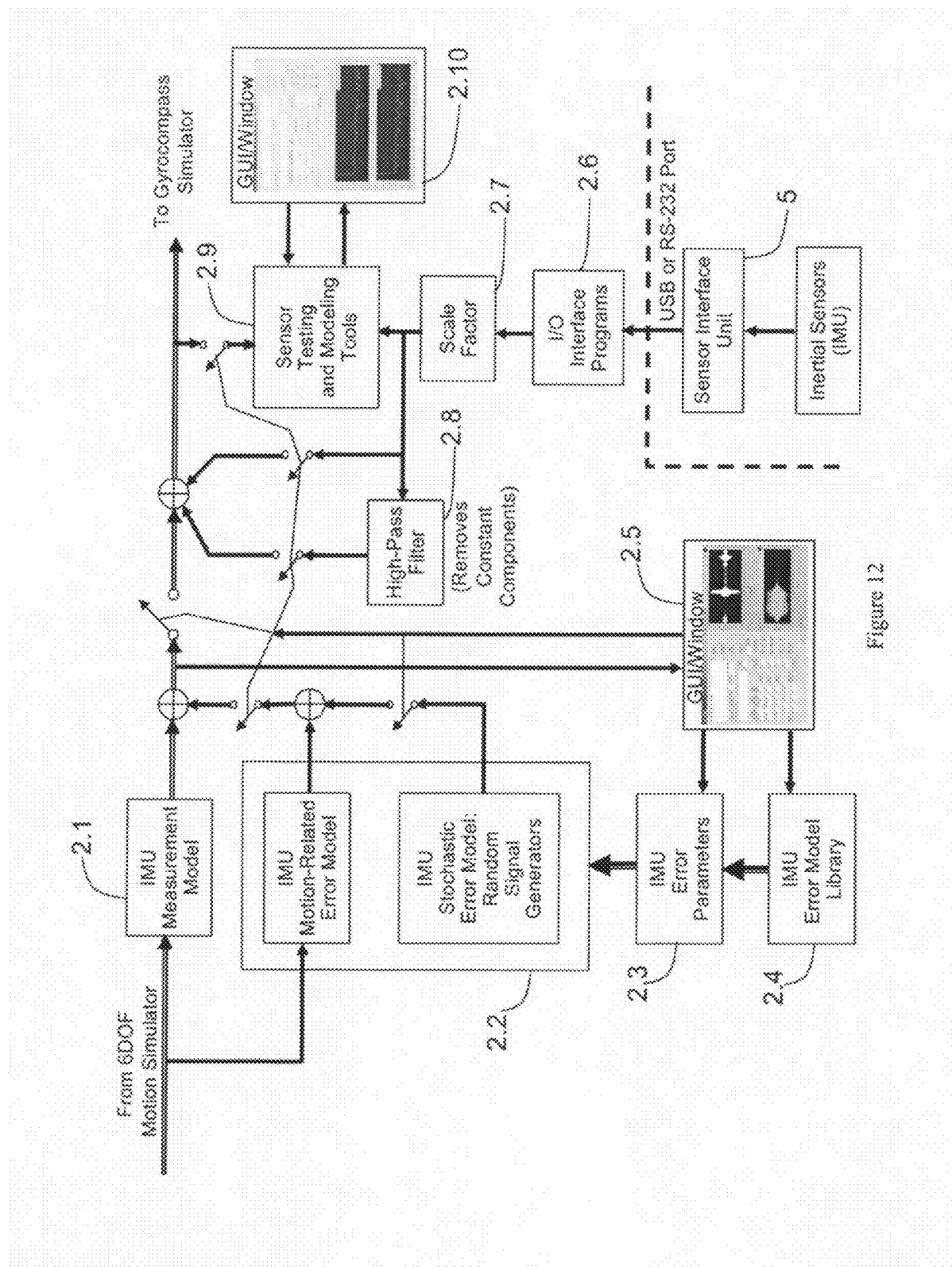
FIG. 12 is a block diagram showing the AGNC-2000RTIS IMU REALTIME SIMULATOR—IMU Simulator and Sensor Modeling Tools.

As depicted in FIG. 12, there are two GUI/windows in this software component. One GUI/window is used for IMU Sensor Simulator configuration control, sensor model selection, and parameter settings. The other GUI/window is used for Testing and Modeling Tools control, data collection and analysis configuration, and sensor test results visualization and display.

The GMSS includes a suite of Sensor Testing and Modeling Tools to provide hardware/sensors-in-the-loop simulation and modeling functions. Integrated with the IMU Sensor Simulator, the Testing and Modeling Tools are also used for fidelity evaluation and verification of the Sensor Simulator.

The IMU Sensor Simulator includes the following components:

Module IMU Measurement Model representing an ideal model of the general IMU.

Module IMU Motion-Related Error Model simulating the motion-related errors such as scale factor errors, axis misalignment errors, etc.

Module IMU Stochastic Error Model: Random Signal Generators generating random IMU and circuit errors, such as bias drift, noise, ADC quantization noise/errors, etc.

Module IMU Error Parameters is a temporary data storage in the software for saving selected IMU model type and parameters.

Module IMU Error Model Library is a database for predefined IMU models representing existing products, or for saving the IMU model parameters obtained from the Sensor Testing and Modeling Tools.

GUI/window for IMU sensor type and parameters selection.

Through the Sensor and Parameters Selection GUI/window, the user is able to emulate: Any Allan Variance Curve including quantization noise, angle random walk (ARW), correlated noise, sinusoidal noise, bias instability and rate random walk (RRW). The Sensor Selection and Parameters User Interface is able to accept inputs in terms of:

Generic stochastic model parameters

Measurement process parameters

Data acquisition parameters

The fidelity of the IMU Sensor Simulator is tested and verified by statistical analysis and compared to real IMU data which are collected and processed by the Sensor Testing and Modeling Tools. Rich experience of the AGNC-2000RTIS IMU REALTIME SIMULATOR is embedded in the patent for navigation system simulation and inertial sensor simulation.

IMU Measurement Models

Figure 13:
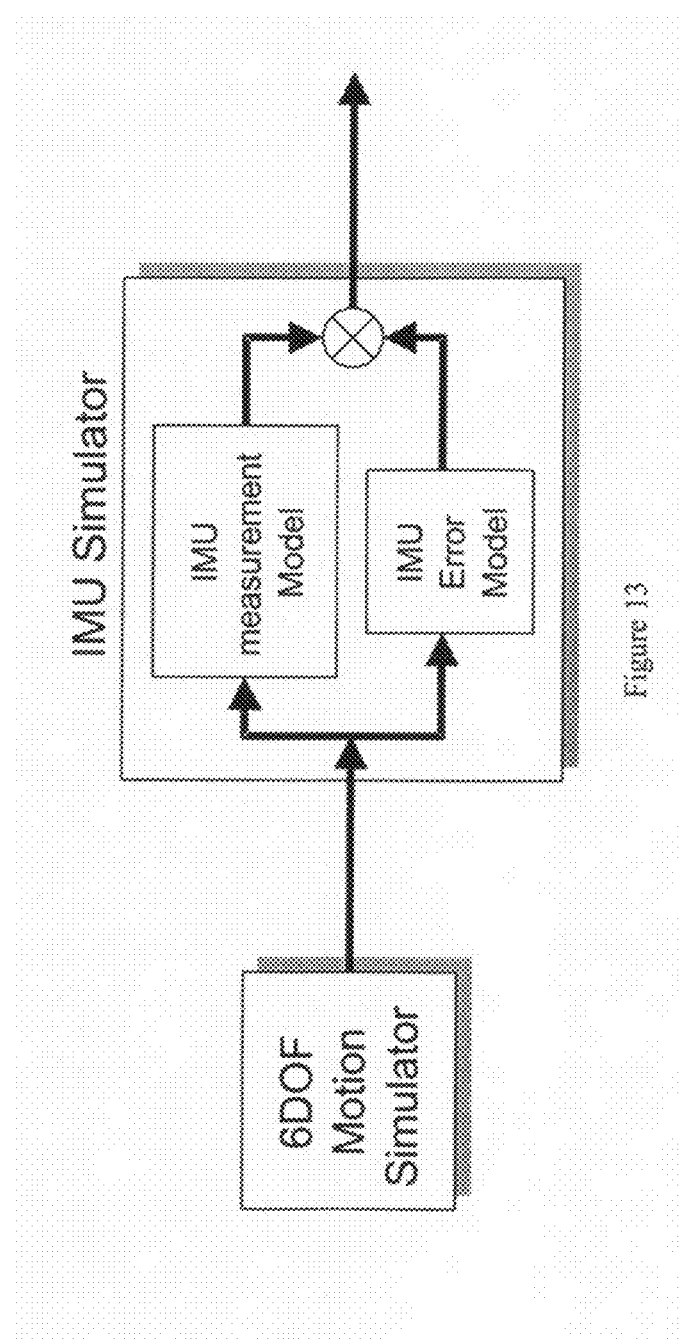
FIG. 13 is a block diagram showing the IMU Simulation Model.

Referring to FIG. 13, the IMU model is consists of two parts: measurement model and error model. An IMU outputs three axes angular rate and specific force or three axes angular rate increments and velocity increments, and the IMU measurement models describe the relationship between the ideal outputs of an IMU and the motion of the base on which the IMU is installed. For different trajectory reference frames, the IMU measurement models have different mathematical forms, such as in the ECIZ Frame, ECEF Frame or Navigation Frame. In our patent application, the Navigation Frame is used.

Gyro Measurement Model

Gyros in the IMU measure the angular velocity of the IMU with respect to the inertial coordinate frame expressed in the base/unit body coordinate system (denoted by B). Written in vector form, the ideal gyro outputs can be expressed as follows $$\omega_{out} = \omega_{ib}^b$$
$$= \omega_{nb}^b + \omega_{en}^b + \omega_{ie}^b$$
$$= C_n^b \omega_{nb}^n + C_n^b(\omega_{en}^n + \omega_{ie}^n)$$

where $\omega_{nb}^n$ is the angular velocity of the base/unit relative to the N frame. $\omega_{en}^n$ is the base/unit angular velocity induced by linear velocity because of the earth's shape. $\omega_{ie}^n$ is the earth rate expressed in the N frame. $C_n^b$ is the direction cosine matrix of the body (B) coordinate system with respect to the N frame. $\omega_{en}^n$ is related to the base/unit linear velocity and position and earth model parameters. For the gyrocompass simulation in this project, since the position and the earth shape's have very small effect to the gyrocompass processing, the simulation of $\omega_{en}^n$ can be simplified or ignored.

Accelerometer Measurement Model

Accelerometers in the IMU measure the specific force caused by the motion of the base/unit. The specific force consists of the gravitational acceleration and the base/unit acceleration with respect to the inertial space:

$$a_i = g + f$$

The acceleration with respect to the inertial space, $a_i$, can be expressed in the N system as $$a_i^n = \dot{V}^n + (\omega_{en}^n + 2\omega_{ie}^n) \times V^n + \omega_{ie}^n \times (\omega_{ie}^n \times R)$$

Defining $G = g - \omega_{ie}^n \times (\omega_{ie}^n \times R)$ we have $$f^n = -G + \dot{V}^n + (\omega_{en}^n + 2\omega_{ie}^n) \times V^n$$

and the outputs of the accelerometers can be written as $$f_{out} = f^b$$
$$= C_n^b f^n$$
$$= C_n^b(-G + \dot{V}^n + (\omega_{en}^n + 2\omega_{ie}^n) \times V^n)$$

In the above equation, G is the gravity model expressed in the N frame. In most inertial navigation systems, the direction of G is assumed to be identical with the $z_n$ axis of the N frame.

Gyro Error Model

An ideal gyro measures the angular rate of the base with respect to inertial space along its sensitive axis. The output of the ideal gyro is proportional to the input angular rate:

$$\omega_{out} = K_g \omega_{ib}$$

But in practice, the output of the gyro also contains a variety of errors. In general the static model of the gyro output can be given by $$\omega_{out} = K_g \omega_{ib} + \epsilon$$

where $\epsilon$ is the generalized gyro drift. There are at least three single degree-of-freedom gyros in an IMU. Their sensitive axes are aligned along three orthogonal directions, denoted x, y, and z.

Accelerometer Error Model

The generic error model of the accelerometer is similar to that of the gyro. The ideal accelerometer measures the specific force of the device motion with respect to inertial space in its sensitive axis direction and thus the output of the accelerometer is proportional to the specific force:

$$f_{out} = K_a f_{ib} = K_a(-G_{ib} + A_{ib})$$

where G is the gravitational acceleration and A is the acceleration caused by the motion of the base. But in practice, the output of the accelerometer also contains a variety of errors. In general the static model of the accelerometer can be given by $$f_{out} = K_a f_{ib} + \nabla$$

where $\nabla$ is the generalized accelerometer bias error.

The IMU Sensor Simulator receives motion data from the 6DOF motion trajectory simulator and generates IMU output data according to the IMU measurement models and error models defined by the user. The user interface (GUI) consists of several menus that enable the user to select and modify the configuration and parameters of the IMU simulation process. The user can fully define the error model of the gyros and accelerometers in the IMU. The error model can be selected from a predefined IMU product library or the user can set every error parameter via the error model menus.

An important feature of the sensor database/library is that it can be modified or edited by the user. That is, the user can input new products into the database, or delete a product, or modify the parameters of a product. The parameters of a product in the database can be displayed to the user for verification or modification. In the IMU simulator, in addition to a generic error model, a suite of special models are provided to meet the high fidelity simulation requirements.

Through the Sensor Selection and Parameters User Interface, the user is able to emulate: Any Allan Variance Curve including quantization noise, angle random walk (ARW), correlated noise, sinusoidal noise, bias instability and rate random walk (RRW). The Sensor Selection and Parameters User Interface is able to accept inputs in terms of:

A generic stochastic model parameter;

Measurement process parameters; and

Data acquisition parameters

The fidelity of the IMU Sensor Simulator is tested and verified by statistical analysis and compared to real IMU data. AGNC has rich experience in navigation system simulation and inertial sensor simulation. In this patent application, we utilize the existing AGNC-2000RTIS IMU REALTIME SIMULATOR to realize both motion generation and IMU simulation functions.

When the IMU Simulator GUI window is launched, all the system status is in the default values and the IMU simulator is not started. Click button "Start Simu" to start the IMU simulation processing. By default, the IMU is an ideal model, no error. Use the combo box to select a predefined IMU model and use the button "Load the Selected Para" to load the IMU error parameters into the IMU simulator. The user can change any of the parameters in the text boxes and the change will be automatically enabled immediately. The user can load an IMU model from a predefined library or input and/or change the parameters in real-time, as required. The "Clear IMU Err" button is used to set all errors to 0 and obtain an ideal IMU.

The basic IMU error components include bias, angle random walk, and velocity random walk. IMU error models are also able to accommodate more types of sensor errors, such as:

Pink noise or bias stability noise;

Red noise or rate random walk noise;

Temperature induced errors;

Sensor axis misalignment, and etc.

Referring to FIG. 12 and FIG. 13, the IMU simulator processing comprises following steps:

(a) receiving 6DOF motion data from the 6DOF motion simulator 1;

(b) receiving IMU error parameters 2.3 from the IMU GUI widow 2.5, or from the IMU error model library 2.4;

(c) producing ideal IMU output data using the corresponding IMU measurement model 2.1 and the 6DOF motion data;

(d) generating IMU motion-related error using the corresponding IMU error model 2.2 parameters and the 6DOF motion data; these error items include scale factor errors, sensor axis misalignment errors, and sensor dynamic errors, etc.;

(e) generating IMU stochastic errors using the corresponding IMU error model 2.2 parameters and the stochastic signal generators; these error items include white noise, random walk, quantization error, bias instability error, etc.;

(f) generating IMU temperature induced errors using the corresponding IMU error model 2.2 parameters;

(g) generating IMU periodic (oscillating or vibration) errors using the corresponding IMU 2.2 error model parameters;

(h) combining the ideal IMU output data and the all generated IMU error items to produce IMU output data; and (i) sending the produced IMU output data to gyrocompass simulator 3 through the communication link stream.

IMU Sensor Error Models in Vector Form

Considering the sensor axis misalignment error, the generic IMU models are represented by the following equations which are used in the GMSS for IMU simulation.

Gyro errors and simulation model:

$$\omega_{out} = (I + \Delta K^{gyro})B_{3\times3}^{gyro}\omega_{bi}^b + \varepsilon_0 + \varepsilon_{random} + \varepsilon_{vibr} + \varepsilon_{temp}$$
$$= (I + \Delta K^{gyro})(I + [\Delta\theta^{gyro}])\omega_{bi}^b + \varepsilon_0 + \varepsilon_{random} + \varepsilon_{vibr} + \varepsilon_{temp}$$

where

I is the unit matrix.

$\Delta K^{gyro}$ is the gyro scale factor error.

$\omega_{bi}^b$ is the ideal gyro output vector from the 6DOF simulator.

$\varepsilon_0$ is the uncompensated gyro bias or offset. It is simulated by a constant vector or random constant vector.

$\varepsilon_{random}$ is the random component of the gyro error. It is simulated by a sum of several stochastic signals.

$\varepsilon_{vibr}$ is the periodic (oscillating or vibration) component of the gyro error. It is simulated by sum of a suite of sin/cos signals, according to sensor PSD analysis.

$\varepsilon_{temp}$ is the temperature induced gyro error. According to sensor temperature testing, it can be simulated by an exponential function at the system start for temperature transient process and a random periodic function for balanced temperature.

The random component of the gyro error can be further expressed as a sum of several stochastic (noise) signals:

$$\varepsilon_{random} = \varepsilon_{Quan} + \varepsilon_{ARW} + \varepsilon_{Bins} + \varepsilon_{RRW}$$

where $\varepsilon_{Quan}$ is the quantization error, also called violet noise. It is simulated by differentiation of white noise.

$\varepsilon_{ARW}$ is the gyro angle random walk error. It is simulated by white noise.

$\varepsilon_{Bins}$ is the gyro bias instability error, also called pink noise. It is simulated by a shaping filter driven by white noise.

$\varepsilon_{RRW}$ is the gyro rate random walk error, also called red noise. It is simulated by integration of white noise.

Similarly, the accelerometer errors and simulation model are represented by:

$$f_{out} = (I + \Delta K^{accel})B_{3\times3}^{accel}f^b + \nabla_0 + \nabla_{random} + \nabla_{vibr} + \nabla_{temp}$$
$$= (I + \Delta K^{accel})(I + [\Delta\theta^{accel}])f^b + \nabla_0 + \nabla_{random} + \nabla_{vibr} + \nabla_{temp}$$

where

I is the unit matrix.

$\Delta K^{accel}$ is the accelerometer scale factor error.

$f^b$ is the ideal accelerometer output vector from the 6DOF simulator.

$\nabla_0$ is the uncompensated accelerometer bias or offset. It is simulated by a constant vector or random constant vector.

$\nabla_{random}$ is the random component of the accelerometer error. It is simulated by a sum of several stochastic signals.

$\nabla_{vibr}$ is the periodic (oscillating or vibration) component of the accelerometer error. It is simulated by the sum of a suite of sine/cosine signals, according to sensor PSD analysis.

$\nabla_{temp}$ is the temperature induced accelerometer error. According to sensor temperature testing, it can be simulated by an exponential function at the system start for the temperature transient process and a random periodic function for balanced temperature.

Similarly, the random component of the accelerometer error can be further expressed as a sum of several stochastic (noise) signals:

$$\nabla_{random} = \nabla_{Quan} + \nabla_{VRW} + \nabla_{Bins} + \nabla_{AARW}$$

where $\nabla_{Quan}$ is the quantization error, also called violet noise. It is simulated by differentiation of white noise.

$\nabla_{VRW}$ is the accelerometer velocity random walk error. It is simulated by white noise.

$\nabla_{Bins}$ is the accelerometer bias instability error, also called pink noise. It is simulated by a shaping filter driven by white noise.

$\nabla_{AARW}$ is the accelerometer acceleration random walk error, also called red noise.

It is simulated by integration of white noise.

From the above vector/matrix equations for IMU sensor error models we can see that it needs about 27 parameters to represent 3 gyros and 3 accelerometers error models, respectively. Totally, we need about 54 parameters in GMSS software to represent an IMU error model.

In the IMU simulator software, the user can (i) load an IMU model from a predefined library; (ii) input and/or change the parameters in real-time, as required, wherein the "Clear IMU Err" button is used to set all errors to 0 and obtain an ideal IMU; and (iii) save the user changed IMU model to the library for later use.

Only parts of the IMU parameters are represented in the GUI. To save the GUI area of the IMU simulator, the whole 54 parameters IMU model are operated by the user via a separate dialog window.

Figure 14:
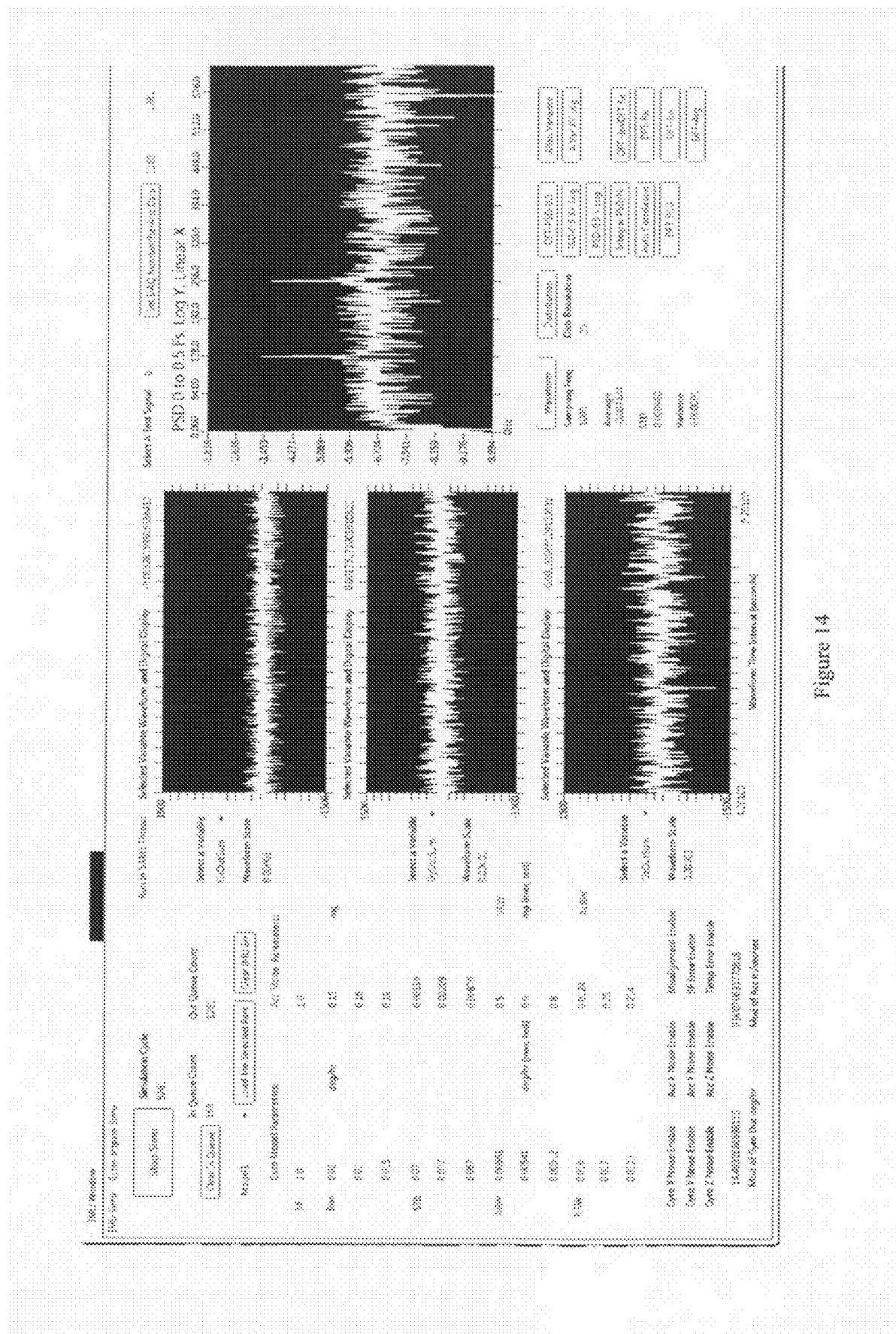
FIG. 14 is a software display showing the Updated IMU Simulator GUI Window.
Figure 15:
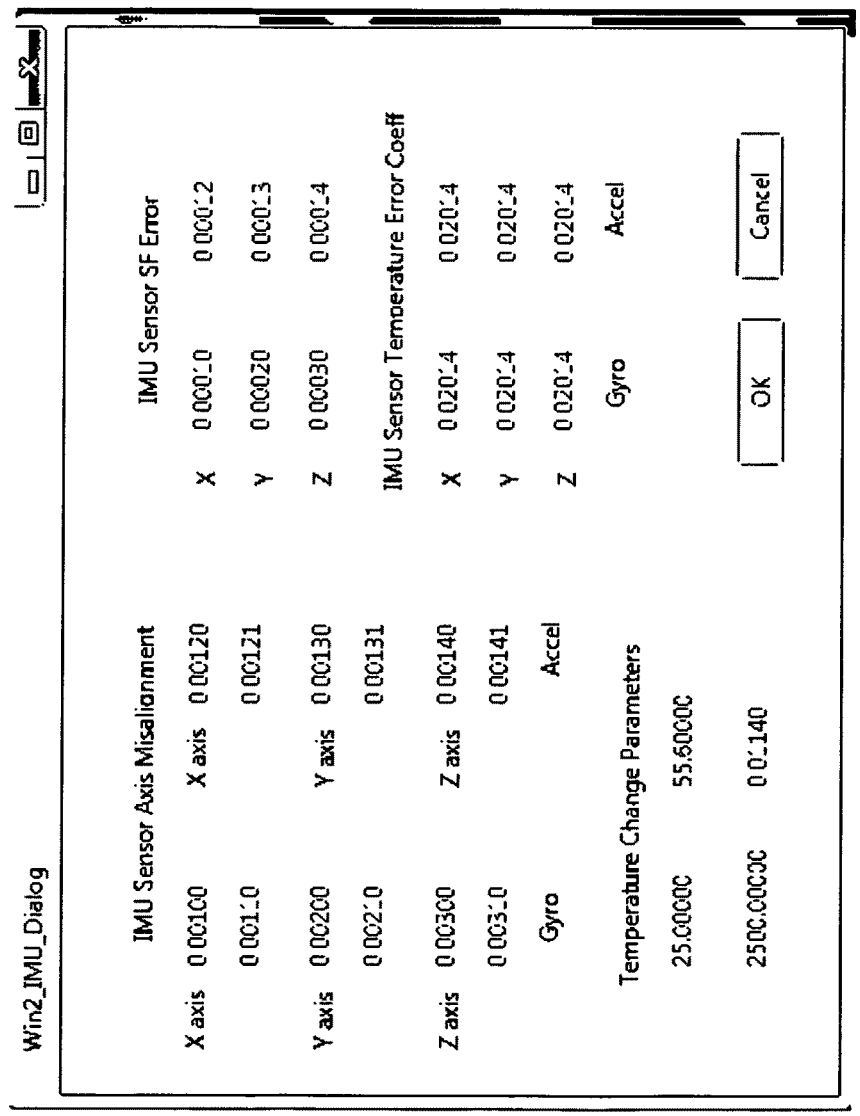
FIG. 15 is a software display showing the IMU Parameter Dialog Box.

Referring to FIG. 14 and FIG. 15, the major functions of the IMU Simulator GUI windows comprise the followings:

(1) Three real-time data waveform display canvases/oscilloscopes which can choose most of the inputs, outputs, and internal variables of the IMU simulator for view and display.

(2) One data waveform display canvas/oscilloscope which is used as a buffer to store and display the selected variable for analysis. These display canvases/oscilloscopes is auto scaled and also used by the stochastic analysis tools for displaying analysis results.

(3) A multi-channels signal composer for the user to set and produce different types of composed stochastic signals for IMU stochastic error simulation.

(4) Display and change of IMU stochastic parameters in the main IMU window.

(5) User setting of all other IMU parameters through a dialog window.

(6) Three real-time data digital displays which can choose most of the inputs, outputs, and internal variables of the IMU simulator for view and display.

(7) Enable/disable control of the IMU errors.

The IMU parameters which can be set by the user include:
IMU sensor axis misalignments.
Temperature change parameters.
IMU sensor temperature error coefficients.
Gyro sensors:
  Scale factor.
  Constant bias.
  Bias stability
  Angle random walk.
  Rate random walk.
Accelerometer sensors:
  Scale factor.
  Constant bias.
  Bias stability
  Velocity random walk.
  Acceleration random walk.

As shown in FIG. 15, the dialog box includes the following IMU parameters:
IMU sensor axis misalignments.
IMU sensor scale factor errors.
Temperature change parameters.
IMU sensor temperature error coefficients.

The GMSS also includes functions for hardware/sensors-in-the-loop simulation, real sensor data acquisition and modeling, and even real-time hardware/sensors-in-the-loop simulation. The hardware/sensors-in-the-loop simulation and modeling functions of the GMSS are provided by the following components:

Module Sensor Testing and Modeling Tools including a suite of generic statistical analysis tools, Allan Variance analysis tools, and FFT/PSD analysis tools, etc.

Module GUI/Window for Testing and Modeling Tools control, data collection and analysis configuration, and sensor test results visualization and display.

Module I/O Interface Programs for buffering and storage of real-time IMU data from the external real IMU.

Module Scale Factor converting IMU raw data to required metric values for Sensor Testing and Modeling Tools or simulator.

Module High-Pass Filter used for removing the constant components from the real IMU data, when the GMSS needs to perform a combined hardware/sensors-in-the-loop simulation.

Module Sensor Interface Unit used for signal and data protocols/formats conversion. It converts different signal specs and data protocols/formats from an IMU to the unified IMU data protocol/format. Thus, the GMSS interface needs not to be changed for different IMU products.

Figure 16:
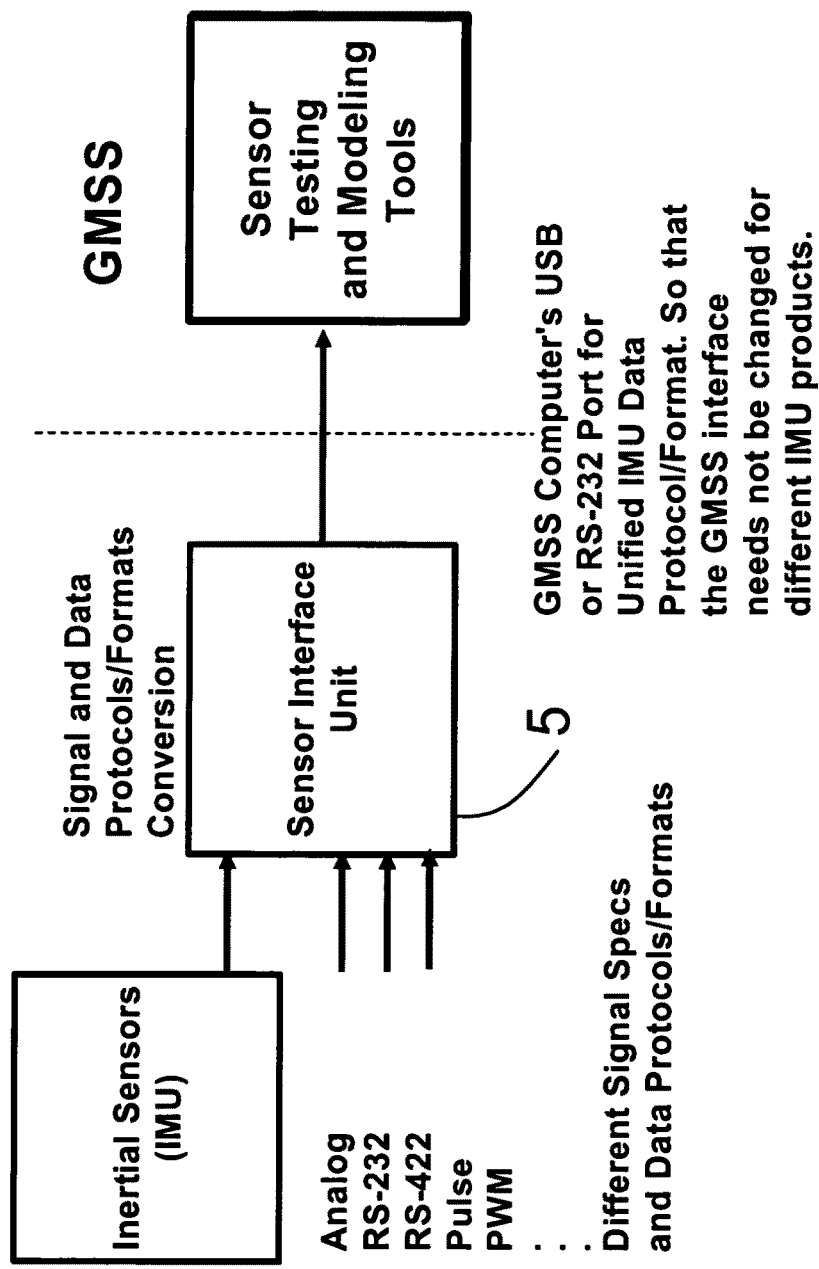
FIG. 16 is a block diagram showing the GMSS Hardware/Sensors-in-the-loop Functions.

FIG. 16 depicts the functions of the sensor interface unit which is used for GMSS hardware/sensors-in-the-loop simulation. The three functions of the GMSS for hardware/sensors-in-the-loop simulation include:

Real sensor data acquisition and modeling—Connecting a real IMU to GMSS, collecting its data, and obtaining its specification parameters using the GMSS's sensor Modeling Tools.

Hardware/sensors-in-the-loop simulation—Directly using collected IMU data for gyrocompass simulation.

Based on the GMSS computer's computation power, the IMU data from the real sensor unit can be directly sent to the gyrocompass simulator and a real-time hardware/sensors-in-the-loop simulation can be achieved.

With the hardware/sensors-in-the-loop simulation functions, the IMU data fed to the gyrocompass simulator are of three types:

Pure simulated IMU data.

Pure real-time IMU data. Easy for stationary base hardware/sensors-in-the-loop simulation. For a moving base, it is not easy to get a motion reference for evaluation of the simulated gyrocompass.

Combined IMU data. Uses real-time IMU data for its stochastic component and combines them with the simulated motion measurement data and simulated motion-related IMU errors.

Gyrocompass Simulator Module

Figure 17:
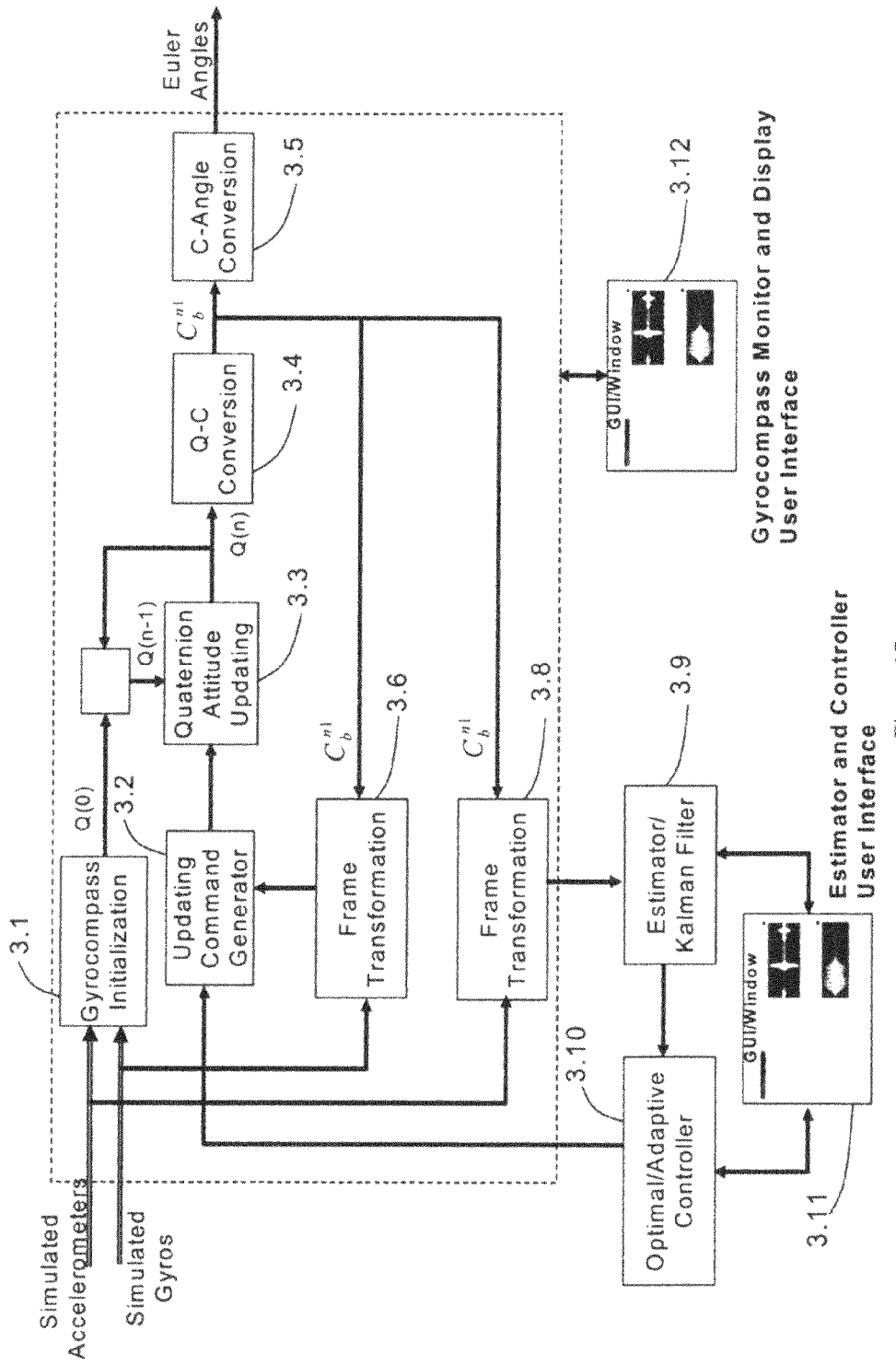
FIG. 17 is a block diagram showing the Gyrocompass Simulator Module Based on SAAAEMS System.

The Gyrocompass Simulator Module is the core for the GMSS system which is based on SAAAEMS. FIG. 17 is a block diagram of the gyrocompass simulator module to show its configuration. The gyrocompassing processing algorithms and models for both handheld and tripod units, as well as the system and sensor calibration procedures are utilized for realization of the gyrocompass system and calibration process simulator in GMSS.

In principle, the real algorithms and programs in any real gyrocompass can be utilized in the simulator. GMSS based on SAAAEMS is a suite of innovative gyrocompassing methods, implemented on a standard or simplified strapdown INS or an inertial measurement unit (IMU), as a gyrocompass or an azimuth and vertical angle measurement system. Gyrocompass and its technical concept (often called gyrocompassing) are not new, but in GMSS a suite of innovative system approaches, test and calibration methods, and signal processing algorithms are invented which make it a unique and outstanding gyrocompass system realization. The basic principle of gyrocompassing is based on the measurement of the earth's angular velocity vector and the local gravity force vector. In a platform gyrocompass system or a platform INS, the platform is stabilized by a gyro based closed-loop control system. By leveling a stabilized platform using the accelerometer outputs, the true heading of the platform can be obtained from the required command to the platform x and y axes, in order to cancel the effect of the earth's angular velocity. Equivalently, the earth's angular velocity is measured by the gyros on the leveled platform. In a strapdown inertial measurement system, as in a strap-down inertial navigation system (SINS) or the GMSS system, the inertial sensors are rigidly mounted onto the host system to measure the carrier motion directly. That is, rate gyros are used to measure the carrier angular velocity and accelerometers are used to measure the specific force (caused by carrier acceleration and gravity).

The GMSS system approach is based on measurement of the earth's angular velocity and local gravity. On the earth, measuring two physical vectors, the earth's angular velocity $\Omega$ and local gravity G, in a frame, such as in a sensor frame B, can determine the relative attitude between B and the local navigation frame, N, since the components of $\Omega$ and G in the N frame are known. In principle 2D measurements are adequate for gyrocompassing on a stationary base. The third component can be reconstructed under certain conditions.

In principle, a static and direct gyrocompassing (calculation) approach can use sensor outputs to obtain full attitude and true azimuth of the sensor unit (frame B). But in a practical system, this approach will be affected by base motion and sensor errors. A static direct gyrocompassing can only be effected on a stationary base. Motion disturbance and sensor errors must be small enough, or the base motion will affect system accuracy. For a tripod based application motion disturbance could be relatively small but still needs to be considered and processed. For practical handheld applications, because the base motion is a normal state and can be significant, a dynamic gyrocompassing approach must be used for motion isolation and sensor errors must be compensated as well. Therefore, in the GMSS system approach, the processing for the base motion and sensor errors is of fundamental importance for system performance.

In the GMSS system, gyrocompassing is used to determine the initial attitude of the IMU frame (it is in fact the GMSS unit's Body frame, called B frame) with respect to the navigation frame (N frame, the local geographic frame, adopted as the NED coordinate system). The mechanization of the INS is implemented in the navigation coordinate system (N). That is, the navigation solutions or parameters of the INS are referred to the N frame. The N frame is located at a point on the earth's surface. In order to define the N frame, a standard symmetric ellipsoid must be introduced. In the GMSS unit, the WGS-84 is adopted as the reference ellipsoid. Three Euler angles between the Navigation and the Body frame determine the body's attitude. They are the roll, pitch and heading angles.

The gyrocompassing realization for a strapdown inertial system in GMSS is based on the direct measurement of the local gravity vector G and the earth's angular velocity vector $\Omega$ in the sensor frame B. The physical (or mathematical) meaning of gyrocompassing is now even more obvious. That is, by measuring two constant physical vectors (G and $\Omega$) in two frames (N and B) the relative angular position between these two frames is determined. A more basic law behind this method is that the attitude of a rigid body (or a frame) can be fully determined by two fixed vectors (or straight lines) in the rigid body, as long as these two vectors are not identical in direction. This poses a limitation for the gyrocompassing application: the two physical vectors G and $\Omega$ must not be identical in direction. At the earth's poles G and $\Omega$ will be identical in direction and thus the gyrocompassing approach will fail and in a practical system the accuracy of the gyrocompass will deteriorate in the polar areas. The measurements of the local gravity vector G and the earth's angular velocity vector $\Omega$ in the B frame are carried out by gyros and accelerometers. In the N frame, however, the G and $\Omega$ vectors are known, as long as the local latitude is known (in practice, the latitude can be calculated from the outputs of gyros and accelerometers).

Considering an ideal situation of two ideal sensors and the GMSS unit is stationary on the ground, the G and $\Omega$ vectors expressed in the N frame are known. In the B frame, the G and $\Omega$ vectors are measured by the gyros and accelerometers respectively. The Direction Cosine Matrix (DCM) determines the B frame attitude with respect to the N frame. Thus, from the gyro and accelerometer outputs, the DCM, $C_n^b$, is obtained, and then the unit's elevation and azimuth angles are determined. There is redundancy in the gyro and accelerometer measurements. A third gyro and a third accelerometer are not necessary for the realization of a gyrocompassing approach. From the prior knowledge of the gravity G and earth rate $\Omega$, and the two sensor measurements, the third sensor measurement can be estimated. In principle, the 2 DOF sensor measurements of vectors G and $\Omega$ are adequate for realization of a strapdown gyrocompass.

A major function of the GMSS is to provide accurate elevation and azimuth angle measurements for a handheld or tripod-mounted pointing system. When the GMSS unit is rigidly mounted on or embedded into a pointing system, the measurement of the elevation and azimuth angles is equivalent to the attitude (including azimuth) determination of the GMSS unit (a rigid body). The GMSS attitude is mathematically expressed in three sets of parameters: Euler angles, direction cosine matrix (DCM), and quaternion. In the GMSS system, if any of the 3 attitude expressions is obtained, the other expressions can be calculated as well. The Euler angle attitude expression is not efficient for the system processing since it induces a lot of trigonometric functions computations and also has a singular point. Thus, the attitude is often expressed in the form of a direction cosine matrix (DCM) or quaternions. The quaternions yield another attitude expression between the B frame with respect to the N frame. Since the quaternions have only four parameters and no singular point, they are often used for attitude updating computation. The attitude updating algorithm is much more efficient than the other attitude expression methods.

In principle, there is a direct calculation from the sensor outputs to the unit's attitude. This is called a static processing approach, which is a straightforward application of the gyrocompassing principle. In a practical gyrocompass system, this static approach can not be used to calculate the unit's attitude angles because most times the assumed ideal conditions are not fulfilled. For example, in a real system, the sensors always have different kinds of errors and the gyrocompass unit may be in angular motion in order to track a moving target or point to a different target successively. In the direct calculation of the unit's attitude from the sensor outputs, the sensor errors and base motion interference will cause error to the calculation. In order to obtain a reasonably good attitude calculation, the sensor errors and base motion interference must be small enough compared to the useful components in the sensor outputs. Even with accurate enough sensors, the direct static approach is still unable to avoid interference caused by the base motion.

The angular motion restriction ($|\omega_{bn}^b| \ll \Omega = 15.04106864$ deg/hr=0.0417 deg/sec) is impractical for a real application. A very small angular motion will cause substantial attitude estimation errors. Often, a real or usable pointing system must undergo rotational motion in order to track a moving target or point to different targets successively. The translation acceleration motion restriction ($|a^b| \ll g=9.796527$ m/sec$^2$) may be a little easier for a pointing system to satisfy, because the gyrocompass unit itself does not make intentional translation accelerations. But the angular motion of the unit still causes translation acceleration for an accelerometer, as long as the sensor sensitivity center is not on the rotation base (carrier center). Therefore, there is a need for use of a kind of dynamic gyrocompassing approach which is able to eliminate the effects of base motion interference or reduce it to an acceptable level. The GMSS dynamic gyrocompassing processing algorithms thus incorporate: (i) base motion disturbance/interference-isolation and/or compensation (the base motion disturbance includes angular motion interference and translational acceleration interference) and (ii) sensor errors-calibration and/or compensation (the sensor errors include deterministic errors and random errors).

In a gimbaled gyrocompass or a platform INS, the angular velocity interference is isolated by gyro stabilization capability. In the strapdown gyrocompass, the angular velocity interference can be compensated in principle, because the accelerometers also contain the (redundant) angular information by sensing the gravity vector. In the GMSS approach a mathematical platform is introduced, and the base angular motion can be isolated, like a gyro-stabilized gimbaled platform. Thus, the gyrocompassing can be performed even during a base slew or rotation. In practice, the base angular motion is usually accompanied by linear (translational) acceleration, which will interfere with the gyrocompassing. To eliminate the acceleration interference, the accelerometer feedback control can be cut off from the gyrocompassing loop when motion is detected. Then the gyrocompassing actually becomes an inertial AHRS system which is tracking the angular moving base and meanwhile with the earth rate compensated.

FIG. 17 shows that as a simulator for the strapdown INS (inertial navigation system) based gyrocompass system, the basic configuration is a so-called mathematical platform which is realized through attitude updating and frame (coordinate system) transformation. Based on this mathematical platform, different types of estimators and controllers can be used (simulated) for the gyrocompass system. The generic mathematical model of the gyrocompass is briefly described as follows.

The attitude updating command is constructed as:

$$\omega_c = -\omega_{bm}^{n1} - [\Phi]\Omega^n - \epsilon^{n1} + \omega_{c1}$$

The gyrocompass attitude error model is:

$$\dot{\phi} = -[\Phi]\Omega^n - \varepsilon^{n1} + \omega_{c1} = [\Omega^n]\phi - \varepsilon^{n1} + \omega_{c1}$$

$$\text{where } \phi = \begin{bmatrix} \phi_x \\ \phi_y \\ \phi_z \end{bmatrix} \quad [\Phi] = \begin{bmatrix} 0 & \phi_z & -\phi_y \\ -\phi_z & 0 & \phi_x \\ \phi_y & -\phi_x & 0 \end{bmatrix} \text{ and}$$

$$\Omega^n = \begin{bmatrix} \Omega_x^n \\ \Omega_y^n \\ \Omega_z^n \end{bmatrix} = \begin{bmatrix} \Omega\cos\varphi \\ 0 \\ -\Omega\sin\varphi \end{bmatrix} \quad [\Omega^n] = \begin{bmatrix} 0 & \Omega_z^n & -\Omega_y^n \\ -\Omega_z^n & 0 & \Omega_x^n \\ \Omega_y^n & -\Omega_x^n & 0 \end{bmatrix}.$$

In the above equation, $\epsilon^{n1}$ is the generalized gyro error resolved in the mathematical platform frame N1.

This system dynamic error model reveals the relationship between the control command $\omega_{c1}$ and the $C_b^n(t)$ estimate error $\phi$. It indicates that $\omega_{c1}$ can directly control the error $\phi$. Re-written in component form, it becomes:

$$\dot{\phi}_x = -\Omega \sin\varphi\phi_y + \omega_{c1x} - \epsilon_x^{n1}$$

$$\dot{\phi}_y = \Omega \sin\varphi\phi_x + \Omega \cos\varphi\phi_z + \omega_{c1y} - \epsilon_y^{n1}$$

$$\dot{\phi}_z = -\Omega \cos\varphi\phi_y + \omega_{c1z} - \epsilon_z^{n1}$$

In order to control the error and let it converge to 0 ($\phi \to 0$), the error $\phi$ must be measured or observed. This is the basis for a closed-loop (feedback) control system.

In a gyrocompass system, gyros and accelerometers are the only information source, and the observation of the error $\phi$ has to be obtained from them. In practice, there are always sensor errors and most time base motion interference. For a target location system used for moving target tracking, the gyro outputs can not be used for observation construction. The gyro outputs are used for angular motion tracking, instead (construction of command $\omega_c$). Only the accelerometer outputs can be used for $\phi$ estimation. The accelerometer outputs based system error observation model is:

$$\Delta f_{ox} = g\phi_y + a_x^{n1} + \nabla_x^{n1}$$

$$\Delta f_{oy} = -g\phi_x + a_y^{n1} + \nabla_y^{n1}$$

where $a_x^{n1}$, $a_y^{n1}$ are the base (unit) linear/translational accelerations interference; $\nabla_x^{n1}$, $\nabla_y^{n1}$ are the generalized accelerometer errors resolved in the N1 frame.

A linear time-unvarying system model for the gyrocompass processing is:

$$\dot{\phi} = [\Omega^n]\phi - \epsilon^{n1} + \omega_{c1} \text{ system error dynamic model}$$

$$\Delta f_{ox} = g\phi_y + a_x^{n1} + \nabla_x^{n1}$$

$$\Delta f_{ox} = -g\phi_x + a_y^{n1} + \nabla_y^{n1} \text{ system observation model.}$$

Based on this model, we are able to utilize a series of advanced system control and estimation approaches, such as Kalman filtering, optimal estimation, stochastic system control, etc.

There are different types of strapdown IMU based gyrocompass systems. In this patent application, the Gyrocompass Simulator Module can simulate the following types of gyrocompass simulators:

The simulator of AGNC's Self-Calibrated Azimuth and Attitude Accuracy Enhancing Method and System (SAAAEMS). This gyrocompass system has 2 axis DTG gyro sensors, a MEMS gyro, and two accelerometers. It automatically switches its operation mode according to different conditions.

The simulator of a generic strapdown IMU based gyrocompass. It has three gyro sensors, and three accelerometer sensors.

The simulator of a static gyrocompass. This kind of gyrocompass is often used to evaluate the sensor accuracy at the system level.

The simulator of a tripod mounted strapdown gyrocompass.

The gyrocompassing processing algorithms and models for both handheld and tripod units, and system and sensor calibration procedures in the applicant's SAAAEMS system are utilized for realization of the gyrocompass system and calibration process simulator in GMSS. With the user definable 6DOF motion simulator and IMU simulator, the gyrocompass simulation is able to emulate not just the gyrocompassing function but also the attitude error variations when subjected to other motions—such as a soldier walking into a building, etc. The gyrocompass simulation is able to test various kinds of optimal filtering techniques for gyrocompassing—including a Kalman Filter or any other Bayesian estimator.

Figure 18:
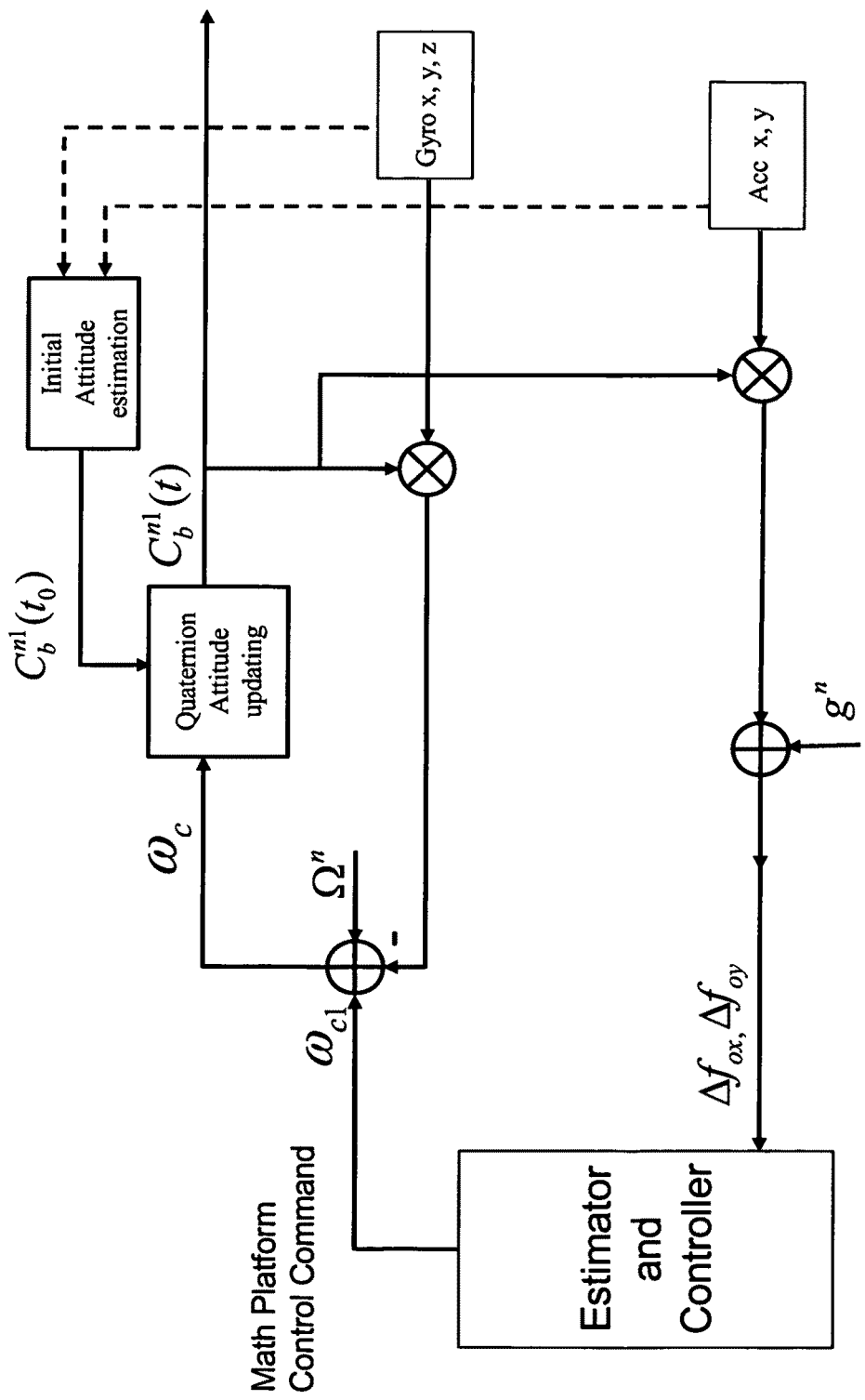
FIG. 18 is a block diagram showing the Establishment of the Mathematical Platform (frame N1).

Referring to FIG. 17 and FIG. 18, the process of the gyrocompass simulation is a closed-loop process and it is iterating in time for a computer software implementation, which comprises the steps of:

(a) receiving the IMU output data from the IMU simulator module 2, which include the simulated gyro output data and the simulated accelerometer output data;

(b) estimating an approximation of gyrocompass attitude using the IMU output data and the selected coarse initialization/alignment algorithms 3.1;

(c) initializing the gyrocompass attitude quaternion in module 3.3 and the DCM representation with the estimated coarse alignment attitude;

(d) converting the gyro input from the body frame to the mathematical platform frame by module 3.6 using the current DCM;

(e) forming the attitude updating command in module 3.2 using the converted gyro input and the current gyrocompass control output (for first iteration its initial zero value);

(f) updating the gyrocompass attitude in module 3.3 using the updating command and the quaternion attitude updating algorithms to get the quaternion representation of the gyrocompass attitude;

(g) converting the quaternion representation of the gyrocompass attitude into the DCM representation of the gyrocompass attitude by module 3.4;

(h) converting the DCM representation of the gyrocompass attitude into the Euler angle representation of the gyrocompass attitude by module 3.5, as the system output to the user;

(i) converting the accelerometer output data from the body frame to the mathematical platform frame by module 3.8 using the current DCM;

(j) producing an estimation of the gyrocompass attitude error using the user selected estimator or Kalman filter 3.9 and the converted accelerometer output data;

(k) generating attitude control command using the user selected optimal or adaptive controller 3.10 and the estimated attitude error;

(l) feeding back the generated attitude control command to the updating command generator 3.2 to form the next attitude updating command; and (m) going back to step (d) and the process will iterated until the simulation is stopped by the user.

The gyrocompass simulator is realized and advanced estimator and filters are added. The gyrocompass simulator functions include:

A coarse initial alignment module. When the gyrocompass unit is stationary, this module can get an initial attitude and heading, and also local latitude. This method is very sensitive to both acceleration disturbances and angular disturbances. In addition, IMU sensor errors also cause errors in estimate.

Motion and/or IMU sensor error detection methods are used to aid the coarse initial alignment.

In the dynamic gyrocompass simulator module, a mathematical (or virtual) platform is established to isolate the angular motion of the base and provide a set of linear gyrocompass error models for construction of the estimators and (Kalman and or adaptive) filters.

Based on the linear gyrocompass error models, we can perform many tests to verify the correctness of the programs and investigate the characteristics of the gyrocompass.

We can intentionally add initial errors to the gyrocompass. If selecting the open loop mode, the error is kept constant, but can be observed through accelerometer outputs resolved in the virtual platform. In the open loop mode both angular and linear motion can not affect the gyrocompass, but initial errors and sensor errors can.

The gyrocompass simulator functions include a coarse initial alignment module. When the gyrocompass unit is stationary, this module can get an initial attitude and heading, and also local latitude. This method is very sensitive to both acceleration disturbances and angular disturbances. In addition, IMU sensor errors also cause estimate errors. Motion and/or IMU sensor error detection methods are used to aid the coarse initial alignment.

In the dynamic gyrocompass simulator module, a mathematical (or virtual) platform is established to isolate the angular motion of the base and provide a set of linear gyrocompass error models for structure and use by the estimators and (Kalman and or adaptive) filters. Based on the linear gyrocompass error models, we can perform many tests to verify the correctness of the programs and investigate the characteristics of the gyrocompass.

In the gyrocompass simulator, a so-called mathematical (virtual) platform is introduced, which is "stabilized" and "converges" to the N frame, and thus the angular velocity interference is compensated/isolated, as depicted in FIG. 18.

The establishment of a mathematical platform also provides inertial attitude estimation which can purely depend on gyro measurements in a short period. Accelerometer data is used to correct the accumulated vertical attitude error caused by gyro error. The transformed accelerometer outputs in the N1 frame are used as the error measurements. This gyrocompassing error system model is fully controllable and observable (when the system is not at the earth's poles).

If used on a moving base, the transformed gyro outputs can not be directly used as error measurements. Thus, angular motion interference does not appear in the error model. This means the base angular motion interference is isolated or compensated by the mathematical platform.

To verify the correctness of the software of the gyrocompass simulation, as an example, GMSS uses a simple control method for the gyrocompass processing by using the classic feedback control method. Since it is similar to a platform INS, the traditional INS gyrocompassing control algorithms can be readily used. Usually, the classic feedback control method includes two parts:

In the level (X, Y) channels, use accelerometer feedback Y and proportional-integral (PI) algorithms to construct a feedback control system, letting the mathematical platform to be leveled. In the X Y closed-loop mode, we can re-initialize and run gyrocompassing and control the attitude errors to 0, but the operation will be very sensitive to base acceleration disturbance. In this ideal experiment, we set the X Y feedback gain to 1, which is very large compared to that in a real system.

Then, after the (X, Y) channels are leveled, the command to the Y/east channel can be used to estimate the heading error. And then, construct a feedback control for the Z channel, letting the heading error reduce to zero (or to a small value determined by uncompensated sensor errors). If we feed back this error to the Z/heading channel, the heading error can be controlled to 0. This is not a practical method, if there is acceleration motion disturbance or sensor errors.

The X and Y channels are controlled by feeding back the low-pass filtered $\Delta f_{ox}$ and $\Delta f_{oy}$ with a proper scale factor. The Z channel is controlled by a simple proportional feedback of $\omega_{c1y}$.

According to the equation $\dot{\phi}_y = \Omega \sin\phi\phi_x + \Omega \cos\phi\phi_z + \omega_{c1y} - \epsilon_y^{n1}$, after the X and Y channels are in the steady state, it is approximately true that:

$$0 = \Omega \cos\phi\phi_z + \omega_{c1y} - \epsilon_y^{n1}$$

or $$\omega_{c1y} = -\Omega \cos\phi\phi_z + \epsilon_y^{n1}$$

That is, the steady state $\omega_{c1y}$ contains the information of the azimuth error $\phi_z$. We can use $\omega_{c1y}$ to estimate the azimuth error or use it to control the azimuth error $\phi_z$ to zero (under ideal condition).

In the tests, $\omega_{c1y}$ can also be used to determine the operation status of the closed-loop control gyrocompass system, for example to detect base acceleration disturbance and to determine if the X and Y channels are in steady state.

In practice, however, $\omega_{c1y}$ is affected by gyro drift, gyro noise, accelerometer noise, and base acceleration disturbance. Thus, optimal estimation and stochastic control methods are expected to work better than simple classic control methods.

According to basic principles related to the steady state accuracy of gyrocompassing, the vertical and azimuth angle errors can be approximately estimated as:

$$\Delta\phi_{x,y} = \frac{\nabla}{g}$$

$$\Delta\phi_z = \frac{\varepsilon}{\Omega\cos\varphi} + tg\varphi\frac{\nabla}{g} \approx \frac{\varepsilon}{\Omega\cos\varphi}$$

where,
$\nabla$—Uncompensated Accelerometer bias.
$\varepsilon$—Uncompensated Gyro bias drift.
g—Gravity.
$\Omega$—Earth rate, 15.04106864 deg/hr.
$\phi$—Local latitude.

After verification of the simulation model, our next goal is to use the Kalman Filter for gyrocompass processing. Written in standard linear system form, the gyrocompass error model is expressed as:

$$\dot{x} = Ax + Bu + W$$

$$y = Cx + V$$

$$x = \begin{bmatrix} \phi_x \\ \phi_y \\ \phi_z \end{bmatrix}$$

$$u = \begin{bmatrix} \omega_{c1x} \\ \omega_{c1y} \\ \omega_{c1z} \end{bmatrix}$$

$$y = \begin{bmatrix} \Delta f_{ox} \\ \Delta f_{oy} \end{bmatrix}$$

Figure 19:
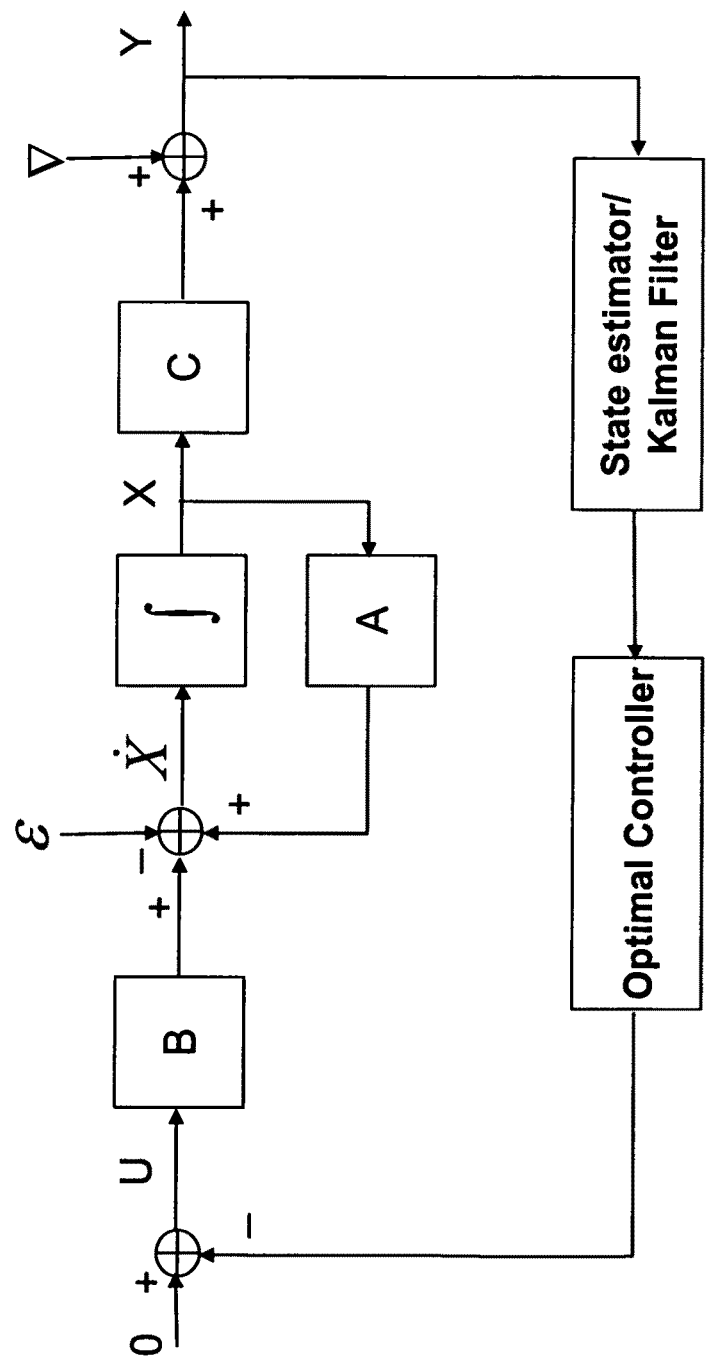
FIG. 19 is a block diagram showing the Optimal Stochastic Control Method.

The dimensions of the system can be augmented by modeling of sensor errors. Based on this model, we are able to utilize a series of advanced system control and estimation approaches. The optimal stochastic control method includes two parts: a Kalman filter for optimal estimate of the error state, and an optimal linear state feedback controller to drive the error states to converge to zero (or practically to a small value determined by uncompensated sensor errors), as depicted in FIG. 19.

The advantages of the optimal stochastic control method include: a full use of the system information, better dynamic performance, higher accuracy and computerized design procedure. But it needs accurate system and error models, uses a complex algorithm, and induces a heavy computation load, especially when the error states are augmented to a higher dimension.

Figure 20:
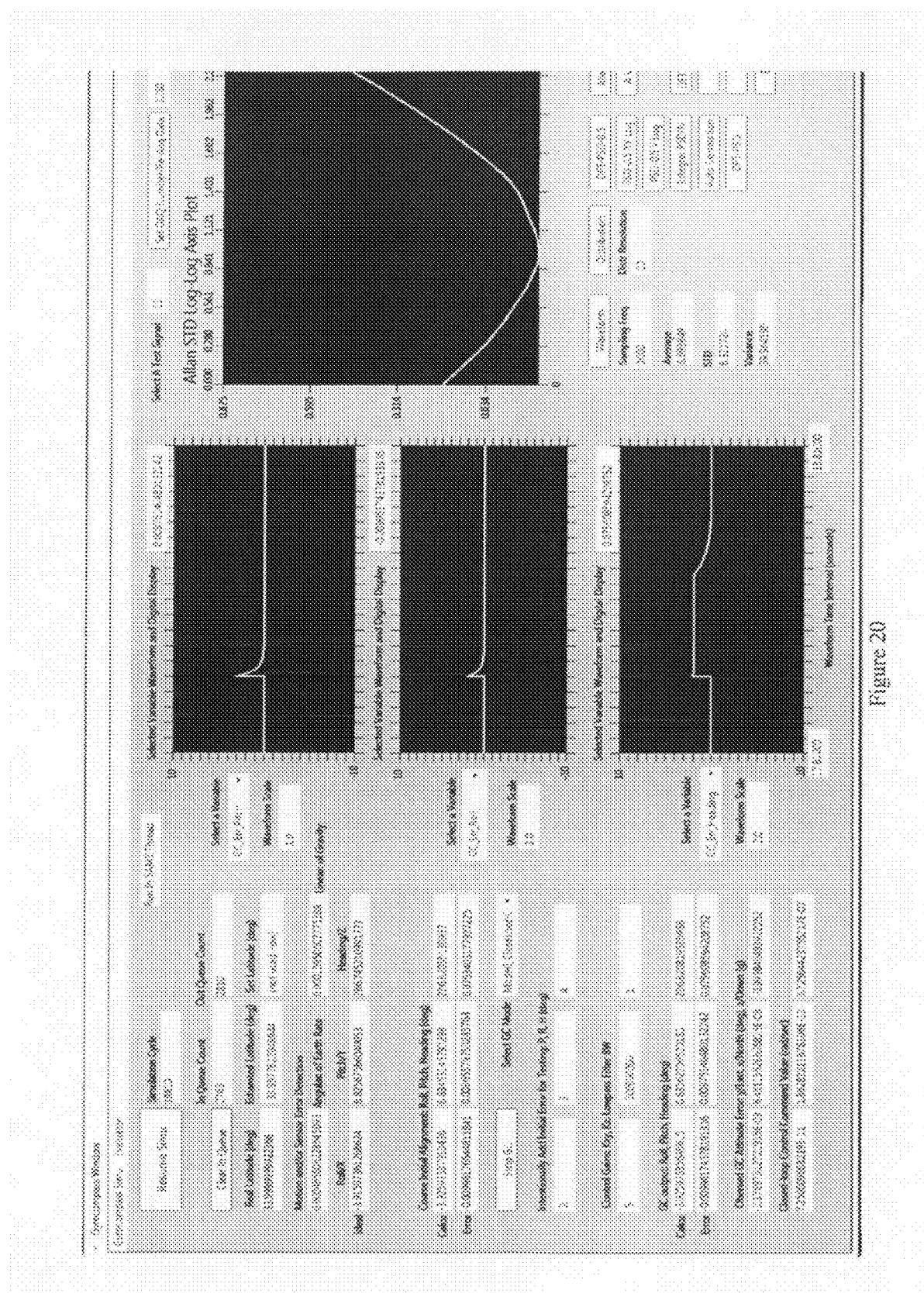
FIG. 20 is a software display showing the Updated Gyrocompass Simulator GUI Window.
Figure 21:
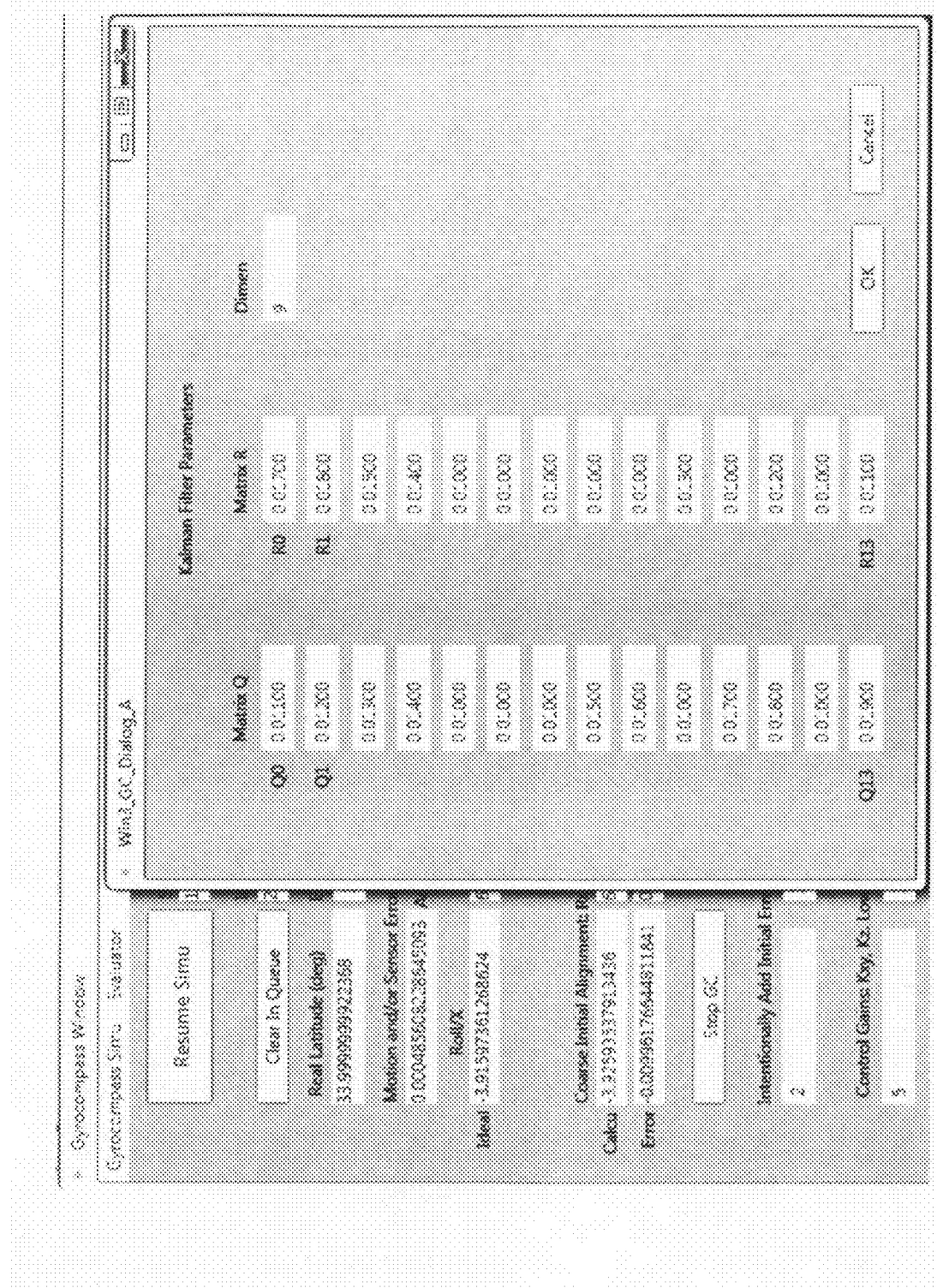
FIG. 21 is a software display showing the Gyrocompass Parameter Dialog Box.

Referring to FIG. 20 and FIG. 21, the functions of the gyrocompass simulator with its GUI window include:

(1) User control simulation process by selection of estimator and controller;
(2) A coarse initial alignment module.
(3) Motion and/or IMU sensor error detection methods are used to aid the coarse initial alignment.
(4) In the dynamic gyrocompass simulator module, a mathematical (or virtual) platform is established to isolate the angular motion of the base and provide a set of linear gyrocompass error models for construction of the optimal estimators or (Kalman and/or adaptive) filters.
(5) Based on the linear gyrocompass error models, we can perform many tests to verify the correctness of the programs and investigate the characteristics of the gyrocompass.
(6) Then use the optimal estimators or (Kalman and/or adaptive) filters for fine gyrocompassing process.
(7) User definition of the parameters of the Kalman filter and controller through a dedicated dialog window.

As shown in FIG. 21, the dialog box includes the following gyrocompass Kalman Filter parameters:
The order/dimension of the filter.
Q matrix parameters.
R matrix parameters.
More parameters can be added with the augmentation of the filter.

GMSS constitutes an innovative gyrocompassing system encompassed by a suite of system approaches, test and calibration methods and signal processing algorithms. The GMSS innovative gyrocompassing method can be implemented on a standard or simplified strapdown inertial navigation system (INS) as a gyrocompass or azimuth and vertical angle measurement system. In practical use, the system works in two modes: (i) the gyrocompassing mode used for system initialization and re-calibration when the GMSS unit is stationary or aiming at a stationary target and (ii) the inertial AHRS mode used to provide azimuth and attitude of the targeting system unit when the system is in motion or is tracking a moving target. Intelligent algorithms detect and determine the system motion state and automatically switch the GMSS system between the two working modes, accordingly.

In principle, the algorithms and programs of any gyrocompass can be utilized in the simulator. Though a real gyrocompass is usually implemented in an embedded computer system, often using microcontroller or DSP, its computation programs are usually written in a high level language, such as C/C++. The SAAAEMS system programs are written in C/C++/C#, so that the gyrocompass simulator and calibration procedures in the embedded gyrocompass computer can be utilized with the GMSS system computer.

From the viewpoint of programming, there are two major aspects for the GMSS software, user interface for display and simulation control and background data processing. The C# language and .net framework provide a powerful development environment for object-oriented and component-based realization of the GMSS software system. For the user interface, a suite of reusable modules/components/controls is devised. For the background data processing, a suite of foundation classes is devised.

The foundation classes are used to represent fundamental mathematical objects in the GMSS and to realize most of the basic data processing and computations for the simulation system. Examples of fundamental mathematical objects include:

3-dimensional (3D) vector, used to represent motion in the 3D space, such as velocity, acceleration, angular velocity, angular acceleration, position, etc.

4-dimensional quaternions, used to represent angular position and angular motion.

Direction cosine matrix (DCM), used to represent transformations of 3D vectors between different coordinate systems.

N-dimensional vector, n×n matrix, and n×m matrix, used to represent high order system state variables and computation in system modeling, filtering and control.

The C# language allows the programmer to realize user-defined classes and to overload operators for defining operations on the class-produced objects and operations between different types of objects produced by different classes. In the realization of an algorithm, the classes are then used to create mathematical objects. Because of operator overloading, the program sentences will look like regular mathematical equations. This leads to a very simple and elegant programming style and increases coding efficiency. And, because most of the computations are defined inside classes, it facilitates code reusability and maintainability. More classes can be defined and used according to the programming and computation requirements.

In GMSS, some function modules are needed in several or more than one places, such as the real time (or quasi real time) waveform display module used in every GMSS component to let the user to check and view the selected data variables and simulation results. In programming practice, it is more efficient to make this user interface module a separate and reusable module. The following is a list of reusable modules used in the GMSS software. These modules are reusable and they greatly enhance the modularization, maintainability, and reliability of the simulation system.

- The real time waveform display module. It receives a selected stream of multi-dimensional time series data and displays multiple waveforms in a GUI window.
- The PSD processing and display module. It receives an array of time series data, performs FFT processing, and then displays the PSD curve in a GUI window.
- The Allan Variance (AV) processing and display module. It receives an array of time series data, performs AV processing, and then displays the AV curve in a GUI window, with user defined control parameters.
- The generic statistical processing module. It receives a selected stream of multi-dimensional time series data, performs statistical processing and displays the statistical parameter results, such as average, STD, correlation coefficients etc.
- The generic random signal generation module. It is controlled by the user input settings to generate a time series of a stochastic process. The stochastic process type (such as white noise, pink noise, or red noise, etc.) and process parameters determined by the user inputs.

The system user interface is used to select different predefined gyrocompass systems and their configuration. External optimal estimator/controller design tools may be employed for design of gyrocompass controllers, filters, and estimators. There are different types of strapdown IMU based gyrocompass systems.

Gyrocompass System Evaluation and Analysis Module

The system evaluation and analysis module is used to obtain the system accuracy under the current system setting and display and present simulation results in proper visualization format. It has three parts:

Data storage module; saves user selected variables for analysis and display.
Error analysis model; produces system performance criteria.
User interface and Data display module; for control of data storage and display.

The system evaluation and analysis module will record the time history of the GMSS data stream. The data storage module automatically records the GMSS data stream in a file at every test session. The saved data files are then used for Error analysis and Data display.

The Error analysis model compares the corresponding data items, and runs a suite of defined algorithms to obtain the gyrocompass system performance criteria. The User interface and Data display module has a user interface window for displaying the GMSS data stream and presenting simulation results in the proper visualization format for the GMSS user.

The GMSS has a Display and Data Presentation User Interface which enable us to have customer buy-in on any human interfaces—Be it display of system performance or input of parameters. Though the Display and Data Presentation User Interface the user is able to pull up any subsystem state values as well (For example covariance and state variable performance of a Kalman Filter).

In the system evaluation and analysis module, the GMSS data stream contains all the needed information of the whole simulation system. Comparing the 6DOF motion simulator generated unit/base attitude and azimuth with the gyrocompass simulator generated estimated attitude and azimuth, the system evaluation and analysis module obtains three time sequences to represent the gyrocompass system errors:

Elevation/pitch angle error as a function of time
Azimuth/heading angle error as a function of time
Roll angle error as a function of time Using these error functions of time as the inputs, the system evaluation and analysis module has a set of analysis and statistical algorithms to calculate the error parameters, such as:

Dynamic angle error parameters
Steady state angle error parameters
Time delay parameters of the gyrocompass
Convergence time/speed of the gyrocompass during initialization and/or after motion disturbance.
Average error parameters
Stochastic error parameters caused by (related to) sensor noise or random motion disturbance or vibration.

In a practical gyrocompass system, the system performance and accuracy represented by the above error parameters are affected by many factors, such as sensor errors, the efficiency of system algorithms, and base motion disturbance or vibration. In a practical gyrocompass system, these factors often can not be separately controlled, but in GMSS they can be easily separated and controlled to investigate their individual effects to the system performance. By repeatedly carrying out test sessions under controlled conditions, the user is able to evaluate the performance of a certain system design under the predefined conditions and/or to reveal the relationships between the system performance and any factors of interest, such as:

To investigate the relationship between the system accuracy and the different sensor error parameters.
To investigate the system accuracy under the influence of base angular velocity and linear acceleration interference.
To investigate the system accuracy under the influence of random motion disturbance or vibration.
Test of the gyrocompass algorithms, such as Kalman filter and the stochastic control system design for the gyrocompass.
To investigate the different gyrocompass algorithms under certain base motion conditions for comparison of their performance.

The different combinations of the controllable conditions and factors in GMSS provide a powerful evaluation and analysis tool for the design and development of the gyrocompass systems.

If GMSS is in the system calibration simulation mode, the system evaluation and analysis module compares the real (predefined) gyro and accelerometer biases and scale factors with the identified parameters to evaluate the performance of the gyrocompass's calibration procedure and algorithms, such as:

To determine if the motion conditions and the calibration algorithms make it sufficient to identify the sensor error parameters, that is, observability determination.

If the error parameters are observable, the convergence time/speed of the calibration algorithms.

The average steady state estimation errors.

Standard deviation of the estimation errors caused by sensor noise or random motion disturbance or vibration.

The system calibration simulation mode of GMSS provides a very convenient and powerful tool for the evaluation of the different calibration procedures design for the gyrocompass systems.

After GMSS is completed and its components are tested and verified, a natural question is whether the simulation is a correct and accurate simulation of the real gyrocompass system. That is, the fidelity of GMSS must be validated and verified before it can be delivered to the user. The applicant, AGNC, has rich experience in the simulation system fidelity validation and verification. In this patent application, several convenient and effective approaches are used for the GMSS fidelity tests. The SAAAEMS system is used for modeling and simulation fidelity validation and verification of GMSS.

First, a whole GMSS system integrity and consistency test is performed. For this test, all sensor errors are set to zero and an ideal gyrocompass system is achieved. Theoretically, under this condition, the gyrocompass simulator generated estimated attitude and azimuth should be equal to the 6DOF motion simulator generated unit/base attitude and azimuth, under any base motion conditions. If there are errors, they should be very small, which is caused by the computation errors and dynamic errors when the motion changes are large.

If there are unexpected large errors, there must be some algorithm or program errors in the simulation system. After the algorithm or program errors are debugged and removed, different types of high dynamic angular and linear motions are simulated to verify the dynamic computation errors of the whole GMSS system. The dynamic computation error may be caused by a too low data sample rate, gyrocompass algorithm errors, and inadequate accuracy of discrete computation algorithms. Usually the total computation error of any verified variable is controlled to under $10^{-4}$ of the variable's maximum range.

After the whole GMSS integrity and consistence test is passed, the GMSS's modules are tested separately and/or together for its fidelity verification. That is, to verify if GMSS is a close or accurate simulation of the real system it intends to simulate.

The fidelity of the 6DOF simulation is verified by checking if the simulated data follow the designed kinematic and dynamic constrains. The motion simulation uses integration to realize the kinematic and dynamic constrains. A simple verification method is to use a reverse differentiating method. For example, differentiate the simulated angle to get the angular velocity to see if it is equal to the simulated angular velocity; differentiate the simulated velocity to get the acceleration to see if it is equal to the simulated acceleration, etc. Proper coordinate transformations is used if the vectors are presented in different frames.

Theoretically, the fidelity of the IMU simulator is determined by comparing the data of the IMU simulator with the data of a real IMU that the IMU simulator intends to simulate. In practice, we often do not have a real IMU we intend to simulate, but a set of IMU specification parameters which is provided by the IMU sensor manufacturers to characterize the real IMU.

The fidelity of the IMU simulator is mainly determined by its error simulation models, since the measurement simulation model is the same and is deterministic for all types of the IMU inertial sensors, if the approximation and computation errors can be ignored. The IMU error simulation models have two parts, deterministic error models and stochastic error models. The deterministic part of the error models (such as g-related gyro drift and sensor misalignment) of the IMU sensors is obtained through a calibration procedure and thus the deterministic errors are compensated in the gyrocompass system.

The fidelity of the IMU stochastic error models can be verified by comparing the statistical parameters and/or by a system level hardware-in-the-loop simulation. If we have the real IMU unit we intend to simulate available, such as the IMU (DTG and accelerometers) we use in the SAAAEMS system, we use the inertial sensor test, analysis and modeling tools, such as Allan Variance tool and PSD tool, to obtain the sensor stochastic model parameters. And, using the sensor model parameters, the IMU simulator is constructed with IMU simulation approaches in GMSS. We then use the constructed IMU simulator to produce the IMU data stream and the simulated IMU data are saved and analyzed by the same inertial sensor analysis and modeling tools used to process the real IMU sensors. The fidelity of the IMU simulator can be evaluated and verified by comparing the real IMU's model parameters and the simulated IMU's model parameters.

Another IMU simulator verification method is a so-called hardware-in-the-loop simulation method. At a stationary state, we acquire and save the data from a real IMU unit and then feed them into the gyrocompass simulator (real-time or off-line) and using the GMSS's evaluation and analysis module we get a set of gyrocompass accuracy parameters corresponding to the real IMU unit. We then use the IMU simulator to drive the gyrocompass simulator and get another set of gyrocompass accuracy parameters corresponding to the simulator IMU unit. In principle, if the IMU simulator is an accurate simulation of the real IMU unit, the above two sets of gyrocompass accuracy parameters should be the same or very close. This is a system level verification of the sensor model fidelity.

If we do not have a real IMU we intend to simulate, but a set of manufacturer IMU specification parameters, we use these sensor parameters to construct the IMU simulation and the simulated data are analyzed by the inertial sensor analysis and modeling tools to get a set of sensor model parameters. The obtained sensor model parameters should be the same or close to the IMU specification parameters. Here we assume that our inertial sensor analysis and modeling tools use the same analysis algorithm as the manufacturer.

The fidelity of the gyrocompass simulator and calibration procedure simulator can be mostly verified by the whole GMSS system integrity and consistency test described previously in this section. The algorithms and programs in the real gyrocompass system are utilized in the simulator. Because the gyrocompass algorithms and programs have been tested and verified in the real embedded computer system, the validation of the gyrocompass simulator is mainly to debug the error caused by program porting process.

The establishment of an accurate and useful GMSS and its components includes two parts: verification and validation.

Verification means, compared to the intended design, the GMSS works as the designer expects. GMSS is verified with respect to the intended design.

Validation means, compared to a real, specific gyrocompass system, the GMSS simulation is an accurate representation of the real system's behavior. Validation is verified with respect to the real, specific gyrocompass system.

Validation is based on verification. First, the intended design is correctly realized, and then we determine if the intended design is an accurate simulation of a real system.

Verification involves the correct realization of the intended design. It has much to do with the correct programming design of the intended algorithms and models. Thus, the verification of the GMSS and its components is investigated in more detail, when we perform the software programming.

GMSS is used to simulate the behavior of a real or specific gyrocompass system. GMSS can perform test and evaluation which could be costly or difficult if we do them on a real gyrocompass system. For example, we can use GMSS to investigate a single error inducing factor's effect (such as the base acceleration interference) on the gyrocompass accuracy. For a real gyrocompass system testing, usually the gyrocompass accuracy is the total effect of several error inducing factors which can not be easily separated. For example, for design and testing of a gyrocompass estimator and controller, the user can easily perform a series of testing to examine the GMSS performance under different sensor parameters and different operating conditions (base motion conditions). Doing this kind of test on a real gyrocompass system is usually costly and inconvenient. With a GMSS, a user can see every detail of the gyrocompass and can investigate any of its properties through a simulation procedure.

As presented and discussed here, not only does the GMSS configuration include the IMU simulator and the gyrocompass algorithm simulator, which essentially form a gyrocompass system, but it also includes a 6DOF motion simulator and a system evaluation and analysis module. That is, the GMSS is in fact a simulation of the gyrocompass test and evaluation system and procedure, not only an individual gyrocompass by itself. A 6DOF motion simulator is required to excite the IMU and gyrocompass algorithms and a test and evaluation module is required for system performance analysis.

Figure 22:
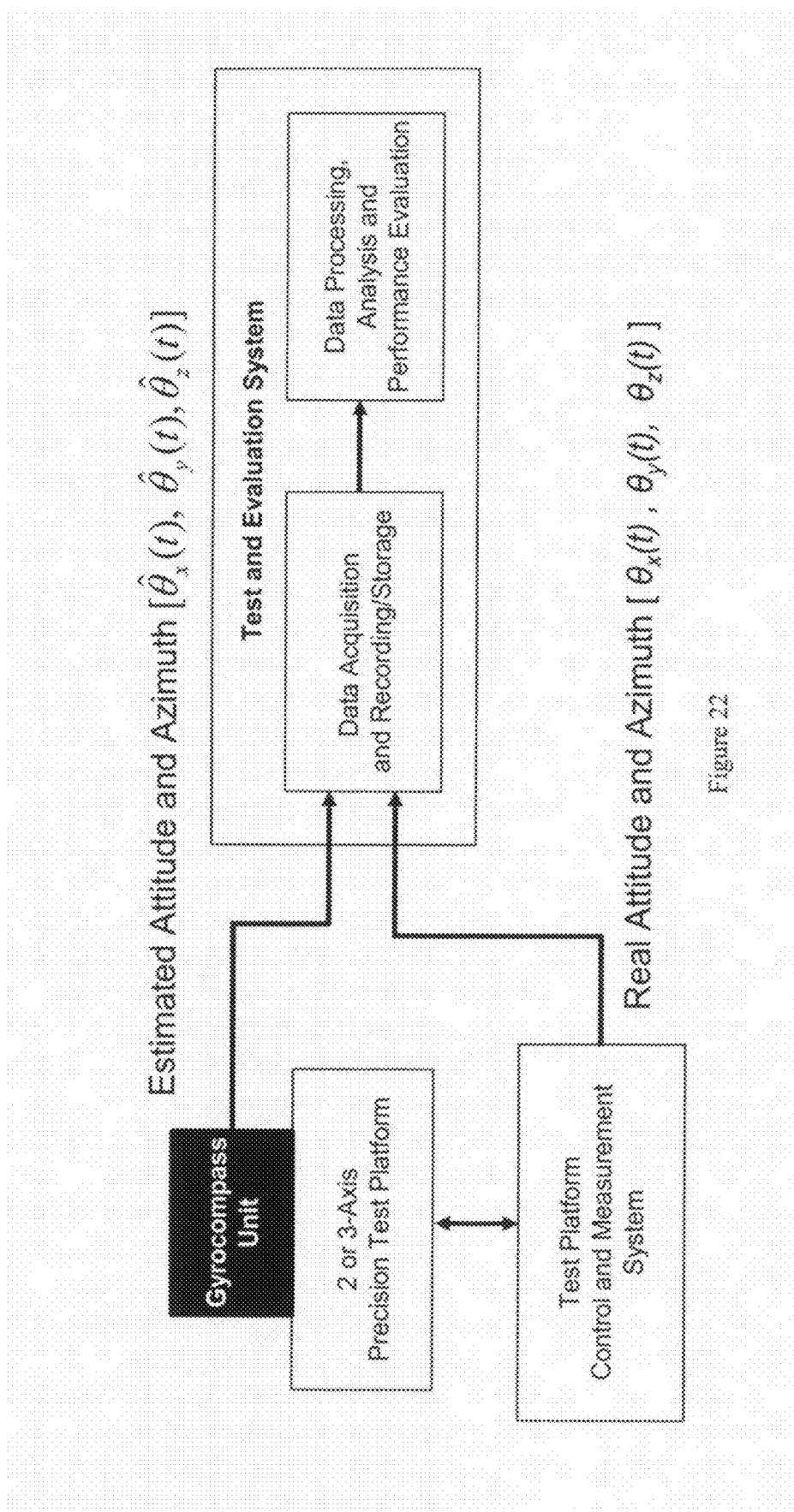
FIG. 22 is a block diagram showing the Gyrocompass Testing Using a Test Platform.

Therefore, the GMSS verification and validation are to determine if it is an accurate representation of a real or specific gyrocompass system and its testing procedure. Let us examine the test approaches of a real gyrocompass system. FIG. 22 depicts a gyrocompass testing approach using a test platform. The IMU of the gyrocompass is excited by a 2 or 3-axis precision test platform, which also provides real attitude and azimuth reference by its platform control and measurement system. The accuracy of the gyrocompass is evaluated by a comparison of the estimated attitude and azimuth and the real/actual attitude and azimuth. The gyrocompass error time series $\Delta\theta(t)=\hat{\theta}(t)-\theta(t)$ is recorded and analyzed by the test and evaluation system to obtain the set of parameterized gyrocompass performance and specifications.

Figure 23:
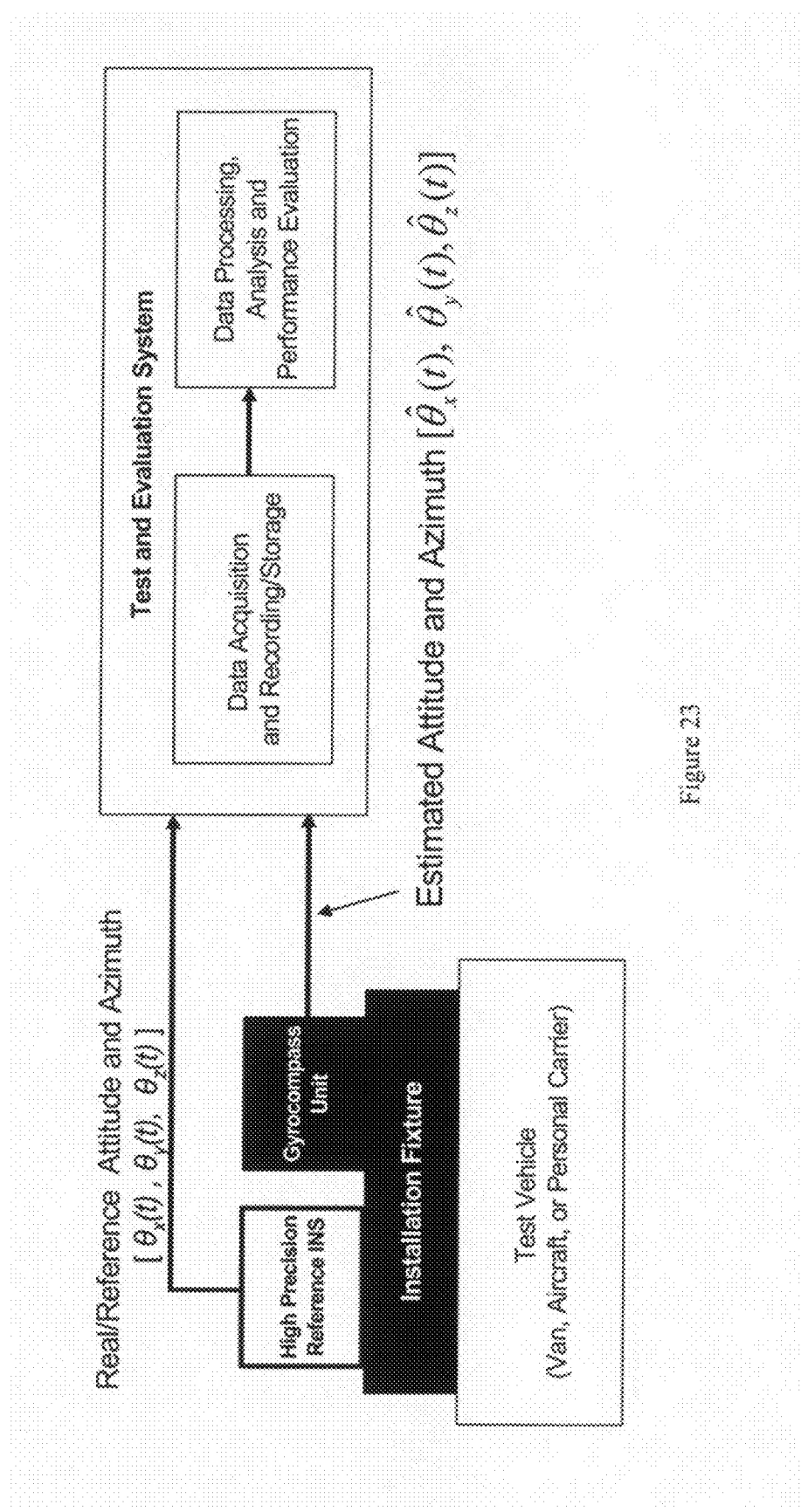
FIG. 23 is a block diagram showing the Gyrocompass Testing Using a Test Vehicle.

The test platform approach usually can not generate base/carrier acceleration conditions, which are key error inducing factors for the gyrocompass. Then, a vehicle testing approach is used, as depicted in FIG. 23. In this testing approach, usually a high precision INS is used as a reference system to provide the "real" (accurate enough) attitude and azimuth reference. In principle, for the gyrocompass on a moving base, although a mathematical platform can isolate the angular motion, it can not isolate the acceleration interference. The acceleration or motion disturbance is presented in the gyrocompass processing as an error source, as long as the system works in the "gyrocompass" mode instead of the "INS" mode or "navigation" mode. How to reduce or eliminate the motion and acceleration interference to the gyrocompass system has long been an important issue in gyrocompass algorithm design. Thus, in GMSS, we provide a suite of very powerful tools for the motion and acceleration interference simulation to aid the gyrocompass algorithm design.

Figure 24:
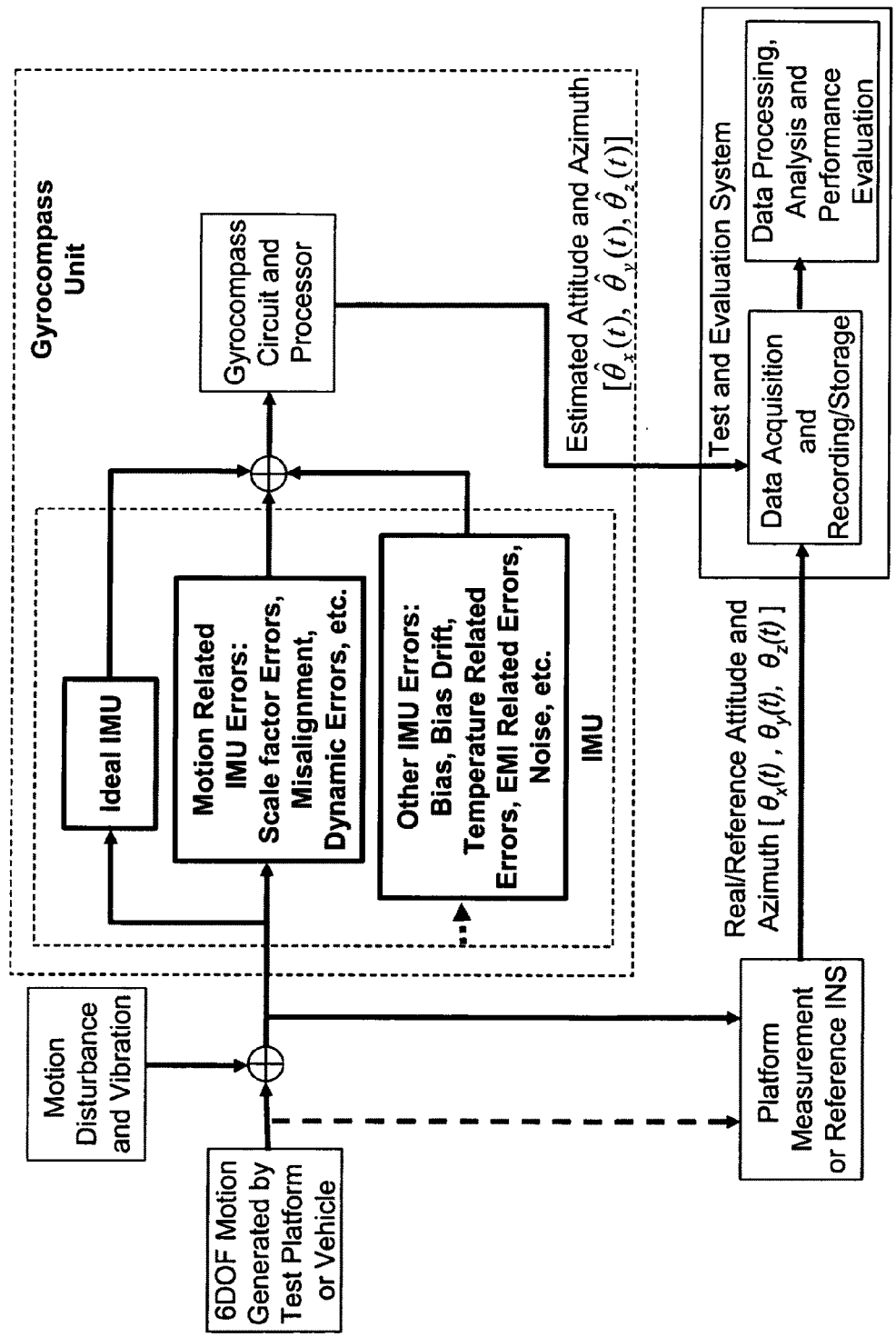
FIG. 24 is a block diagram showing the Analysis of the Gyrocompass Testing Procedure.

In order to build a GMSS of high fidelity, all the error inducing factors of the gyrocompass should be accurately represented in the simulation. FIG. 24 depicts an analysis of the gyrocompass testing procedure, with most of the error inducing factors for gyrocompassing. The following is a list of them:

Base motion:
    Intended motion
        Angular motion and linear acceleration motion cause motion-related sensor errors and sensor dynamic errors.
        Acceleration motion presents itself as a gyrocompass error source.
    Motion (random) disturbance and vibration
        Causes extra sensor errors.
        Acceleration disturbance and vibration presents itself as a gyrocompass error source.
Sensor (IMU) errors
    Motion related IMU errors:
        Scale factor errors or scale factor drift,
        Sensor axis misalignment,
        Sensor dynamic errors, etc
    Other IMU errors:
        Bias,
        Bias drift,
        Sensor noise
        ADC noise,
        Temperature Related Errors,
        EMI related errors, etc.

If we assume that the verification of the GMSS is performed and this means its simulation programs correctly and accurately represent a gyrocompass model we intend to simulate, then the GMSS processing or algorithm itself is not an error inducing factor, but the intended/actual gyrocompass design quality or performance can affect the whole simulated gyrocompass system accuracy. For example, a good estimator and controller design can reduce the gyrocompass sensitivity to motion interference; for example, an auto calibration algorithm can reduce the bias drift effect, etc.

Figure 25:
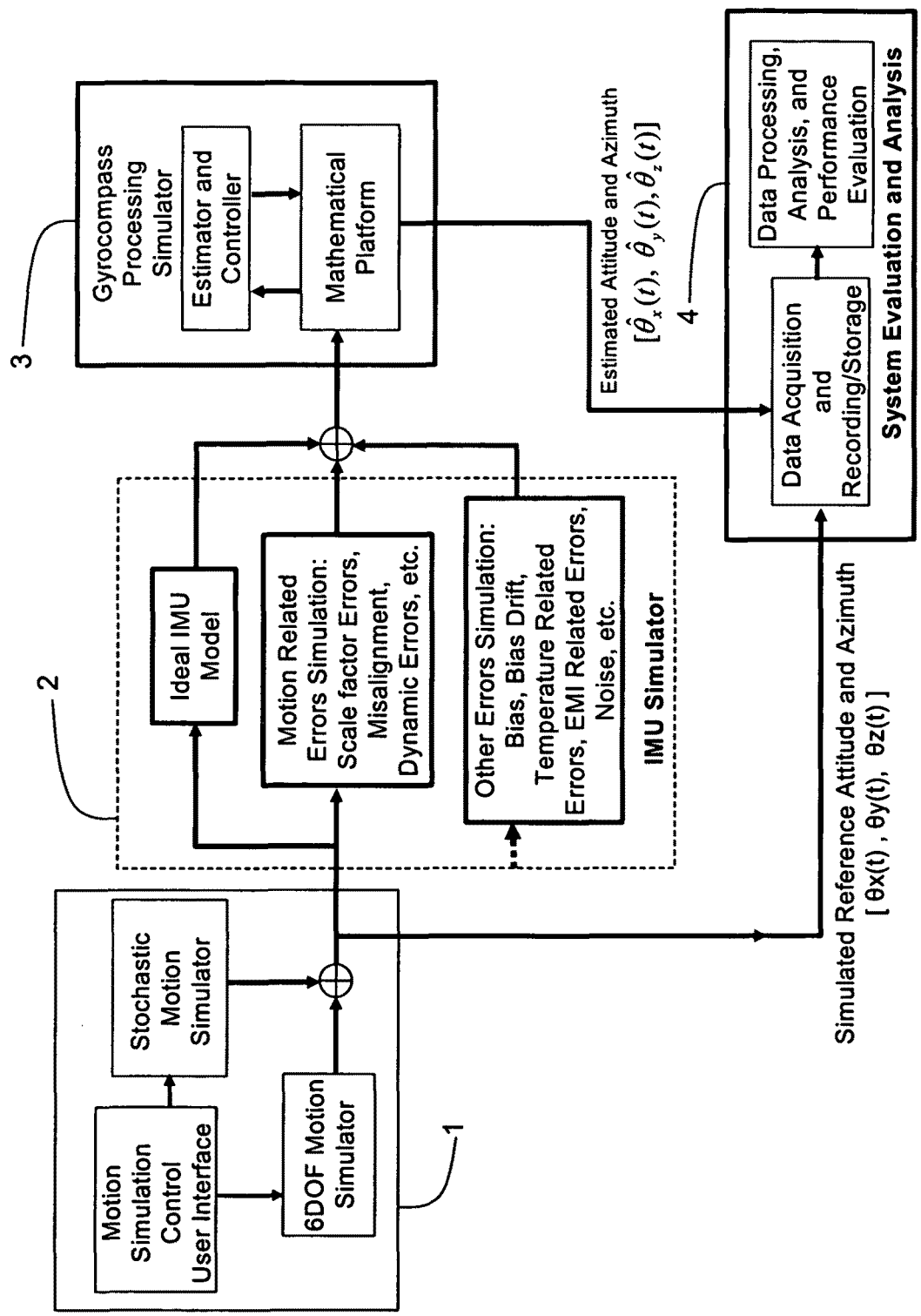
FIG. 25 is a block diagram showing the Analysis of the GMSS Simulation and Testing Procedure.

Corresponding to a real gyrocompass system and its testing procedure, a simulation of them—our GMSS, is analyzed to identify its fidelity determining factors or the gyrocompass error inducing factors, as depicted in FIG. 25. That is, the GMSS simulation accuracy with respect to a real or specific gyrocompass we intend to simulate, or the fidelity of the GMSS or the GMSS simulation session is determined by simulation accuracy of the gyrocompass error inducing factors, assuming its correctness is verified (programming is correct). The following is an analysis of the GMSS fidelity determining factors, how we achieve high fidelity, and what are the criteria and fidelity test methods.

Base motion:
    Intended motion
        Both dynamic models and kinematic constraints are introduced in GMSS to obtain more accurate dynamic properties for the 6DOF motion simulator.
        Closed-loop motion control, user direct real-time control, and motion script editor/translator are employed to ease the motion generation and enhance its flexibility for various types of 6DOF motion generation, such as, tripod sinking motion, soldier walking into a building, etc
    Motion (random) disturbance and vibration
        Stochastic signal generators and statistical parameter controller are introduced in the 6DOF motion simulator to generate different types of random motion and/or vibration. For example, they can produce any power spectral density (PSD) related to vibration or random motion.

Sensor (IMU) errors

Special GUI/Window and an IMU error model library are introduced in the IMU simulator for the user to set a wide range of IMU error parameters.

A suite of function generators and random signal generators are employed in the IMU simulator to generate different types of time varying and random IMU sensor errors. Such as, a gyro stochastic error component represented by a PSD or an Allan Variance (AV) curve including quantization noise, angle random walk (ARW), correlated noise, sinusoidal noise, bias instability and rate random walk (RRW), etc.

Referring to FIG. 25, the gyrocompass evaluation process comprises the steps of:

(a) producing reference 6DOF motion data using the 6DOF motion simulator 1;

(b) sending the reference 6DOF motion data to both IMU simulator 2 and gyrocompass evaluation module 4;

(c) generating IMU output using IMU simulator 2 with selected error parameters and the reference 6DOF motion data;

(d) producing gyrocompass attitude data using the selected gyrocompass simulator 3 algorithms and the IMU output; and (e) comparing the gyrocompass attitude with the reference 6DOF motion data to get gyrocompass performance specification data using the gyrocompass evaluation module 4.

Figure 26:
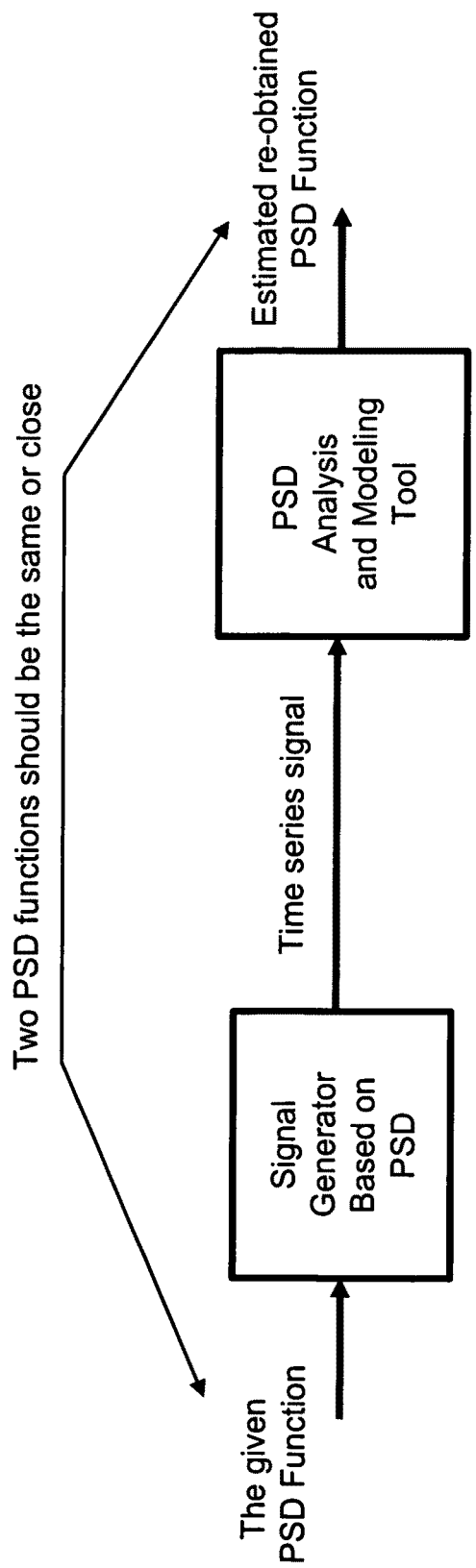
FIG. 26 is a block diagram showing the Test and Verification of the Signal Generator Based on power spectral density (PSD).
Figure 27:
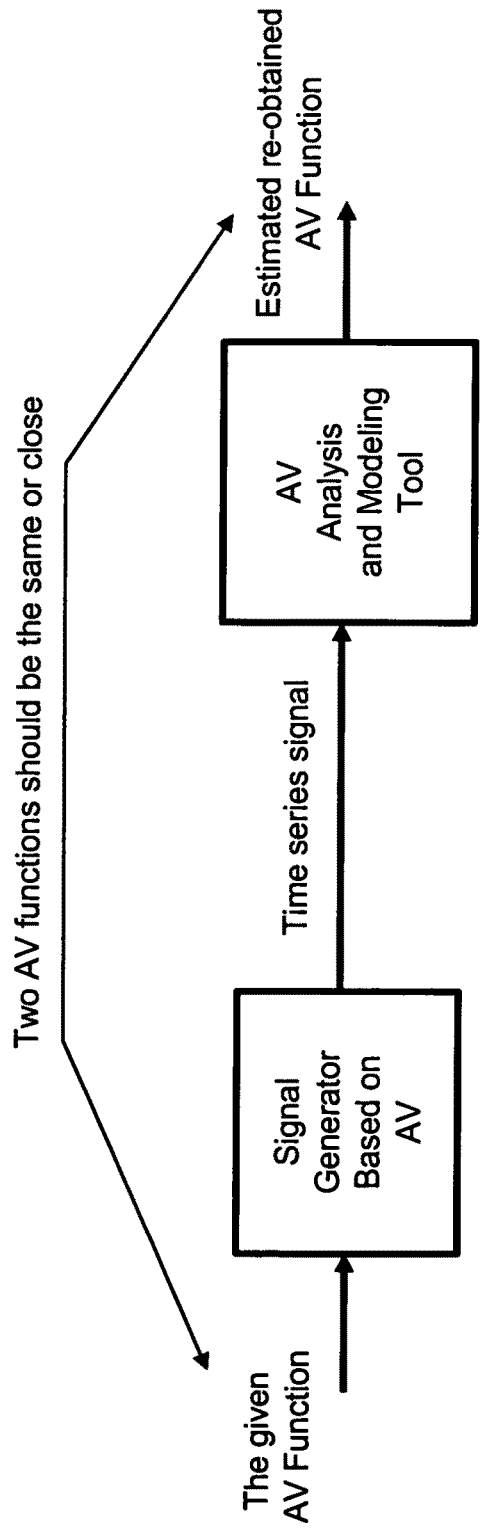
FIG. 27 is a block diagram showing the Test and Verification of the Signal Generator Based on Allan Variance (AV).

In the GMSS we need to construct several types of stochastic/random signal generators according to signal representation by a PSD or an AV function. In practice, for a given PSD or AV function, the construction of a stochastic/random signal generator may not be unique, and we must verify that the constructed generator really produces the expected signal. Using the GMSS's sensor testing and modeling tools, we can perform the verification task, since in the tool suite there are PSD and AV analysis and modeling programs. FIG. 26 and FIG. 27 depict the verification methods.

For verification of the signal generator based on the PSD, the generated time series signal is fed into the PSD analysis and modeling tool. The PSD analysis and modeling tool then produces an estimated re-obtained PSD function. This re-obtained PSD function should be the same as or close to the given PSD function, if the signal generator is correctly constructed.

Similarly, for verification of the signal generator based on Allan Variance (AV), the generated time series signal is fed into the AV analysis and modeling tool. The AV analysis and modeling tool then produces an estimated re-obtained AV function. This re-obtained AV function should be the same as or close to the given AV function, if the signal generator is correctly constructed.

Figure 28:
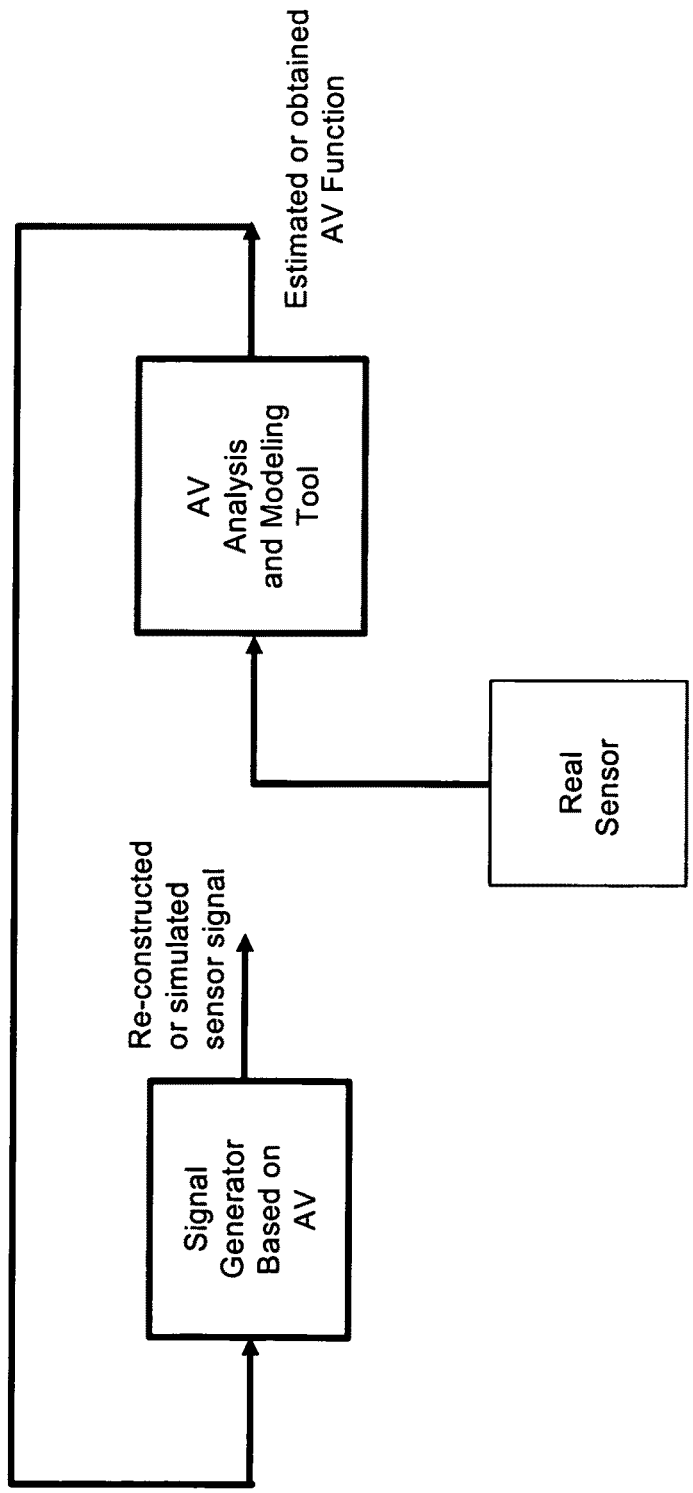
FIG. 28 is a block diagram showing the Modeling of a Real Sensor using GMSS's Sensor Testing and Modeling Tools.

If we have the real IMU, we can obtain an even more accurate simulation by using the hardware/sensors-in-the-loop simulation and modeling functions of the GMSS. The three approaches of the hardware/sensors-in-the-loop simulation include:

Real sensor data acquisition and modeling—Connecting real IMU sensors to GMSS, collecting their data, and obtaining their specification parameters, PSD or AV function using the GMSS's sensor modeling tools. And then, using the signal generator to re-produce time series IMU data for simulation, as depicted in FIG. 28

Hardware/sensors-in-the-loop simulation—Directly using collected IMU data for gyrocompass simulation.

Based on the GMSS computer's computation power, the IMU data from the real sensor unit can be directly sent to the gyrocompass simulator and a real-time hardware/sensors-in-the-loop simulation can be achieved.

Figure 29:
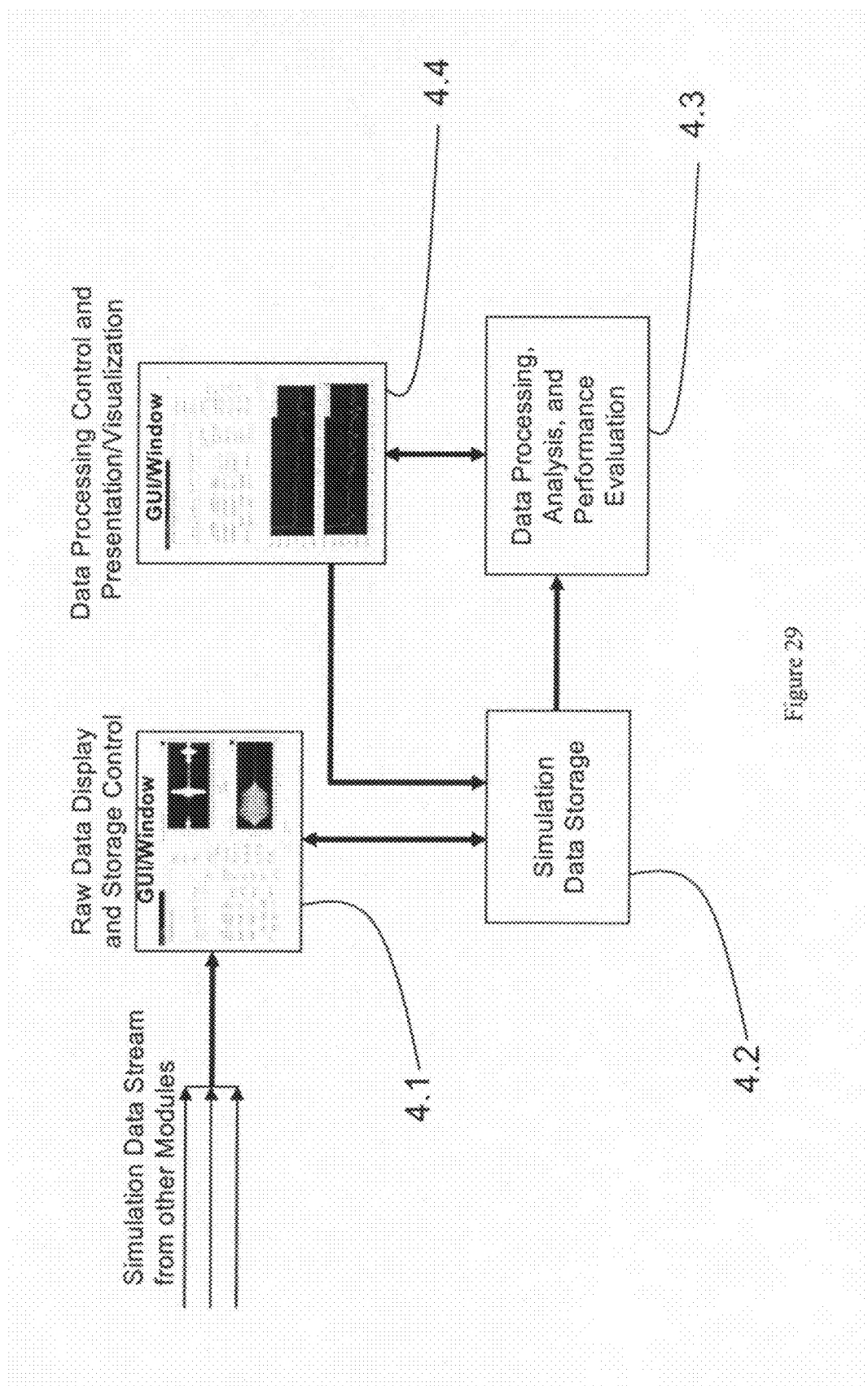
FIG. 29 is a block diagram showing the Configuration of the System Evaluation and Analysis Module.

Referring to FIG. 29, the system evaluation and analysis module includes the following components:

(1) A GUI/Window 4.1 for raw data display and storage control. This user interface is used to display the selected simulation data from the other GMSS modules. It also selects the simulated data variables the user wants to store for analysis.

(2) Simulation data storage module 4.2. A library module used to save and retrieve the selected simulation data variables.

(3) A module 4.3 for data processing, analysis, and performance evaluation. This module performs stochastic data processing to obtain a set of parameterized gyrocompass performance and specifications.

(4) A GUI/Window 4.4 for data processing control and presentation/visualization. It selects the type of data processing to perform and presents the system error variables with the statistical analysis results.

Stochastic Signals Analysis Tools in GMSS

The accuracy of the gyrocompass is affected by many factors in a practical system, such as:

sensor errors;

base motion disturbance;

effectiveness of the gyrocompass processing algorithms.

The gyro errors are the key factor for gyrocompass accuracy. The gyro errors can be further classified as deterministic (motion related or temperature related) errors and stochastic errors. The stochastic gyro angular rate errors are usually modeled as several components:

Quantization noise (violet noise)

Angle random noise (ARW, white noise)

Bias instability (band limited pink noise)

Rate random walk (RRW, red noise)

Correlated noise (between white and red depending on the filter's correlation time), etc.

In analysis, the stochastic processes/errors are modeled and described by their power spectrum density (PSD) functions or plots. But in engineering practice, as a frequency domain method, the PSD is not as convenient for characterizing the stochastic processes in specification parameters. Therefore, the Allan Variance (AV) method is commonly used for its simplicity and efficiency. As a time domain method, the AV method is simple as an algorithm and using its plot different stochastic components can be identified and specified. Both PSD and AV methods are used in the GMSS system for either error modeling or verification of the stochastic signal generators.

Figure 30:
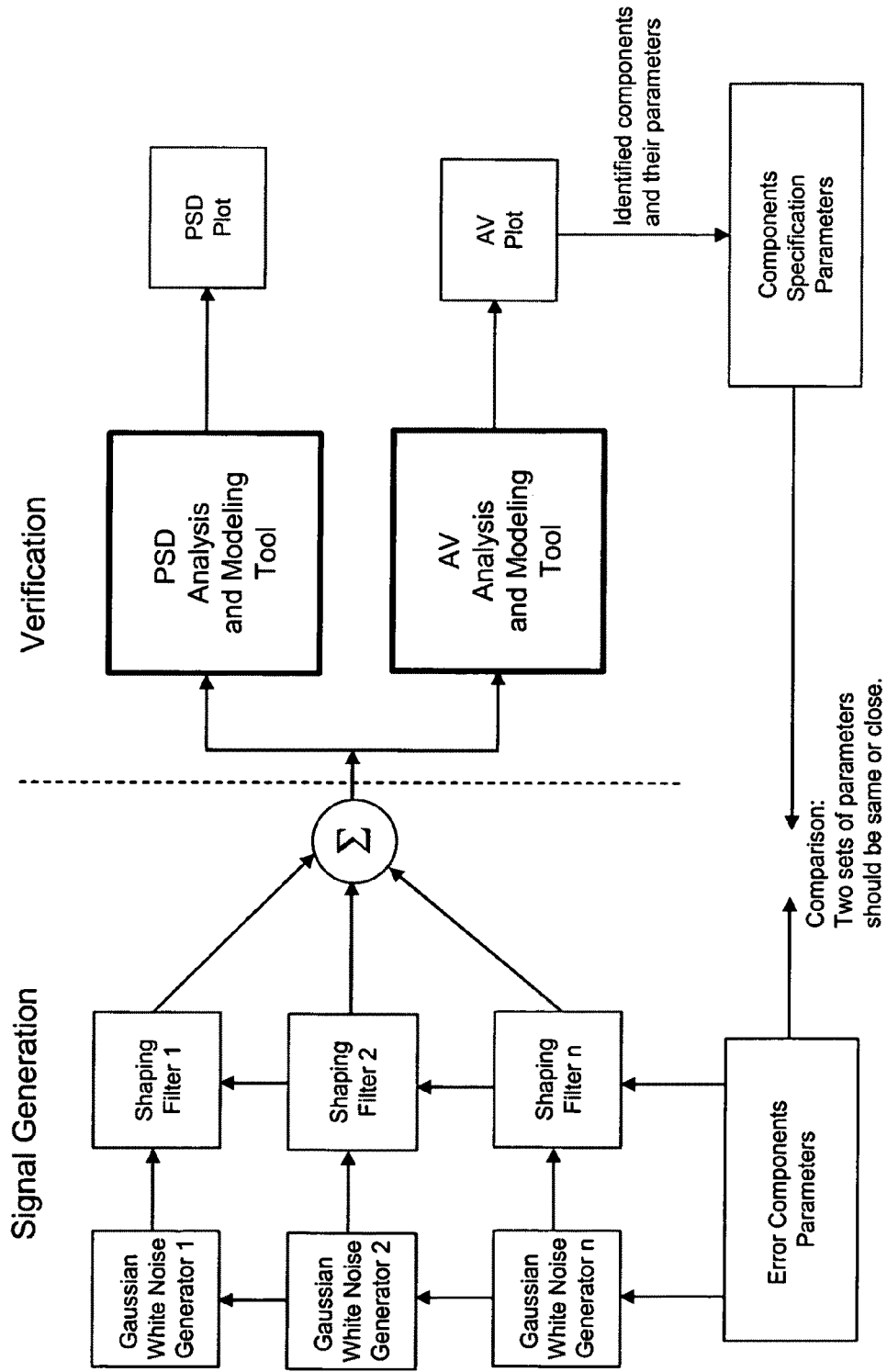
FIG. 30 is a block diagram showing the Stochastic Signal Generation and Verification Methods.

The stochastic signal generation and verification methods in GMSS are depicted in FIG. 30. The stochastic signal generators in the GMSS consist of white noise generators and shaping filters. Every stochastic signal component is generated from a white noise source, which in practice is a band-limited "white noise". The white noise is then filtered by a shaping filter to produce the required PSD shape of the corresponding signal components. The generation of most stochastic signal components is quite simple, except for the bias instability (band limited pink noise). For example:

Quantization noise (violet noise) is generated by differentiating white noise.

Angle random noise (ARW) itself is a white noise process in the gyro rate.

Rate random walk (RRW) is generated by integrating white noise.

Correlated noise is generated by feeding white noise through a first order low pass filter.

In the GMSS, the bias instability shaping filter is a little bit complicated. Usually a higher order low pass filter is used to produce the 1/f (or 1/ω) shape of the output PSD in a given frequency range, such as 0.01 Hz to 100 Hz. Theoretically, the energy of pink noise or red noise is infinite around zero frequency, so it is not a good representation of a real error component around this singular point. We can say that bias instability is modeled by the PSD shape of 1/f in a certain frequency range. This is also true for the RRW case, red noise.

As depicted in FIG. 30, the generated stochastic signals can be verified by the PSD Analysis and Modeling Tool and the AV Analysis and Modeling Tool. We can see in the figure that we use a set of error specification parameters to generate the error signal by white noise generators and shaping filters. The parameters of the white noise generators and shaping filters are determined by the error specification parameters. With the AV tool, we can obtain a set of error specification parameters from the generated signals. The two sets of specification parameters should be consistent, be the same or close, if the signal generation (and the Analysis and Modeling) is correctly performed. This is a simple and direct verification for the stochastic signal generators.

To facilitate the analysis in the simulation system, we created a suite of stochastic data/signal analysis tools for the GMSS. These tools have been added to every component module of the GMSS. These tools share a common GUI window, as depicted in FIG. 31.

The analysis tools include the signal time waveform display tool, Allan Variance analysis tool, distribution analysis tool, DFT analysis tool, inverse DFT analysis tool, PSD analysis tool, auto-correlation analysis tool, PSD integral tool, and generic statistical analysis tool.

Figure 31:
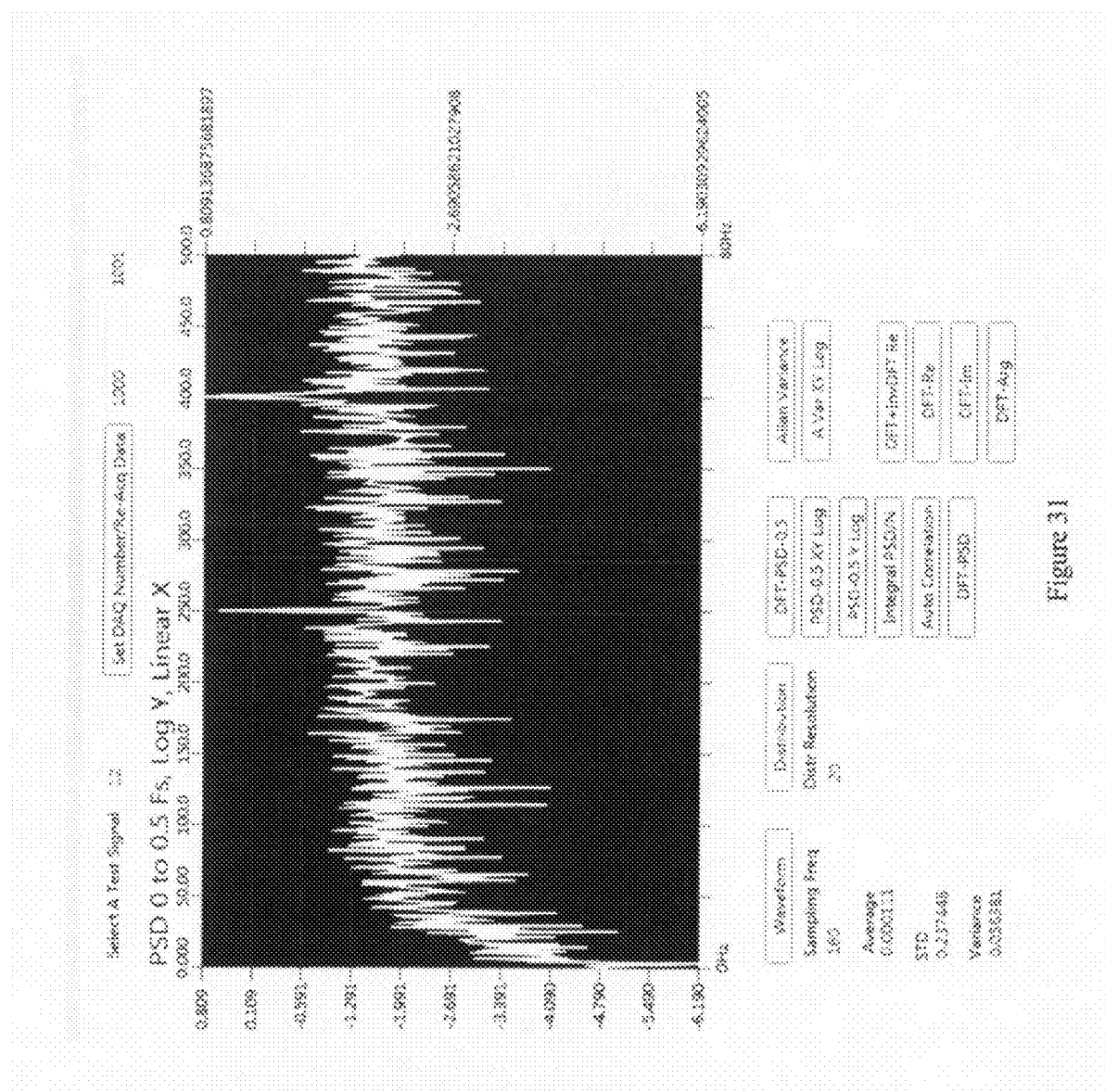
FIG. 31 is a software display showing the GUI of the Stochastic Data/Signal Analysis Tools.

As shown in FIG. 31, the acquisition of the signal for the analysis tools is selected by the waveform display canvas 1. When a signal in the 6DOF Motion Simulator (or in other GMSS modules) is selected by the ComboBox 1, it is displayed in the waveform display canvas 1 and at the same time is ready for the analysis tools to acquire and store in an array as a time series.

Click the button "Set DAQ Number/Re-Acq Data" to start or restart the data acquisition. The text box next to the button is used to set the number of the data to acquire. The text block next to the text box is used to indicate the evolution of the data acquisition. When the data acquisition is finished, we can call an analysis tool to perform a selected operation on the acquired data.

Different analysis tools are called by clicking on a corresponding button. The results are then displayed on the canvas (sub-window) of the analysis tool. The updated analysis tools can be divided into three types: time-domain tools, frequency domain tools, and auxiliary verification tools. The frequency domain tools are all based on the DFT analysis functions.

The time-domain tools include:
Button "Waveform"—to display the time waveform of the signal and at the same time calculate and display its average, variance, and standard deviation (STD).
Button "Distribution"—to calculate and display the signal's amplitude distribution function. Use the text box under the button to select the resolution for the distribution calculation.
Button "Allan Variance"—to calculate the signal's Allan Variance and display Allan STD of the signal.
Button "A Var XY Log"—to display the above Allan STD use $Log_{10}$ (Allan STD) and $Log_{10}$ (n) axis scale, to facilitate the characteristics identification and parametric analysis.

The frequency domain tools include:
Button "DFT-PSD-0.5"—to calculate and display the signal's PSD based on the DFT. Since the signal is real valued (not complex), its PSD is symmetric about N/2 (half the sampling frequency, Fs/2), only half of the PSD is displayed.
Button "PSD-0.5 XY Log"—to display the above PSD use $Log_{10}$ (PSD) and $Log_{10}$ (n) axis scale, to facilitate the characteristics identification and parametric analysis.
Button "PSD-0.5 Y Log"—to display the above PSD use $Log_{10}$ (PSD) scale and linear n scale, to facilitate the characteristics identification and parametric analysis.
Button "Integral PSD/N"—to calculate and display the signal's PSD integral, to facilitate the characteristics identification and parametric analysis.
Button "Auto Correlation"—to calculate and display the signal's autocorrelation function based on the PSD.
Button "DFT-PSD"—to calculate and display the signal's PSD based on the DFT, from 0 to the sampling frequency Fs, for testing purposes. If the input time series is real valued, the PSD is symmetric about Fs/2.

The auxiliary verification tools include:
Button "DFT+InvDFT Re"—to calculate and display the signal's DFT, then perform the inverse DFT, and display the real component of the inverse DFT. The result should be the same as the original signal. This is used for verification and for the tools' accuracy analysis.
Button "DFT-Re"—to calculate and display the signal's DFT and display the real component. For testing and verification purposes.
Button "DFT-Im"—to calculate and display the signal's DFT and display the imaginary component. For testing and verification purposes.
Button "DFT-Arg"—to calculate and display the signal's DFT and display the phase argument value. For testing and verification purposes.

One skilled in the art will understand that the embodiment of the present invention as shown in the drawings and described above is exemplary only and not intended to be limiting.

It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A gyrocompass modeling and simulation (GMSS) system for a gyrocompass, comprising:
a computer executing the following simulators and modules;
a six-degrees-of-freedom (6DOF) motion simulator;
an inertial measurement unit (IMU) sensor simulator which comprises real-time sensor data acquisition and modeling tools;
a gyrocompass system and calibration process simulator; and
a gyrocompass system evaluation and analysis module, wherein said 6DOF motion simulator, said IMU sensor simulator, said gyrocompass system and calibration process simulator and said gyrocompass system evaluation and analysis module are interlinked through an accumulative communication stream;
a translational motion simulator communicated with said IMU sensor simulator, wherein said translational motion simulator comprises:

a module representing mass of a unit model, modules representing kinematic constraints of a translational motion, a module of three-dimensional translational motion controller controlling said translational motion according to input motion commands, a module of input and output (I/O) interface programs converting user inputs from an input device to a real-time data stream, a module of stochastic signal generators producing random forces, a module of statistical parameter controller controlling the stochastic signal generators and setting statistical parameters, a module of graphic user interface (GUI) or Window for program control and configuration and data visualization and display, and a module of motion script editor or translator for an optional function of said module of motion script editor or translator for translating a text or script description of said motion commands to a data stream for simulation.

2. The GMSS system, as recited in claim 1, wherein said translational motion simulator, executed by said computer, processes the steps of:
 (i) receiving a motion command from a user from said input device through an I/O interface;
 (ii) reading specified 6DOF parameters from said GUI window module;
 (iii) combining and sending said motion command and said specified 6DOF parameters to said translational motion controller;
 (iv) generating a control command by said translational motion controller using said motion command and feedback states from motion simulator outputs;
 (v) generating a stochastic force signal by one of said stochastic signal generators;
 (vi) combining said control command with said stochastic force signal by said translational motion controller to generate a total force signal;
 (vii) producing acceleration data using said total force signal by said mass module;
 (viii) producing velocity data using said acceleration data by an integral module;
 (ix) producing position data using said velocity data by said integral module; and
 (x) sending said acceleration data, said velocity data and said position data produced to said IMU sensor simulator.

3. The GMSS system, as recited in claim 2, further comprising an angular motion simulator which processes, executed by said computer, the steps of:
 (i) receiving said motion command from said user from said input device through said I/O interface;
 (ii) reading said specified 6DOF parameters from said GUI window module;
 (iii) combining and sending said motion command and said specified 6DOF parameters to said angular motion simulator;
 (iv) generating said control command by said angular motion simulator using said motion command and said feedback states from angular motion simulator outputs;
 (v) generating a stochastic torque signal by one of said stochastic signal generators;
 (vi) combining said control command with said stochastic torque signal by said angular motion simulator to generate a total torque signal;
 (vii) producing an angular acceleration data using said total torque signal by a 3-dimensional (3D) Euler rigid body dynamic model;
 (viii) producing an angular velocity data using said torque data and said 3D Euler rigid body dynamic model;
 (ix) converting said angular velocity data in a body frame to Euler angle form angular velocity data by said 3D Euler rigid body dynamic model for controlling Euler angular rate;
 (x) producing angle data using said angular velocity data and quaternion attitude updating equations by a kinematical constraints module;
 (xi) converting said angular position in quaternion form to Euler angle form by said kinematical constraints module for controlling Euler position; and
 (xii) sending said angular velocity data and said angle data produced to said IMU sensor simulator and said gyrocompass system evaluation and analysis module.

4. A gyrocompass modeling and simulation (GMSS) system for a gyrocompass, comprising:
 a computer executing the following simulators and modules;
 a six-degrees-of-freedom (6DOF) motion simulator;
 an inertial measurement unit (IMU) sensor simulator which comprises real-time sensor data acquisition and modeling tools;
 a gyrocompass system and calibration process simulator; and
 a gyrocompass system evaluation and analysis module, wherein said 6DOF motion simulator, said IMU sensor simulator, said gyrocompass system and calibration process simulator and said gyrocompass system evaluation and analysis module are interlinked through an accumulative communication stream, wherein said IMU sensor simulator, through said computer, processes the steps of:
 (i) receiving 6DOF motion data from said 6DOF motion simulator;
 (ii) receiving IMU error parameters from an IMU GUI widow or an IMU error model library;
 (iii) producing ideal IMU output data using a corresponding IMU measurement model and said 6DOF motion data;
 (iv) generating IMU motion-related errors using corresponding IMU error model parameters and said 6DOF motion data, wherein said IMU motion-related errors include scale factor errors, sensor axis misalignment errors, and sensor dynamic errors;
 (v) generating IMU stochastic errors using said corresponding IMU error model parameters and stochastic signal generators, wherein said IMU stochastic errors include white noise, random walk, quantization error, and bias instability error;
 (vi) generating IMU temperature induced errors using said corresponding IMU error model parameters;
 (vii) generating IMU periodic (oscillating or vibration) errors using said corresponding IMU error model parameters;
 (viii) combing ideal IMU output data and all generated IMU errors to produce IMU output data; and
 (ix) sending said IMU output data produced to said gyrocompass system and calibration process simulator through said accumulative communication stream.

5. The GMSS system, as recited in claim 4, processes a gyrocompass simulation, executed by said computer, which is a closed-loop process that is iterating in time for a computer software implementation, comprising the steps of:

(i) receiving said IMU output data from said IMU simulator module, which include simulated gyro output data and simulated accelerometer output data;
(ii) estimating an approximation of gyrocompass attitude using said IMU output data and selected coarse initialization/alignment algorithms;
(iii) initializing a gyrocompass attitude quaternion in module and a direction cosine matrix (DCM) representation with estimated coarse alignment attitude;
(iv) converting gyro input from a body frame to a mathematical platform frame by a first module using current DCM;
(v) forming an attitude updating command in a second module using said converted gyro input and current gyrocompass control output;
(vi) updating said gyrocompass attitude in said first module using updating command and said quaternion attitude updating algorithms to get a quaternion representation of said gyrocompass attitude;
(vii) converting said quaternion representation of said gyrocompass attitude into said DCM representation of said gyrocompass attitude by a third module;
(viii) converting said DCM representation of said gyrocompass attitude into an Euler angle representation of said gyrocompass attitude by a fourth module;
(ix) converting accelerometer output data from said body frame to said mathematical platform frame by a fifth module using said current DCM;
(x) producing an estimation of gyrocompass attitude error using a user selected estimator or Kalman filter and said converted accelerometer output data;
(xi) generating attitude control command using user selected optimal or adaptive controller and said estimated attitude error;
(xii) feeding back said generated attitude control command to an updating command generator to form a next attitude updating command; and
(xiii) going back to step (iv) and iterating said process until the simulation is stopped by said user.

6. The GMSS system, as recited in claim 5, processes a gyrocompass evaluation process, executed by said computer, which comprises the steps of:
(i) producing reference 6DOF motion data using said 6DOF motion simulator;
(ii) sending said reference 6DOF motion data to both said IMU sensor simulator and said gyrocompass system evaluation and analysis module;
(iii) generating IMU output using said IMU sensor simulator with user selected error parameters and said reference 6DOF motion data;
(iv) producing gyrocompass attitude data using selected gyrocompass simulator algorithms and said IMU output; and
(v) comparing said gyrocompass attitude with said reference 6DOF motion data to get gyrocompass performance specification data using said gyrocompass system evaluation and analysis module.

7. The GMSS system, as recited in claim 6, wherein said gyrocompass system evaluation and analysis module includes:
a GUI or Window for raw data display and storage control, which is used to display user selected simulation data from other GMSS modules and selects simulation data variables that said user wants to store for analysis;
a simulation data storage module which is a library module used to save and retrieve said selected simulation data variables;
a module for data processing, analysis, and performance evaluation, which performs stochastic data processing to obtain a set of parameterized gyrocompass performance and specifications; and
a GUI or Window for data processing control and presentation/visualization, which selects a type of data processing to perform and presents system error variables with statistical analysis results.

8. A gyrocompass modeling and simulation (GMSS) method for a gyrocompass, comprising the steps executed by a computer of:
(a) generating six-degrees-of-freedom (6DOF) angular and linear motion data through a six-degrees-of-freedom (6DOF) motion simulator;
(b) sending said 6DOF angular and linear motion data to an inertial measurement unit (IMU) sensor simulator through an accumulative communication stream;
(c) generating IMU output data by said IMU sensor simulator;
(d) sending said IMU output data to a gyrocompass simulator through said accumulative communication stream;
(e) producing attitude data by said gyrocompass simulator with an assigned gyrocompass model;
(f) sending said attitude data to a gyrocompass system evaluation and analysis module through said accumulative communication stream;
(g) comparing said attitude data produced by said gyrocompass simulator with ideal attitude data generated by said 6DOF motion simulator to generate errors of the gyrocompass under specified IMU errors and motion parameters; and
(h) a translational motion simulator process which includes the steps of:
(i) receiving a motion command from a user from an input device through an I/O interface;
(ii) reading specified 6DOF parameters from a GUI window module;
(iii) combining and sending said motion command and said specified 6DOF parameters to a translational motion controller;
(iv) generating a control command by said translational motion controller using said motion command and feedback states from motion simulator outputs;
(v) generating a stochastic force signal by a stochastic process generator;
(vi) combining said control command with said stochastic force signal by said translational motion controller to generate a total force signal;
(vii) producing acceleration data using said total force signal by a mass module;
(viii) producing velocity data using said acceleration data by an integral module;
(ix) producing position data using said velocity data by said integral module; and
(x) sending said acceleration data, said velocity data and said position data produced to said IMU sensor simulator.

9. The GMSS method, as recited in claim 8, further comprising an angular motion simulator process, executed by said computer, which includes the steps of:
(i) receiving said motion command from said user from said input device through said I/O interface;
(ii) reading said specified 6DOF parameters from said GUI window module;
(iii) combining and sending said motion command and said specified 6DOF parameters to said angular motion simulator process;

(iv) generating said control command by said angular motion simulator process using said motion command and said feedback states from angular motion simulator outputs;
(v) generating a stochastic torque signal by said stochastic process generator;
(vi) combining said control command with said stochastic torque signal by said angular motion simulator process to generate a total torque signal;
(vii) producing an angular acceleration data using said total torque signal by a 3D Euler rigid body dynamic model;
(viii) producing an angular velocity data using said torque data and said 3 dimensional (3D) Euler rigid body dynamic model;
(ix) converting said angular velocity data in a body frame to Euler angle form angular velocity data by said 3D Euler rigid body dynamic model for controlling Euler angular rate;
(x) producing angle data using said angular velocity data and quaternion attitude updating equations by a kinematical constraints module;
(xi) converting said angular position in quaternion form to Euler angle form by said kinematical constraints module for controlling Euler position; and
(xii) sending said angular velocity data and said angle data produced to said IMU simulator module and an evaluation module.

10. The GMSS method, as recited in claim 9, further comprising an IMU sensor simulator process, executed by said computer, which includes the steps of:
(i) receiving 6DOF motion data from said 6DOF motion simulator;
(ii) receiving IMU error parameters from an IMU GUI widow or an IMU error model library;
(iii) producing ideal IMU output data using a corresponding IMU measurement model and said 6DOF motion data;
(iv) generating IMU motion-related errors using corresponding IMU error model parameters and said 6DOF motion data, wherein said IMU motion-related errors include scale factor errors, sensor axis misalignment errors, and sensor dynamic errors;
(v) generating IMU stochastic errors using said corresponding IMU error model parameters and stochastic signal generators, wherein said IMU stochastic errors include white noise, random walk, quantization error, and bias instability error;
(vi) generating IMU temperature induced errors using said corresponding IMU error model parameters;
(vii) generating IMU periodic (oscillating or vibration) errors using said corresponding IMU error model parameters;
(viii) combing ideal IMU output data and all generated IMU errors to produce said IMU output data; and
(ix) sending said IMU output data produced to said gyrocompass simulator through said accumulative communication stream.

11. The GMSS method, as recited in claim 10, further comprising a gyrocompass simulation process, executed by said computer, which is a closed-loop process that is iterating in time for a computer software implementation, comprising the steps of:
(i) receiving said IMU output data from said IMU sensor simulator, which include simulated gyro output data and simulated accelerometer output data;
(ii) estimating an approximation of gyrocompass attitude using said IMU output data and selected coarse initialization/alignment algorithms;
(iii) initializing a gyrocompass attitude quaternion in module and a DCM representation with estimated coarse alignment attitude;
(iv) converting gyro input from a body frame to a mathematical platform frame by a first module using current DCM;
(v) forming an attitude updating command in a second module using said converted gyro input and current gyrocompass control output;
(vi) updating said gyrocompass attitude in said first module using updating command and said quaternion attitude updating algorithms to get a quaternion representation of said gyrocompass attitude;
(vii) converting said quaternion representation of said gyrocompass attitude into said DCM representation of said gyrocompass attitude by a third module;
(viii) converting said DCM representation of said gyrocompass attitude into an Euler angle representation of said gyrocompass attitude by a fourth module;
(ix) converting accelerometer output data from said body frame to said mathematical platform frame by a fifth module using said current DCM;
(x) producing an estimation of gyrocompass attitude error using a user selected estimator or Kalman filter and said converted accelerometer output data;
(xi) generating attitude control command using user selected optimal or adaptive controller and said estimated attitude error;
(xii) feeding back said generated attitude control command to an updating command generator to form a next attitude updating command; and
(xiii) going back to step (iv) and iterating said process until the simulation is stopped by said user.

12. The GMSS method, as recited in claim 11, further comprising a gyrocompass evaluation process, executed by said computer, which comprises the steps of:
(i) producing reference 6DOF motion data using said 6DOF motion simulator;
(ii) sending said reference 6DOF motion data to both said IMU sensor simulator and said gyrocompass system evaluation and analysis module;
(iii) generating IMU output using said IMU sensor simulator with said selected IMU error parameters and said reference 6DOF motion data;
(iv) producing gyrocompass attitude data using selected gyrocompass simulator algorithms and said IMU sensor simulator output; and
(v) comparing said gyrocompass attitude with said reference 6DOF motion data to get gyrocompass performance specification data using said gyrocompass system evaluation and analysis module.

13. A gyrocompass modeling and simulation (GMSS) method for a gyrocompass, comprising the steps executed by a computer of:
(a) generating six-degrees-of-freedom (6DOF) angular and linear motion data through a six-degrees-of-freedom (6DOF) motion simulator;
(b) sending said 6DOF angular and linear motion data to an inertial measurement unit (IMU) sensor simulator through an accumulative communication stream;
(c) generating IMU output data by said IMU sensor simulator;
(d) sending said IMU output data to a gyrocompass simulator through said accumulative communication stream;

(e) producing attitude data by said gyrocompass simulator with an assigned gyrocompass model;
(f) sending said attitude data to a gyrocompass system evaluation and analysis module through said accumulative communication stream; and
(g) comparing said attitude data produced by said gyrocompass simulator with ideal attitude data generated by said 6DOF motion simulator to generate errors of the gyrocompass under specified IMU errors and motion parameters;
wherein an IMU sensor simulator process includes the steps of:
(i) receiving 6DOF motion data from said 6DOF motion simulator;
(ii) receiving IMU error parameters from an IMU GUI widow or an IMU error model library;
(iii) producing ideal IMU output data using a corresponding IMU measurement model and said 6DOF motion data;
(iv) generating IMU motion-related errors using corresponding IMU error model parameters and said 6DOF motion data, wherein said IMU motion-related errors include scale factor errors, sensor axis misalignment errors, and sensor dynamic errors;
(v) generating IMU stochastic errors using said corresponding IMU error model parameters and stochastic signal generators, wherein said IMU stochastic errors include white noise, random walk, quantization error, and bias instability error;
(vi) generating IMU temperature induced errors using said corresponding IMU error model parameters;
(vii) generating IMU periodic (oscillating or vibration) errors using said corresponding IMU error model parameters;
(viii) combing ideal IMU output data and all generated IMU errors to produce said IMU output data; and
(ix) sending said IMU output data produced to said gyrocompass simulator through said accumulative communication stream.

14. A gyrocompass modeling and simulation (GMSS) method for a gyrocompass, comprising the steps executed by a computer of:
(a) generating six-degrees-of-freedom (6DOF) angular and linear motion data through a six-degrees-of-freedom (6DOF) motion simulator;
(b) sending said 6DOF angular and linear motion data to an inertial measurement unit (IMU) sensor simulator through an accumulative communication stream;
(c) generating IMU output data by said IMU sensor simulator;
(d) sending said IMU output data to a gyrocompass simulator through said accumulative communication stream;
(e) producing attitude data by said gyrocompass simulator with an assigned gyrocompass model;
(f) sending said attitude data to a gyrocompass system evaluation and analysis module through said accumulative communication stream; and
(g) comparing said attitude data produced by said gyrocompass simulator with ideal attitude data generated by said 6DOF motion simulator to generate errors of the gyrocompass under specified IMU errors and motion parameters;
wherein a gyrocompass simulation process, which is a closed-loop process that is iterating in time for a computer software implementation, comprises the steps of:
(i) receiving said IMU output data from said IMU sensor simulator, which include simulated gyro output data and simulated accelerometer output data;
(ii) estimating an approximation of gyrocompass attitude using said IMU output data and selected coarse initialization/alignment algorithms;
(iii) initializing a gyrocompass attitude quaternion in module and a DCM representation with estimated coarse alignment attitude;
(iv) converting gyro input from a body frame to a mathematical platform frame by a first module using current DCM;
(v) forming an attitude updating command in a second module using said converted gyro input and current gyrocompass control output;
(vi) updating said gyrocompass attitude in said first module using updating command and said quaternion attitude updating algorithms to get a quaternion representation of said gyrocompass attitude;
(vii) converting said quaternion representation of said gyrocompass attitude into said DCM representation of said gyrocompass attitude by a third module;
(viii) converting said DCM representation of said gyrocompass attitude into an Euler angle representation of said gyrocompass attitude by a fourth module;
(ix) converting accelerometer output data from said body frame to said mathematical platform frame by a fifth module using said current DCM;
(x) producing an estimation of gyrocompass attitude error using a user selected estimator or Kalman filter and said converted accelerometer output data;
(xi) generating attitude control command using user selected optimal or adaptive controller and said estimated attitude error;
(xii) feeding back said generated attitude control command to an updating command generator to form a next attitude updating command; and
(xiii) going back to step (iv) and iterating said process until the simulation is stopped by said user.

\* \* \* \* \*